(12) United States Patent
Naito et al.

(10) Patent No.: US 7,435,976 B2
(45) Date of Patent: Oct. 14, 2008

(54) ION BEAM DEVICE

(75) Inventors: Masao Naito, Kyoto (JP); Hideki Fujita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 249 days.

(21) Appl. No.: 10/581,429

(22) PCT Filed: Dec. 2, 2004

(86) PCT No.: PCT/JP2004/018330
§ 371 (c)(1),
(2), (4) Date: Jun. 2, 2006

(87) PCT Pub. No.: WO2005/055271
PCT Pub. Date: Jun. 16, 2005

(65) Prior Publication Data
US 2007/0114455 A1 May 24, 2007

(30) Foreign Application Priority Data
Dec. 4, 2003 (JP) .............................. 2003-405342
Mar. 17, 2004 (JP) .............................. 2004-076756

(51) Int. Cl.
*H01J 37/317* (2006.01)
(52) U.S. Cl. ................................. 250/492.21
(58) Field of Classification Search ............. 250/492.21
See application file for complete search history.

(56) References Cited

U.S. PATENT DOCUMENTS

| 4,962,308 | A | 10/1990 | Bormans et al. |
| 5,099,130 | A | 3/1992 | Aitken |
| 5,373,164 | A | 12/1994 | Benveniste |

FOREIGN PATENT DOCUMENTS

| JP | 3-233845 | 10/1991 |
| JP | 6-188215 | 7/1994 |
| JP | 6-196118 | 7/1994 |
| JP | 7-302568 | 11/1995 |
| JP | 2969788 | 8/1999 |
| JP | 11-354064 | * 12/1999 |
| JP | 11-3545064 | 12/1999 |
| JP | 2002-175771 | 6/2002 |
| JP | 3358336 | 10/2002 |

* cited by examiner

*Primary Examiner*—Jack I Berman
(74) *Attorney, Agent, or Firm*—Finnegan, Henderson, Farabow, Garrett & Dunner, L.L.P.

(57) ABSTRACT

An ion beam apparatus comprises an ion source 2 which extracts an ion beam 4, a mass separation electromagnet 6 which separates an ion beam 4 of desired mass from the ion beam 4 extracted from the ion source 2, a scanner 12 which scans the injected ion beam 4 with a given scan center as center within a given scan surface, an electrostatic deflector 30 which deflects the ion beam through 90° so that an ion beam of desired energy in said ion beam travels in a direction perpendicular to said scan surface within a circular-arc-shaped deflection zone centered on the scan center, and a scanning mechanism 54 which retains a target 50 and which mechanically, reciprocally moves the target 54 in a direction in which the target crosses the ion beam passed from the electrostatic deflector 30 at a given angle.

25 Claims, 26 Drawing Sheets

ION BEAM DEVICE

TECHNICAL FIELD

The present invention relates to an ion implantation apparatus which performs an ion implantation by means of irradiating an ion beam onto a target, and relates to an ion beam apparatus which constitutes the ion implantation apparatus and has a concept of encompassing an ion beam deflector for effecting scanning and deflection of the ion beam. More particularly, the present invention relates to an ion beam apparatus capable of shortening the length of an ion beam line.

BACKGROUND ART

In an ion beam apparatus (hereinafter typified by an ion implantation apparatus), such as an ion implantation apparatus, parallelism of an ion beam has hitherto been performed in order to make an incident angle of the ion beam uniform within a plane of a target (e.g., a semiconductor substrate).

In order to prevent implantation, into the target, of ions of undesired energy (which will be referred to as "energy pollutants" or "energy contaminants") (such implantation is called "energy pollution" or "energy contamination") along with ions of desired energy, the ions of undesired energy are removed (this process is called "energy separation" or "energy analysis").

Parallelism of the ion beam and energy separation have hitherto been performed through use of different functional elements.

Therefore, the length of the beam line of the ion beam has become longer, which in turn increases a loss due to divergence of the ion beam or a like cause. As a result, a drop occurs in the transport efficiency of the ion beam, thereby resulting in difficulty in ensuring a sufficient quantity of a beam. Particularly, the space-charge effect of the ion beam has noticeably appeared in transport of the ion beam at low energy, thereby diverging the ion beam and posing difficulty in efficient transport of the ion beam. Therefore, an ion implantation apparatus capable of shortening the length of the beam line as much as possible is desired.

Specific examples of the related art will now be mentioned. Japanese Patent Gazette No. 3-233845 (an area ranging from a right column on page. 1 to an upper left column on page. 2, FIG. 6) (hereinafter referred as Patent Document 1) describes a technique for separating energy through electrostatic deflection. However, an electrostatic deflection electrode used for energy separation is an electrode of parallel plate type, and the ion beam is not paralleled by the electrostatic deflection electrode. Parallelism of the ion beam is performed by another scanning electrode of parallel plate type provided for only parallelism purpose. Accordingly, as mentioned previously, there still arises a problem of an increase in the length of the beam line.

Another energy separation technique is to place a deflection electromagnet (at a downstream position) after the ion beam has been accelerated to final energy and to determine a turning radius R1 of the ion beam through use of the following equation. Here, "B" designates a flux density; "m" designates the mass of ions constituting an ion beam; "q" designates electric charges; and "V1" designates an accelerated voltage of the ion beam, which corresponds to energy.

$$R_1 = (1/B) \times (2\,mV_1/q)^{1/2} \qquad \text{[Equation 1]}$$

Such a technique is described as, e.g., an energy analysis magnet in Japanese Patent No. 33358336 (paragraphs 0002, 0003, FIG. 1) (hereinafter referred as Patent Document 2).

However, the technique is practiced for an ion beam which is not subjected to scanning and parallelism. Parallelism of an ion beam is carried out through use of a deflection electromagnet which is provided for only parallelism purpose and is called another beam paralleling magnet. Accordingly, as mentioned previously, there still arises a problem of an increase in the length of the beam line.

A technique for performing parallelism of an ion beam scanned and energy separation through use of a single element (a sector-shaped electromagnet) is described in Japanese Patent Gazette No. 11-354064 (paragraphs 0016 to 0018, FIG. 1) (hereinafter referred as Patent Document 3).

The technique described in Patent Document 3 is for performing parallelism of an ion beam and energy separation through use of a deflection electromagnet called a sector-shaped electromagnet. In the case where the energy of the ion beam (corresponding to $V_1$ in Equation 1) and the mass "m" of desired ions are increased, as can be seen from Equation 1, when an attempt is made to extract indium (In) ions having energy of 200 keV or more, a flux density B must be made extremely large in order to achieve a constant turning radius R1. For this reason, an iron core and a coil, which together constitute the deflection electromagnet, become very large, and hence the deflection electromagnet becomes huge. Moreover, there is also another problem of an increase in the weight and cost of the deflection electromagnet and the size of the power source for the deflection electromagnet or the like.

Moreover, the technique described in Patent Document 3 suffers the following problem. Namely, the ion beam is deflected by the deflection electromagnet within a plane in which a scanner called as an electrostatic deflector performs scanning of the ion beam. Therefore, if a deflection angle of the ion beam in the deflection electromagnet is not made very large, energy separation will not be performed sufficiently, which will in turn result in a failure to sufficiently eliminate ions of undesired energy. The reason for this is as follows. Both the ion beam having desired energy and ions having undesired energy have been spread after having been scanned by the scanner. In order to separate the thus-spread ion beams from each other within a single plane, the deflection angles of the ion beams must be made extremely large in comparison with a case where ion beams with narrow width are separated from each other or a case where the ion beams are separated from each other within different planes. Rendering the deflection angles extremely large corresponds to an extreme decrease in the turning radius R1 by means of rendering the flux density B expressed by Equation 1 very large. In such a case, a problem analogous to that described previously is still encountered.

If an attempt is made to solve the problem of incidence of ions of undesired energy onto a target without a substantial increase in the deflection angle of the deflection electromagnet, a distance from the exit of the deflection electromagnet to the target must be made longer. As a result, there is raised a problem of an increase in the length of the beam line.

Moreover, neutral particles—which are present as a result of molecules remaining in an atmosphere having collided with the ion beam—travel rectilinearly within the deflection electromagnet in, above, and below the deflection electromagnet. Unless the deflection angle of the deflection electromagnet is increased or unless the distance from the deflection electromagnet to the target is increased, the rectilinearly-traveling neutral particles is injected into the target. As a result, non-uniform implantation of the ions into the target has arisen. In order to solve the problem, there must be selected at least one from an option for rendering the deflection angle of the deflection electromagnet large and an option for increasing the distance from the exit of the deflection electromagnet to the target. In any event, there still remains a problem of an increase in the length of the beam line.

DISCLOSURE OF THE INVENTION

An object of the present invention is to provide an ion beam apparatus which can perform parallelism of an ion beam, separate energy of ion beam, and shorten the length of a beam line of the ion beam.

A first ion beam apparatus according to the invention is characterized by comprising: a scanner which scans an injected ion beam around a given scan center within a given scan surface; and an electrostatic deflector which electrostatically deflects the ion beam ejected from the scanner through 90° so that an ion beam of desired energy travels in a direction perpendicular to the scan surface within a circular-arc-shaped deflection zone centered on the scan center. This ion beam apparatus has a configuration to perform scanning and deflection of an ion beam. Hence, the ion beam apparatus can also be called an ion beam deflector.

A second ion beam apparatus according to the present invention is characterized by comprising: an ion source which extracts an ion beam; a mass separation electromagnet which separates an ion beam of desired mass from the ion beam extracted from the ion source; a scanner which scans the ion beam that has been passed through the mass separation electromagnet around a given scan center within a given scan surface; an electrostatic deflector which electrostatically deflects the ion beam ejected from the scanner through 90° so that an ion beam of desired energy travels in a direction perpendicular to the scan surface within a circular-arc-shaped deflection zone centered on the scan center; and a scanning mechanism which retains a target for ion implantation and which mechanically, reciprocally moves the target in a direction in which the target crosses the ion beam ejected from the electrostatic deflector at a given angle. This ion beam apparatus has a configuration to perform scanning, deflection and injection of the ion beam to the target. Hence, the ion beam apparatus can also be called an ion implantation apparatus.

According to the ion beam apparatus, the ion beam scanned by the scanner spreads into the shape of a sector and is injected into the electrostatic deflector.

An ion beam of desired energy in the ion beam injected into the electrostatic deflector is electrostatically deflected through 90° within an arc-shaped deflection zone centered on the scan center so as to travel in a direction perpendicular to the scan surface and then ejected (output) from the electrostatic deflector.

Ion beams constituting the ion beam of desired energy in the ion beam ejected from the electrostatic deflector are parallel to each other. The reason for this is that ion beams ejected from one scan surface at right angles are parallel to each other regardless of a scanning position in the same manner as are a plurality of normals standing on one surface. Thus, the ion beams ejected from the electrostatic deflector can be paralleled.

The ions of undesired energy in the ion beam injected into the electrostatic deflector differ from the ion beam of desired energy in terms of a deflection radius (i.e., a turning radius). Therefore, the ions of undesired energy can be separated from the ion beam of desired energy. In this way, elimination of energy contaminants; that is, energy separation, can be performed.

Moreover, the direction in which the ion beam is deflected by the electrostatic deflector is a direction perpendicular to the direction in which the ion beam is scanned by the scanner 12. In contrast with the technique described in Patent Document 3, ion beams, which have different energy levels and have been spread through scanning action of the scanner, are not separated from each other within a single plane but are separated within different planes. Separation of ions of different energy levels is simple, and hence an energy separation function is very strong. In addition, the angle at which the ion beams are deflected by the electrostatic deflector is as large as 90°. Even in this regard, separation of the ions having different energy levels is easy, and hence the energy separation function is extremely strong. As a result of combination of these features, the energy separation function of the electrostatic deflector is extremely strong.

In contrast with the case of a deflection electromagnet, in the case of the electrostatic deflector, an increase in the deflection angle can be achieved with comparative simplicity by means of bending the electrostatic deflector or a like method. Moreover, the deflection angle does not depend on the mass of ions constituting the ion beam, and the ions of mass are not deflected easily. Even when the deflection angle is increased to 90°, occurrence of the problem of the deflection electromagnet becoming huge, which is described in Patent Document 3, can be prevented.

As mentioned above, according to this ion beam apparatus, parallelism of the ion beam and energy separation can be achieved through use of one electrostatic deflector. Hence, when compared with the case where parallelism of an ion beam and energy separation are performed through use of different functional elements as in the case of the techniques described in Patent Document 1 or 2, the length of a beam line of the ion beam can be shortened.

Since the energy separation function of the electrostatic deflector is considerably strong, the length from the exit of the electrostatic deflector to the target can be significantly shortened as compared with the case of the technique described in Patent Document 3. From this viewpoint as well, the length of the beam line of the ion beam 4 can be shortened.

In a third ion beam apparatus according to the present invention, the scanning mechanism may preferably move the target in a direction parallel to a surface of the target.

In a fourth ion beam apparatus according to the present invention, the electrostatic deflector has a pair of deflection electrodes which are spaced apart from each other and mutually oppose.

In a fifth ion beam apparatus according to the present invention, provided that three axes intersecting at right angles at one point are taken as X, Y and Z axes, the ion beam is injected into the scanner in parallel to the Z axis; the scanner scans the injected ion beam around the scan center within the scan surface parallel to a Y-Z plane; and the electrostatic deflector deflects an ion beam of desired energy in the injected ion beam through 90° so as to eject in parallel with the X axis; when consideration is given of a locus of one ion beam having desired energy in the scanned and deflected ion beam, the locus assumes the shape of an arc section at an extremity of a linear section, the arc-shaped section being bent in the manner of an arc at an angle of 90° so as to become parallel to the X axis; and mutually-opposing surfaces of a pair of deflection electrodes constituting the electrostatic deflector each have a shape generally aligned with a surface of revolution, wherein the surface of revolution is drawn by the arc-shaped section when the locus of one ion beam is caused to pass through the scan center and rotated through a predetermined angle in the scanning direction with reference to an axis parallel to the X axis.

In a sixth third ion beam apparatus according to the present invention, the mutually-opposing surfaces of the respective deflection electrodes constituting the deflection electrodes each may assume a shape defined by means of circumferentially cutting a torus through a predetermined angle centered on a torus center axis which passes through the scan center and is parallel to the X axis, and cutting an outer periphery of a longitudinal cross-sectional surface of the torus through only 90°.

In a seventh ion beam apparatus according to the present invention, the mutually-opposing surfaces of the pair of deflection electrodes constituting the deflection electrodes may be each formed by combination of a plurality of surfaces aligned with the surface of revolution.

In an eighth ion beam apparatus according to the present invention, at least one of the pair of deflection electrodes constituting the electrostatic deflector may be divided into a plurality of segments with a gap in a direction in which a deflection angle is increased.

In a ninth ion beam apparatus according to the present invention, at least the mutually-opposing surfaces of the pair of deflection electrodes constituting the electrostatic deflector may be formed from carbon.

In a tenth ion beam apparatus according to the present invention, the ion beam apparatus may further comprise a deflection power source for applying a deflection voltage, which is a d.c. voltage and symmetrical with respect to a ground voltage, to the mutually-opposing surfaces of the pair of deflection electrodes constituting the electrostatic deflector.

In an eleventh ion beam apparatus according to the present invention, the scanner may scan the ion beam that has injected into the scanner in a manner symmetrical with respect to an incident axis of the ion beam. In a twelfth ion beam apparatus according to the present invention, the scanner may scan the ion beam that has injected into the scanner in only an area on one side with respect to an incident axis of the ion beam.

In a thirteenth ion beam apparatus according to the present invention, the ion beam apparatus may further comprise an acceleration/deceleration device which is interposed between the scanner and an electrostatic deflector and electrostatically accelerates or decelerates the scanned ion beam; the acceleration/deceleration device having at least two electrodes spaced a given interval in a traveling direction of the ion beam; and each of the electrodes having a circular-arc shape centered on the scan center and a beam passage hole which is wider than the width of the scanned ion beam in the scanning direction.

In a fourteenth ion beam apparatus according to the present invention, preferably, an entrance electrode constituting the acceleration/deceleration device also doubles as an analysis slit which permits passage of an ion beam of desired mass, thereby inhibiting passage of ions of undesired mass.

In a fifteenth ion beam apparatus according to the present invention, a beam mask which permits passage of an ion beam of desired energy and inhibits passage of ions of undesired energy maybe disposed in the vicinity of an exit of the electrostatic deflector.

In a sixteenth ion beam apparatus according to the present invention, a cross section of a scanned beam of the ion beam ejected from the electrostatic deflector, the scanned beam being perpendicular to a traveling direction of the ion beam, may assume the shape of an arc, and the beam mask may have a beam passage hole having an arc-shaped geometry substantially similar to the arc-shaped scanned beam cross section.

In a seventeenth ion beam apparatus according to the present invention, the scanner may have a pair of mutually-parallel scan electrodes, and a scan power source which applies a scan voltage Vs expressed by $V_s=ct/(1-c^2t^2)^{1/2}$ ("c" is a constant, and "t" is time) between the pair of scan electrodes.

In an eighteenth ion beam apparatus according to the present invention, the electrostatic deflector may have the function of decelerating the ion beam of desired energy among the ion beams injected into the electrostatic deflector while deflecting the ion beam.

In a nineteenth ion beam apparatus according to the present invention, the electrostatic deflector may have with the function of accelerating the ion beam of desired energy among the ion beams injected into the electrostatic deflector while deflecting the ion beam.

In a twentieth ion beam apparatus according to the present invention, the electrostatic deflector may have inner and outer deflection electrodes which oppose each other with an interval therebetween; and the interval between the mutually-opposing surfaces of the inner and outer deflection electrodes becomes wider toward the exit of the deflector.

In a twenty-first ion beam apparatus according to the present invention, the electrostatic deflector may have inner and outer deflection electrodes which oppose each other with an interval therebetween; and the interval between the mutually-opposing surfaces of the inner and outer deflection electrodes becomes narrower toward the exit of the deflector.

In a twenty-second ion beam apparatus according to the present invention, the following relationships maybe satisfied on condition that the electrostatic deflector has inner and outer deflection electrodes which oppose each other with an interval therebetween; that the inner and outer deflection electrodes are divided into "n" pairs ("n" is an integer of two or more) in a direction in which the deflection angles increase, to thus form "n" deflection electrode pairs; that voltages applied to the inner deflection electrodes among the "n" deflection electrode pairs are taken as $Va_1, Va_2, \ldots, Va_n$ in sequence from the entrance; and that voltages applied to the outer deflection electrodes among the "n" deflection electrode pairs are taken as $Vb_1, Vb_2, \ldots, Vb_n$ in sequence from the entrance, $Va_1<Va_2<\ldots<Va_n$, $Vb_1<Vb_2<\ldots<Vb_n$, and $Va_1<Vb_1, Va_2<Vb_2, \ldots, Va_n<Vb_n$.

In a twenty-third ion beam apparatus according to the present invention, the following relationships may be satisfied on condition that the electrostatic deflector has inner and outer deflection electrodes which oppose each other with an interval therebetween; that the inner and outer deflection electrodes are divided into "n" pairs ("n" is an integer of two or more) in a direction in which the deflection angles increase, to thus form "n" deflection electrode pairs; that voltages applied to the inner deflection electrodes among the "n" deflection electrode pairs are taken as $Va_1, Va_2, \ldots, Va_n$ in sequence from the entrance; and that voltages applied to the outer deflection electrodes among the "n" deflection electrode pairs are taken as $Vb_1, Vb_2, \ldots, Vb_n$ in sequence from the entrance, $Va_1>Va_2>\ldots>Va_n$, $Vb_1>Vb_2>\ldots>Vb_n$, and $Va_1<Vb_1, Va_2<Vb_2, \ldots, Va_n<Vb_n$.

In a twenty-fourth eighteenth ion beam apparatus according to the present invention, the interval between the mutually-opposing surfaces of the deflection electrode pairs is constant from the entrance to the exit of the electrostatic deflector.

In a twenty-fifth ion beam apparatus according to the present invention, the interval between the mutually-opposing surfaces in the respective "n" deflection electrode pairs becomes wider toward the exit of the deflector.

In a twenty-sixth ion beam apparatus according to the present invention, the interval between the mutually-opposing surfaces in the respective "n" deflection electrode pairs becomes narrower toward the exit of the deflector.

In a twenty-seventh ion beam apparatus according to the present invention, the following expressions or equivalent mathematical relationships are substantially satisfied on condition that the electrostatic deflector has inner and outer deflection electrodes which oppose each other with an interval therebetween; that radii of mutually-opposing surfaces of the inner and outer deflection electrodes are taken as ra and rb; that voltages applied to the inner and outer deflection electrodes are taken as Va and Vb; an electric potential in an orbit of the ion beam of desired energy within the electrostatic deflector is taken as V; a voltage corresponding to the ion beam of kinetic energy at the exit of the electrostatic deflector is taken as Ve; and a design orbit radius of the ion beam within the electrostatic deflector is taken as rc;

$Va = V - 2(Ve - V) \log(rc/ra)$, and $Vb = V + 2(Ve - V) \log(rb/rc)$.

As has been described, according to the invention, parallelism of the ion beam and energy separation can be achieved through use of a single electrostatic deflector. Hence, when compared with the case where parallelism of an ion beam and energy separation are performed through use of different functional elements, the length of a beam line of the ion beam can be shortened.

Further, since the energy separation function of the electrostatic deflector is considerably strong, the length from the exit of the electrostatic deflector to the target can be significantly shortened as compared with the case using a known deflection electromagnet. From this viewpoint as well, the length of the beam line of the ion beam can be shortened.

Consequently, for instance, the transport efficiency of abeam can be improved by means of reducing a loss due to dispersion of the ion beam or the like to thereby ensure a large amount of beam. This effect becomes particularly noticeable when the transported ion beam is of low energy.

Since the length of the beam line can be shortened, the overall system can be made compact.

When compared with the deflection electromagnet using a magnetic field, the electrostatic deflector can achieve weight reduction and a decrease in power consumption.

The third ion beam apparatus has an additional advantage of, even when the angle at which the ion beam is implanted to the target is not 0 degree, the incidence position of the ion beam injected into the target remaining unchanged and constant within the plane of the target.

The eighth ion beam apparatus has an additional advantage of ability to efficiently evacuate the inside of the electrostatic deflector by way of the gap existing between the separated deflection electrodes.

The ninth ion beam apparatus has an additional advantage of less affecting characteristics of a semiconductor device to be fabricated on the surface of the target even when ions of undesired energy have collided with the mutually-opposing surfaces of the deflection electrodes, to thus cause sputtering and erroneously arrive at the target, because sputter particles are generated by sputtering carbon.

The tenth ion beam apparatus has an additional advantage as described below. Specifically, the ion beam of desired energy passes through the neighborhood of the ground potential area in the electrostatic deflector. Hence, the ion beam is not accelerated or decelerated in the electrostatic deflector. Further, a device disposed directly upstream of the electrostatic deflector and a device disposed directly downstream of the electrostatic deflector usually remain at a ground potential. Hence, the ion beam is not accelerated or decelerated even before or after the electrostatic deflector. Accordingly, the energy of the ion beam remains unchanged even after having passed through the electrostatic deflector.

The twelfth ion beam apparatus has an additional advantage of separation of neutral particles from the ion beam being facilitated, because the neutral particles are not scanned by the scanner and travel rectilinearly.

The thirteenth ion beam apparatus has an additional advantage of the ion beam not being bent by an electric field and the direction of the ion beam remaining unchanged even when the scanned ion beam is accelerated or decelerated by the electric field, because the electric field in the acceleration/deceleration device is applied in a direction parallel to the direction of the ion beam injected into the acceleration/deceleration device at all times regardless of the scanning position of the ion beam scanned by the scanner.

The fourteenth ion beam apparatus has an additional advantage of ability to shorten the length of the beam line when compared with a case where separate analysis slits are provided, because provision of separate analysis slits becomes obviated.

The fifteenth ion beam apparatus has an additional advantage of ability to enhance energy separation performance as a result of combination of the electrostatic deflector and the beam mask.

The sixteenth ion beam apparatus has an additional advantage of ability to enhance the energy separation performance to a much greater extent as a result of combination of the electrostatic deflector and the beam mask.

The seventeenth ion beam apparatus has an additional advantage of the speed—at which the ion beam ejected from the electrostatic deflector is scanned over a line in the scanning direction—becoming constant.

The eighteenth to twenty-sixth ion beam apparatuses have the following additional advantages. Specifically, the electrostatic deflector can decelerate the ion beam while deflecting it, thereby obviating a necessity for providing the deflector with a separate ion beam acceleration/deceleration device. Resultantly, when compared with a case where the deflector is provided with the separate ion beam acceleration/deceleration device, the beam line can be shortened. Therefore, a loss due to scattering of the ion beam, or the like, is diminished further, thereby enhancing the transport efficiency of the beam. Thus, ensuring a larger amount of beam is facilitated. Moreover, since the beam line can be shortened, the entire ion beam apparatus can be made more compact.

Particularly, in the case where the ion beam is decelerated, when the ion beam is caused to pass through the electrostatic deflector after having been completely decelerated to a desired energy level by the acceleration/deceleration device, the beam line at low energy is elongated, thereby increasing scattering of the ion beam due to the space charge effect. In contrast, according to the invention, the electrostatic deflector gradually decelerates the ion beam to a desired energy level while deflecting the ion beam within the electrostatic deflector. The beam energy of low energy is shortened at an arbitrary position in the electrostatic deflector. Accordingly, scattering of the ion beam due to the space charge effect can be suppressed. Consequently, extraction of an ion beam of large current at a low energy level is facilitated.

The nineteenth to twenty-sixth ion beam apparatuses have the following additional advantages. Specifically, the electrostatic deflector can accelerate the ion beam while deflecting it, thereby obviating a necessity for providing the deflector with a separate ion beam acceleration/deceleration device. Resultantly, when compared with a case where the deflector is provided with the separate ion beam acceleration/deceleration device, the beam line can be shortened. Therefore, a loss due to scattering of the ion beam, or the like, is diminished further, thereby enhancing the transport efficiency of the beam. Thus, ensuring a larger amount of beam is facilitated. Moreover, since the beam line can be shortened, the entire ion beam apparatus can be made more compact.

According to the twenty-seventh ion beam apparatus, the predetermined acceleration or deceleration of the ion beam in a predetermined beam orbit can be performed more smoothly within the electrostatic deflector. Therefore, there is yielded another advantage of the ability to eject the ion beam with the aligned orbit from the electrostatic deflector.

Figure 1:
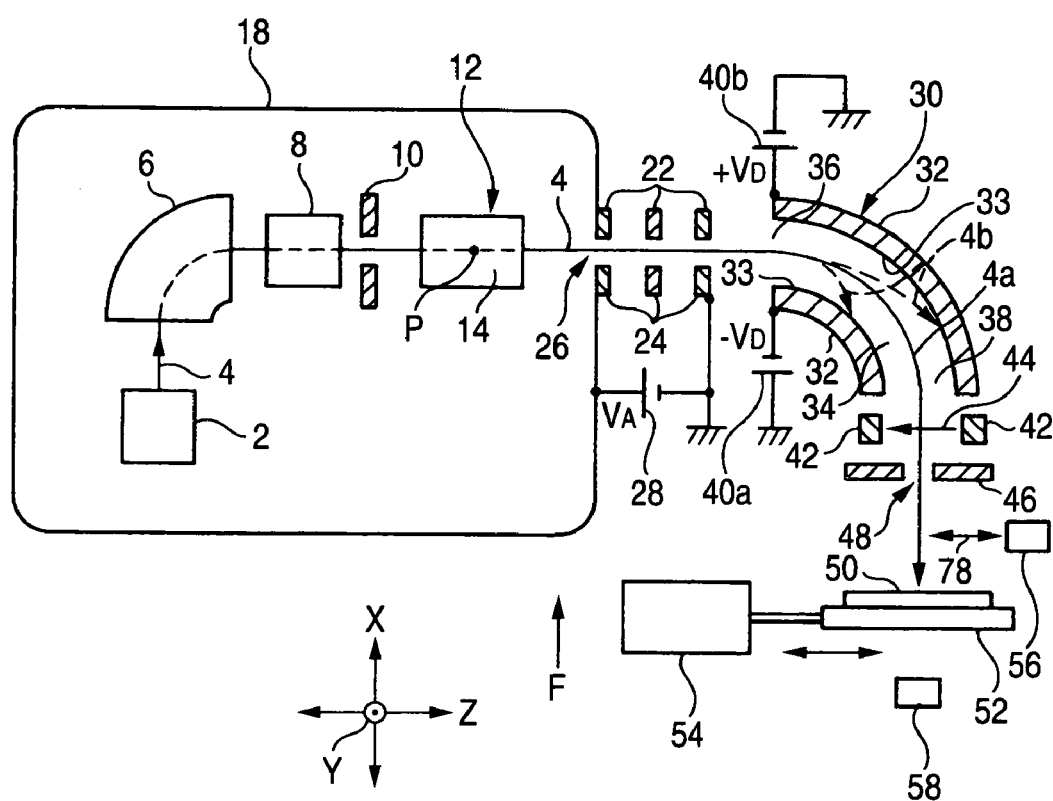
FIG. 1 is a plan view showing an embodiment of an ion beam apparatus according to the invention.

Further, in notations in the drawings, numeral 2 designates an ion source, numeral 4 designates an ion beam, numeral 4a designates an ion beam of desired energy, numeral 6 designates a mass separation electromagnet, numeral 12 designates a scanner, numeral 16 designates a scan power source, numeral 22 designates acceleration/deceleration device, numeral 28 designates acceleration/deceleration power source, numeral 30 designates electrostatic deflector, numeral 32, 32a, 32b designate deflection electrode, numeral 33 designates mutually-opposing surface, numeral 40a, 40b designate deflection power source, numeral 42 designates a deflection electromagnet, numeral 46 designates a beam mask, numeral 50 designates a target, numeral 52 designates a holder, and numeral 54 designates scanning mechanism.

BEST MODE FOR CARRYING OUT THE INVENTION

Figure 2:
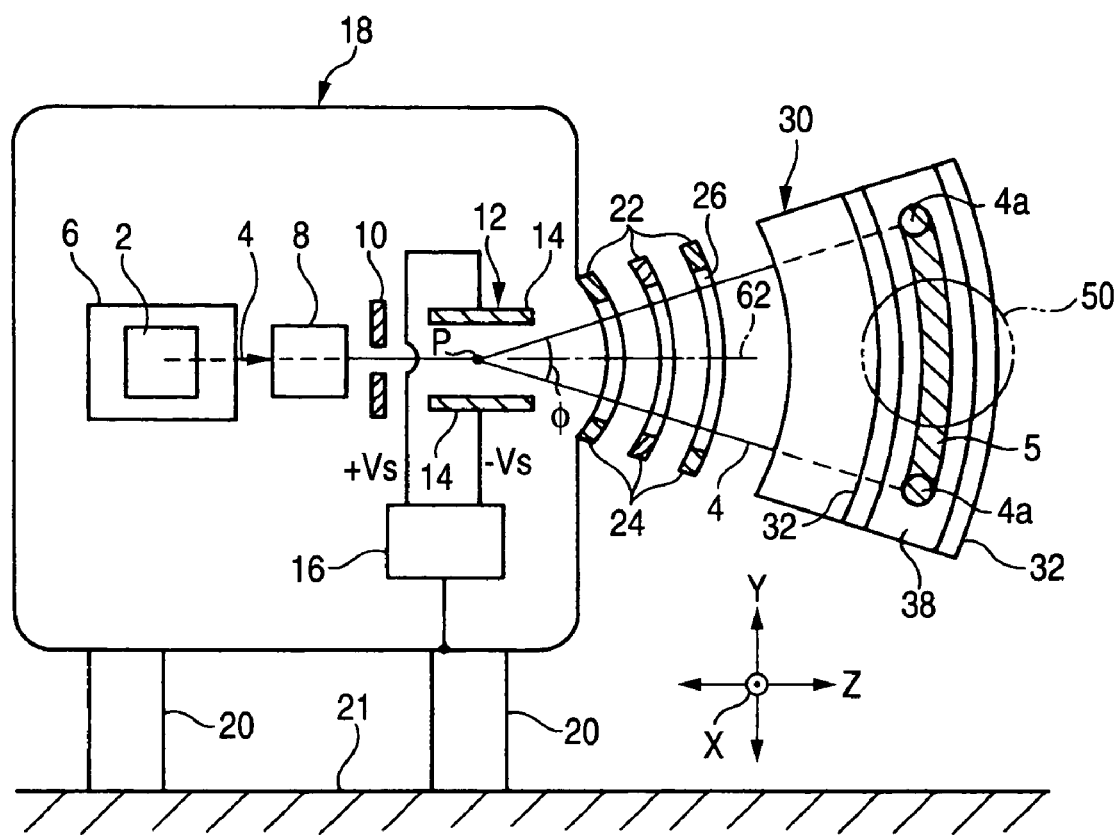
FIG. 2 is a front view partially showing the ion beam apparatus shown in FIG. 1 when viewed in the direction of am arrow F, showing an area from an ion source to an exit of an electrostatic deflector.

FIG. 1 is a plan view showing an embodiment of an ion beam apparatus (more specifically, an ion implantation apparatus) according to the present invention. FIG. 2 is a front view partially showing the ion beam apparatus shown in FIG. 1 when viewed in the direction of arrow F, showing a portion of the ion beam apparatus from an ion source to an exit of an electrostatic deflector. In the following descriptions, in an area of a path along which an ion beam 4 extracted from an ion source 2 travels, an area near to the ion source is called an "upstream area," and an opposite area is called a "downstream area."

This ion beam apparatus comprises the ion source 2 which extracts the ion beam 4; a mass separation electromagnet 6 which separates an ion beam 4 of a desired mass from the ion beam 4 extracted from ion source 2 (i.e., performs mass-separation of the ion beam 4); and a scanner 12 which scans the ion beam 4, which has passed through the mass separation electromagnet 6, within a given scan surface 13 (see FIG. 3) at a center of a given scan center P. A scan angle at which the ion beam 4 is scanned by the scanner 12 is taken as θ.

In the present embodiment, provided that three axes which intersect at right angles at one point are taken as an X axis, a Y axis, and a Z axis, the ion beam 4 is injected into the scanner 12 in parallel with the Z axis. The scanner 12 scans the thus-injected ion beam 4 at the center of the scan center P within the scan surface 13 parallel to a Y-Z plane.

In drawings subsequent to FIG. 1, in order to facilitate comprehension of the traveling direction of the ion beam 4 and orientations of other devices, the X, Y, and Z axes are illustrated.

A cross-sectional profile (a cross section orthogonal to the traveling direction) of the ion beam 4 extracted from the ion source 2 assumes, for instance, the shape of a circular spot. However, the cross-sectional profile may assume another shape (e.g., an oval shape or a rectangle).

As is the case in this embodiment, a quadrupole lens (Q lens) 8 for shaping the cross-sectional profile of the ion beam 4 may be interposed between the mass separation electromagnet 6 and the scanner 12, as required.

As in the case of this embodiment, downstream of the mass separation electromagnet 6 may be disposed an analysis slit 10 which operates in conjunction with the mass separation electromagnet 6 to permit passage of the ion beam 4 of a desired mass and hinder passage of ions of an undesired mass (i.e., to perform mass separation) In this embodiment, the analysis slit 10 is disposed directly upstream of the scanner 12, but the analysis slit 10 may also be disposed directly upstream of an electrode 24 provided at an entrance (most upstream position) of acceleration/deceleration device 22 which will be described later. Alternatively, the electrode 24 disposed at the entrance maybe caused to double as the analysis slit. If the electrode 24 is caused to serve as the analysis slit, a necessity for forming an additional analysis slit may be obviated. Hence, in comparison with a case where the analysis slit is provided separately, the length of the beam line can be shortened.

In the embodiment, the respective devices disposed in a range from the ion source 2 to the scanner 12 are housed in a high-voltage box 18. As shown in FIG. 2, the high-voltage box 18 is supported by support insulators 20 at a location above aground potential section 21. An acceleration/deceleration voltage $V_A$ is applied from an acceleration/deceleration power source 28 serving as a d.c. power source between the high-voltage box 18, the entrance electrode 24 disposed at the entrance of the acceleration/deceleration device 22 connected to the high-voltage box 18, and the ground potential section 21. In the case of an acceleration mode in which the ion beam 4 is accelerated by the acceleration/deceleration devices 22, the acceleration/deceleration power source 28 is connected to the high-voltage box 18 such that a positive terminal is connected to the high-voltage box 18 as in the case of the illustrated embodiment. In contrast, in the case of a deceleration mode in which the ion beam 4 is decelerated, a negative terminal is connected to the high-voltage box 18 in contrast to the illustrated embodiment. The acceleration/deceleration power source 28 used in the acceleration mode and the acceleration/deceleration power source 28 used in the deceleration mode may be a single power source or different power sources. Alternatively, in the case of a deceleration mode, a power source (not shown) specifically designed for a deceleration mode may be interposed between the ion source 2 and the ground potential section 21, thereby causing the acceleration/deceleration devices 22 to decelerate the ion beam 4.

In the present embodiment, the scanner 12 is of electrostatic type and has a pair of scan electrodes 14 of parallel plate type which are parallel to each other. A scan voltage Vs having the shape of a triangular wave or a generally triangular wave (see, e.g., FIG. 15) is applied from a scan power source 16 between the scan electrodes 14. More specifically, in the present embodiment, the scan voltage Vs, which oscillates symmetrically between a high voltage side and a low voltage side with reference to the potential of the high-voltage box 18, that is, ±Vs, is applied between the scan electrodes 14.

Figure 3:
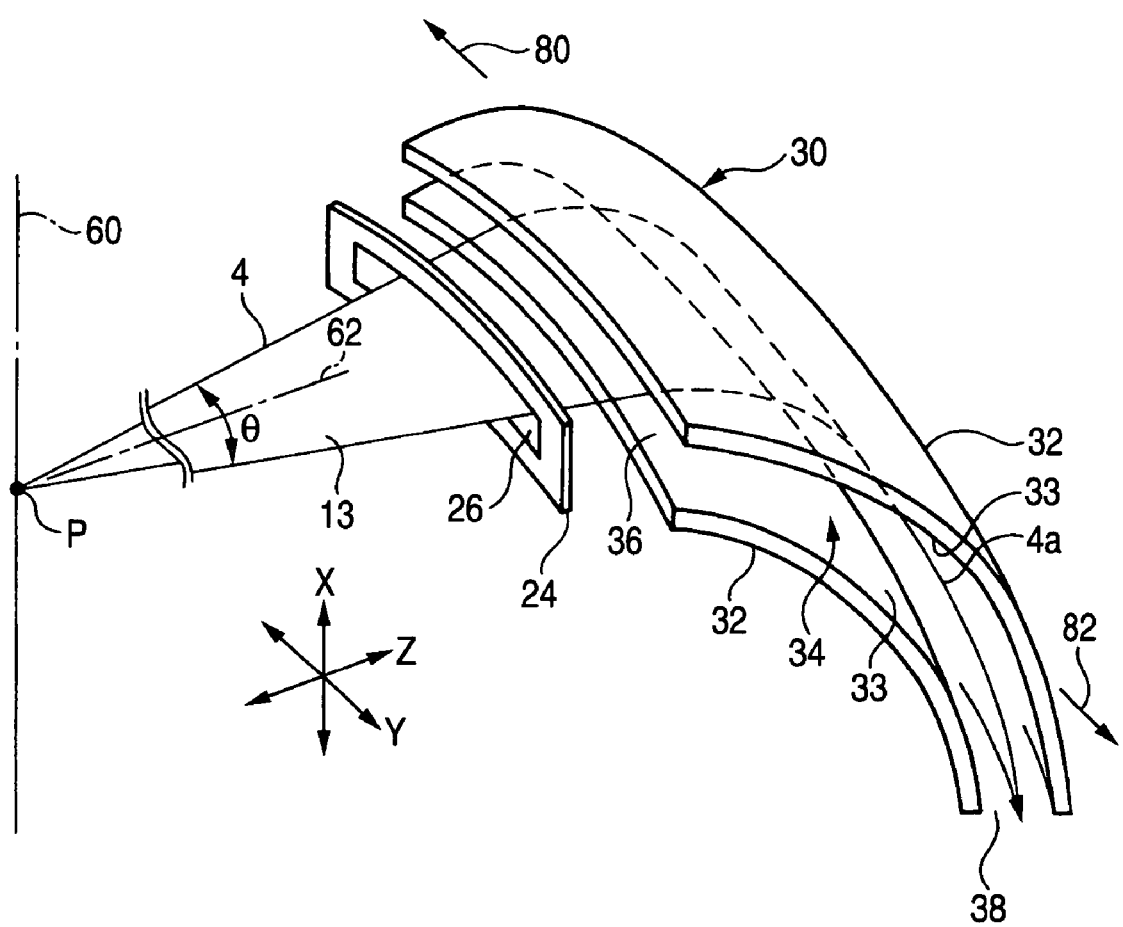
FIG. 3 is a perspective view showing an example of surroundings of the electrostatic deflector shown in FIG. 1.

As in the case of the embodiment shown in FIGS. 2 and 3, the scanner 12 may be one which scans the ion beam 4 injected into the scanner 12 in a direction symmetrical with respect to an incident axis 62 (i.e., an axis parallel to the Z axis). Alternatively, the scanner 12 may be one which scans only an area on one side with respect to the incident axis 62 (i.e., one side in the direction of the Y axis). In order to cause the scanner 12 to perform scanning operation as in the latter case, the only requirement is to offset, for instance, the center potential of the scan voltage Vs toward a level higher or lower than the potential of the high-voltage box to apply a bias. If scanning is performed as in the latter case, neutral particles are not scanned by the scanner 12 and travel rectilinearly, thereby facilitating separation of the neutral particles from the ion beam 4.

The ion beam apparatus further comprises an electrostatic deflector 30 which statically deflects the ion beam 4 ejected from the scanner through 90° so that an ion beam 4a of desired energy in the ion beam 4 travels within a circular-arc deflected area centered on the scan center P in a direction perpendicular to the scan surface 13, i.e., in a direction parallel to the X axis; and a scanning mechanism 54 which retains a target 50 (e.g., a semiconductor substrate) for ion implantation, and which mechanically, reciprocally moves the target 50 in a direction in which the target 50 intersects the ion beam 4*a* that has passed through the static deflector 30 at a given angle. In the present embodiment the target 50 is retained by a holder 52.

As in the case of the present embodiment, the acceleration/deceleration devices 22 that statically accelerate or decelerate the ion beam 4 scanned by the scanner 12 may be interposed between the scanner 12 and the electrostatic deflector 30. The acceleration/deceleration devices 22 have at least two of the electrodes 24 spaced at a given interval in the traveling direction of the ion beam 4. Referring to FIG. 3, each of the electrodes 24 has a circular-arc shape centered on the scan center P, and a beam passage hole 26 which is wider than the width of the scanned ion beam 4 with reference to the traveling direction of the ion beam 4.

In this embodiment, in relation to the potential of each of the electrodes 24 constituting the acceleration/deceleration device 22, the potential of the electrode 24 provided at the entrance is identical with that of the high-voltage box 18. The potential of the electrode 24 provided at the exit (i.e. the most downstream position) corresponds to a ground potential, and the potential of the respective electrode 24 located between the entrance and the exit corresponds to a potential between the high voltage and the ground potential.

If the acceleration/deceleration device 22 such as that mentioned above is used, the electric field developing in the acceleration/deceleration device 22 is applied to the ion beam 4 injected into the acceleration/deceleration device 22 in parallel thereto at all times regardless of the scanning position of the ion beam 4 scanned by the scanner 12. Even when the scanned ion beam 4 is accelerated or decelerated by the electric field, the ion beam 4 is not bent by the electric field, and the traveling direction of the ion beam 4 remains unchanged.

The electrostatic deflector 30 will be further explained by reference to FIG. 3 or the like.

The electrostatic deflector 30 has a pair (set) of deflection electrodes 32 which oppose each other at a given interval.

As mentioned previously, the electrostatic deflector 30 ejects the ion beam 4*a* of desired energy in the injected ion beam 4 in parallel to the X axis after having deflected the ion beam through 90°. Consideration is now given of the locus of one ion beam 4*a* of desired energy in the ion beam 4 which has been scanned by the scanner 12 and deflected by the electrostatic deflector 30. The locus comprises a linear section and an arc-shaped section formed at the extremity thereof, wherein the arc-shaped section is bent in the shape of an arc at 90° so as to become parallel to the X axis. Mutually-opposing surfaces 33 of the pair of deflection electrodes 32 constituting the electrostatic deflector 30 each have a shape aligned with or generally aligned with a surface of revolution which is drawn by the arc-shaped section when the locus of one ion beam 4*a* is rotated through a predetermined angle in the scanning direction with reference to an axis 60 passing through the scan center P and parallel to the X axis.

Surfaces of the respective deflection electrodes 32 opposite their mutually-opposing surfaces 33 are not limited to any specific shapes. For instance, as in the case of the embodiment shown in FIG. 1, the surfaces may assume a shape that agrees with the shape of the mutually-opposing surfaces 33 or another shape. The reason for this is that the electric field used for deflecting the ion beam 4 develops between the mutually-opposing surfaces 33, and therefore the shape of the mutually-opposing surfaces 33 is of importance.

The location where the ion beam 4 is deflected by the electrostatic deflector 30 is located equidistantly from the scan center P, regardless of an angle through which the scanner 12 scans the ion beam 4. Further, the direction in which deflecting force acts on the ion beam 4 lies in a plane perpendicular to the scan surface 13, the plane including a direction in which the ion beam 4 progresses, in connection with the respective scanned ion beams 4. Specifically, the configuration of the electrostatic deflector 30; that is, the configuration of the mutually-opposing surfaces 33, has symmetry with respect to the scan angle θ of the ion beam 4 (i.e., symmetry in the direction of an azimuth angle).

A space defined between the mutually-opposing surfaces 33 of the deflection electrodes 32 of the electrostatic deflector 30 comprises an entrance end face 36 where the ion beam 4 is injected; a deflection zone 34 where the ion beam 4*a* of desired energy is deflected through 90°; and an exit end face 38 from which the ion beam 4*a* exits. The entrance end face 36 is perpendicular to the scan surface 13 of the ion beam 4; that is, the Y-Z plane, and bent into the circular-arc shape centered on the scan center P. The exit end face 38 is parallel to the Y-Z plane and bent into the circular-arc shape centered on a point in a plane including the exit end face 38, where the scan center P is projected on the point in the plane. The deflection zone 34 is bent in the same manner at any scan angle θ at which the ion beam 4 is scanned, and connects the entrance end face 36 to the exit end face 38.

Figure 4:
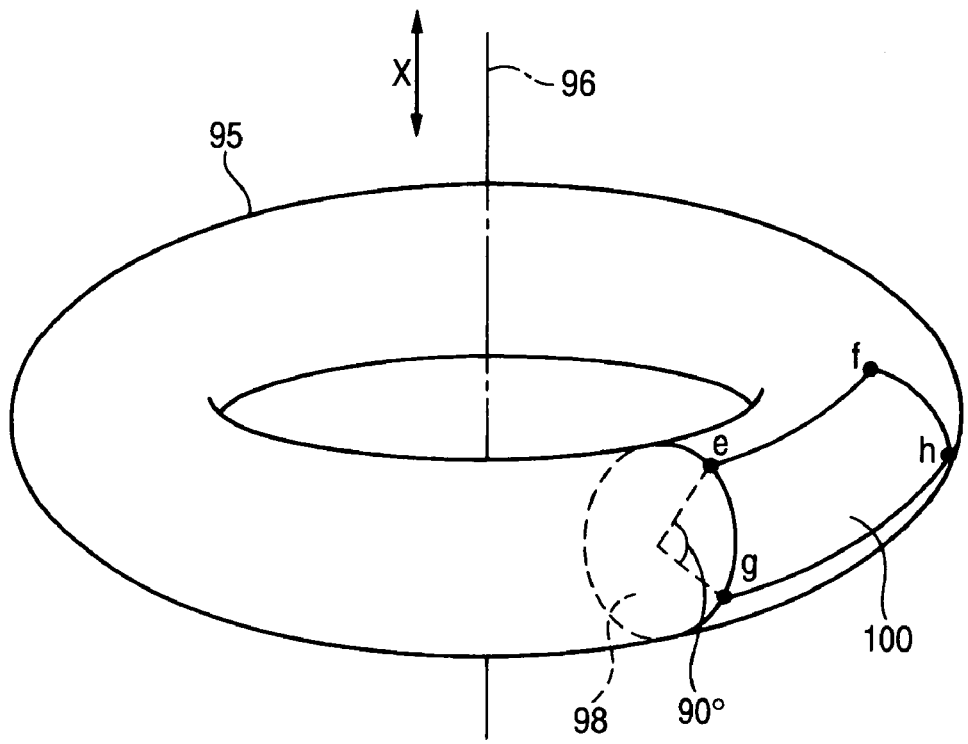
FIG. 4 is a perspective view showing an example torus.

For instance, the mutually-opposing surfaces 33 of the respective deflection electrodes 32 constituting the deflection electrode 30 shown in FIGS. 1 through 3 each assume a shape identical with or generally agreeing with the shape of a curved surface 100. Here, the curved surface 100 is defined by points "e", "f", "g", and "h". The points "e", "f", "g", and "h" are determined by means of circumferentially cutting a torus 95 such as that shown in FIG. 4 through a predetermined angle centered on a torus center axis 96 which passes through the scan center P and is parallel to the X axis, and cutting an outer periphery of a longitudinal cross-sectional surface (i.e., a poloidal cross-sectional surface) 98 of the torus 95 through only 90°.

An electric field directed toward an inner deflection electrode 32 from an outer deflection electrode 32 is formed between the pair of deflection electrodes 32 constituting the electrostatic deflector 30. A d.c. deflection voltage for deflecting the ion beam 4 in the manner as mentioned previously is applied from the deflection power source.

In this case, the deflection power source is one which simply applies a deflection voltage which is higher than that applied to the inner deflection electrode 32 to the outer deflection electrode 32. For instance, there may be employed a deflection power source which applies a ground potential to the inner deflection electrode 32 and a positive deflection voltage to the outer deflection electrode 32. As in the case of the present embodiment, deflection power sources 40*a*, 40*b* which apply deflection voltages $+V_D$, $-V_D$ (having the same absolute value but opposite polarities), the voltages being symmetrical with respect to the ground potential, are preferably provided on the outer and inner deflection electrodes 32.

As such, the potential of an intermediate location between the mutually-opposing surfaces 33 of the deflection electrodes 32 assumes the ground potential. Consequently, the ion beam 4*a* of desired energy passes through the neighborhood of the ground potential area in the electrostatic deflector 30. Therefore, the ion beam 4*a* is not accelerated or decelerated in the electrostatic deflector 30. Further, a device disposed directly upstream of a electrostatic deflector 30 and that disposed at right downstream of the same usually remain at the ground potential. Therefore, the exit electrode 24 disposed at the exit of the previously-described acceleration/deceleration device 22 remains at the ground potential, and a holder 52 and a beam mask 46 to be described later also remain at the ground potential. Therefore, the ion beams 4, 4a are neither accelerated nor decelerated before and after the electrostatic deflector 30. Accordingly, the energy of the ion beam remains unchanged even after the ion beam has passed through the electrostatic deflector 30.

According to this ion beam apparatus, the ion beam 4 scanned by the scanner 12 is injected into the electrostatic deflector 30 while being spread in the shape of a sector.

The ion beam 4a of desired energy in the ion beam 4, which has been injected into the electrostatic deflector 30, is electrostatically deflected through 90° so as to proceed in the direction perpendicular to the scan surface 13 in the circular-arc-shaped deflection zone 34 centered on the scan center P. Thus, the ion beam 4a is ejected (output) from the electrostatic deflector 30.

Figure 9:
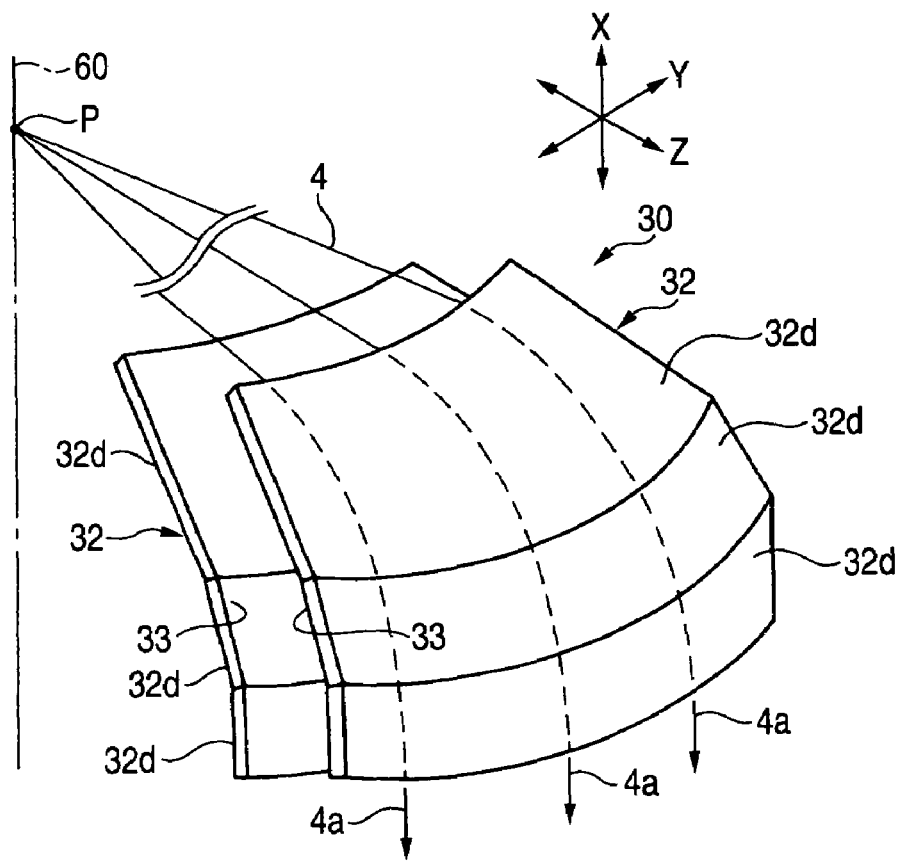
FIG. 9 is a cross-sectional view showing yet another example of the electrostatic deflector.
Figure 11:
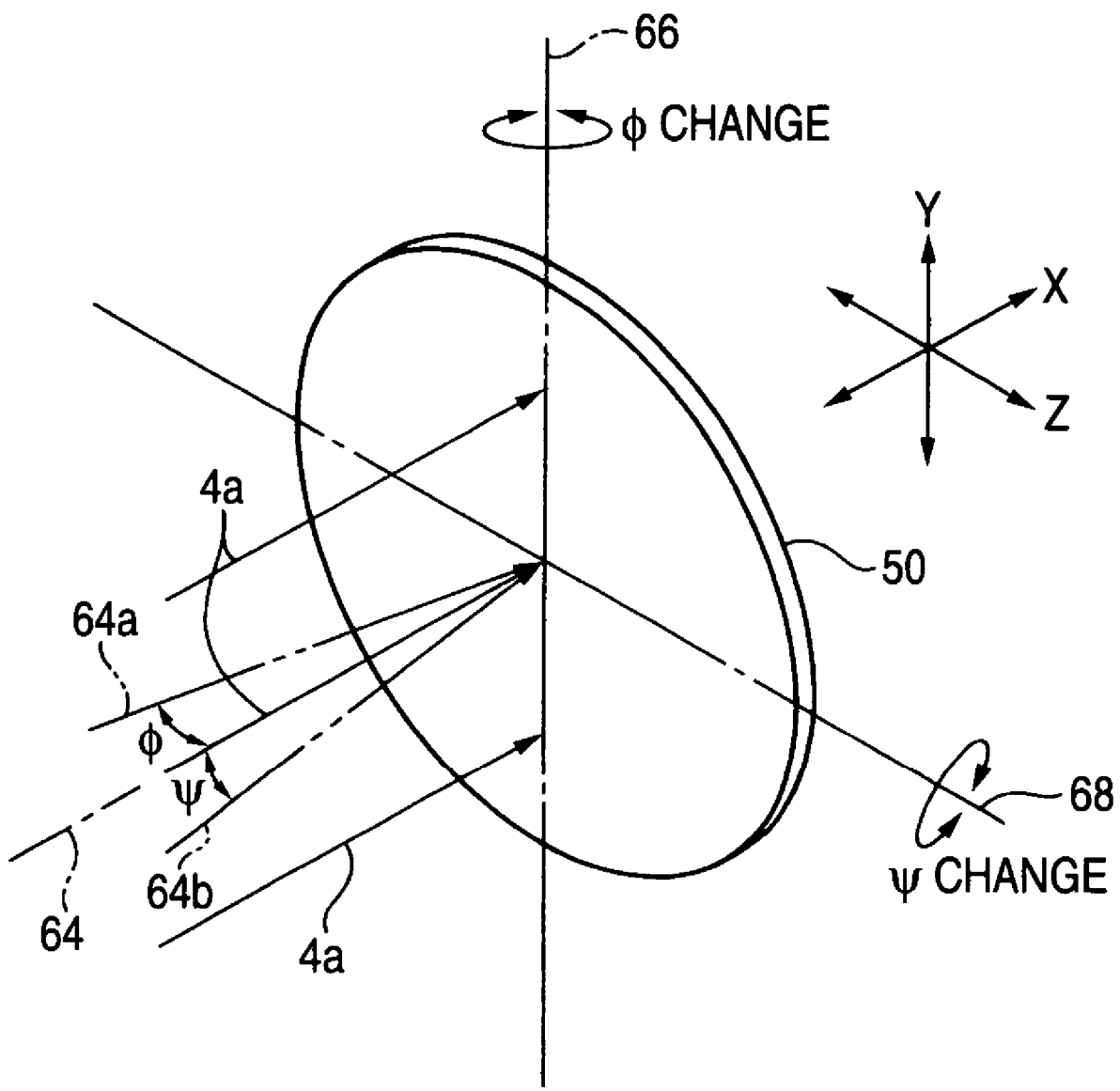
FIG. 11 is a perspective view showing first and second angles at which the ion beam falls on the target for implantation.
Figure 17:
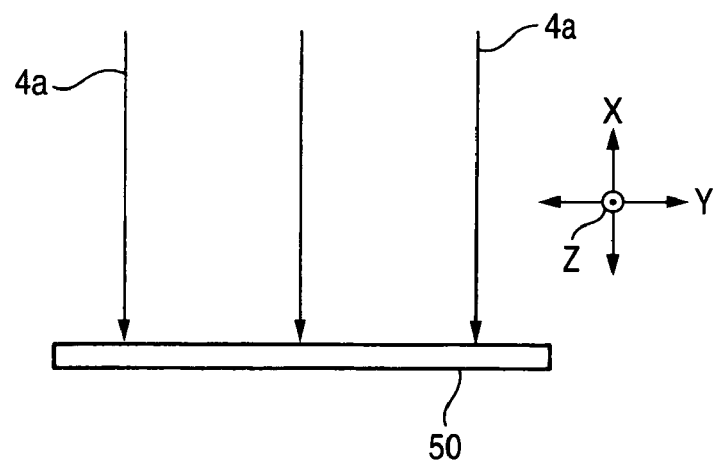
FIG. 17A is a schematic view showing an example of a paralleled beam parallel to an X axis, injected into the target.
FIG. 17B is a schematic view showing an example in which the beam has spread from the direction parallel to the X axis, injected into the target.
FIG. 17C is a schematic view showing an example in which the beam has become narrower than the direction parallel to the X axis, injected into the target.
Figure 17:
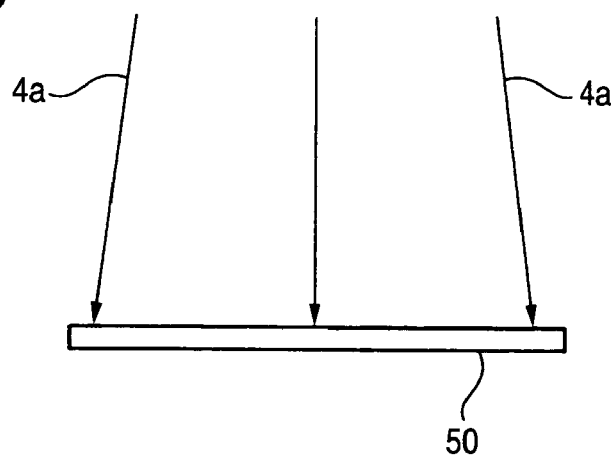
Figure 17:
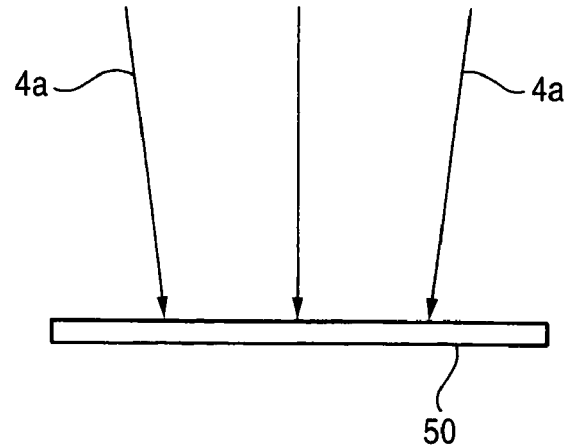

Respective ion beams 4a constituting the ion beam 4a of desired energy ejected from the electrostatic deflector 30 in this manner are parallel to each other. In the present embodiment, the ion beams 4a are parallel to each other while being parallel to the X axis. The state of the ion beams 4a is shown in FIGS. 9, 11, and 17A. Since a plurality of normals standing on one plane are parallel to each other, the ion beams 4a injected at right angles to one scanning surface 13 are parallel to each other, regardless of the scanning position. Thus, the ion beams 4a ejected from the electrostatic deflector 30 can be paralleled.

Ions 4b of undesired energy in the ion beam 4 that has injected into the electrostatic deflector 30 differ from the ion beams 4a of desired energy in terms of a deflection radius (turning radius). Hence, as shown in FIG. 1, the ions 4b are separated from the ion beams 4a of desired energy. In this way, the energy contaminants can be eliminated; namely, energy separation can be performed.

Further, the direction in which the ion beam 4 is deflected by the electrostatic deflector 30 is a direction perpendicular to the direction in which the ion beam 4 is scanned by the scanner 12 for scanning. In contrast with the technique described in Patent Document 3, ion beams—which have different energy levels and have been spread through scanning action of the scanner 12—are not separated from each other within a single plane but are separated within different planes. Separation of ions of different energy levels is simple, and hence an energy separation function is very strong. In addition, the angle through which the ion beams 4a are deflected by the electrostatic deflector 30 is as large as 90°. Even in this regard, separation of the ions having different energy levels is easy, and hence the energy separation function is extremely strong. As a result of combination of these features, the energy separation function of the electrostatic deflector 30 is extremely strong.

In contrast with the case of a deflection electromagnet, in the case of the electrostatic deflector 30, an increase in the deflection angle can be achieved with comparative simplicity by means of bending the electrostatic deflector 30 or a like method. Moreover, the deflection angle does not depend on the mass "m" of ions constituting the ion beam, and the ions of mass "m" are deflected easily. Even when the deflection angle is increased to 90°, occurrence of the problem of the deflection electromagnet becoming huge, which is described in Patent Document 3, can be prevented.

The reason why the deflection angle of the electrostatic deflector 30 does not depend on the mass "m" of ions is now described. In general, the deflection angle Θ achieved through electrostatic deflection involving use of deflection electrodes of parallel plane type can be expressed by the following equation, provided that energy of an incident ion beam is taken as $E_B$; electric charges of ions constituting the ion beam are taken as "q"; a deflection voltage applied between deflection electrodes is taken as V; and the length of a deflection path is taken as L.

$$\tan \Theta = kVLq/E_B \text{ ("k" designates a constant which does not depend on the mass of ions)} \quad \text{[Equation 2]}$$

When electrostatic deflection which causes a deflection locus of an ion beam to describe a circle is effected through use of cylindrical deflection electrodes, Equation 2 is expressed while tan Θ in Equation 2 is replaced with Θ (radian).

As is evident from the foregoing equation, the deflection angle Θ stemming from electrostatic deflection does not depend on the mass "m" of ions constituting the ion beam, in contrast with the deflection of a magnetic field (see Equation 1). The same also applies to the case of the electrostatic deflector 30. Accordingly, when ions having a large mass "m" are subjected to energy separation, there is no necessity for increasing the deflection voltage V in accordance with the mass "m." Therefore, there does not arise a problem of requiring an extraordinarily increase in the capacity, power consumption, and dimensions of the deflection power source. When compared with the deflection electromagnet using the magnetic field, the electrostatic deflector 30 can achieve weight reduction, a decrease in power consumption, and cost reduction.

As mentioned above, according to this ion beam apparatus, parallelism of the ion beam 4 and energy separation can be achieved through use of one electrostatic deflector 30. Hence, when compared with the case where parallelism of the ion beam and energy separation are performed through use of different functional elements as in the case of the techniques described in Patent Document 1 or 2, the length of a beam line of the ion beam 4 can be shortened.

Since the energy separation function of the electrostatic deflector 30 is considerably strong as mentioned previously, the length from the exit of the electrostatic deflector 30 to the target 50 can be significantly shortened as compared with the case of the technique described in Patent Document 3. From this viewpoint as well, the length of the beam line of the ion beam 4 can be shortened.

According to the technique described in Patent Document 1, a beam mask, which permits passage of the ion beam of desired energy and hinders passage of ions of undesired energy, is disposed at a location spaced considerably far from the exit of the electrostatic deflector in order to enhance the energy separation function. In contrast, even when the ion beam apparatus of the present invention is equipped with the beam mask having the same objective and operation as those of the beam mask, the beam mask can be disposed in the vicinity of the exit of the electrostatic deflector 30. The beam mask 46 shown in FIG. 1 is one example of such a beam mask. As mentioned previously, this is because the energy separation function of the electrostatic deflector 30 is extremely strong. Therefore, even when the beam mask 46 is disposed, the distance from the electrostatic deflector 30 to the beam mask 46 can still be shortened considerably, and hence the length of the beam line can be shortened as well.

Figure 5:
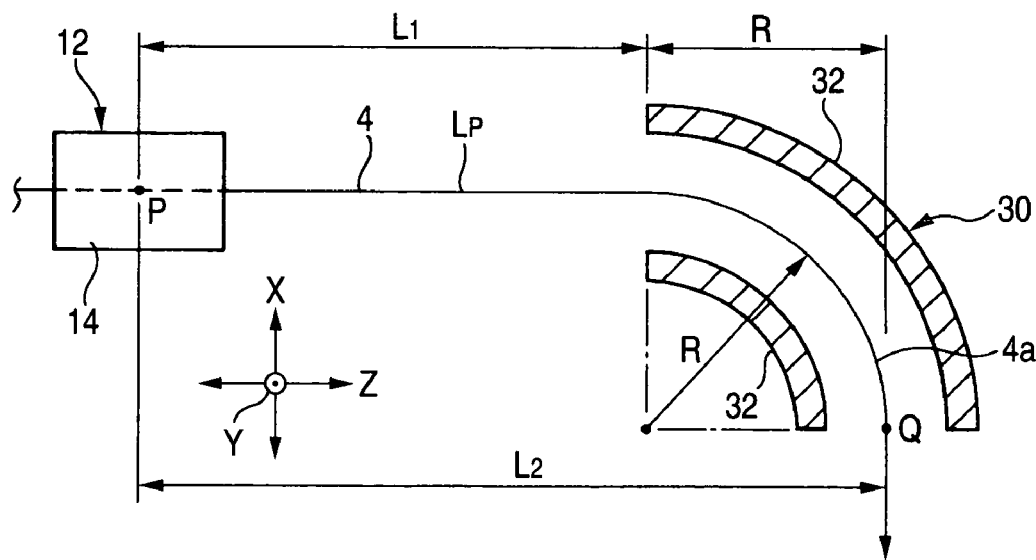
FIG. 5 is a view showing a positional relationship between a scanner and the electrostatic deflector, both being shown in FIG. 1.

Referring to FIG. 5, the ion beam apparatus can comparatively shorten a distance $L_1$ from the scan center P to the entrance of the electrostatic deflector 30. An object to be compared with the ion beam apparatus is a technique which is described in the following publication issued in 1992 and electrostatically parallels ion beams.

Ion Implantation Technique—92 (ION IMPLANTATION TECHNOLOGY-92), A. M. Ray et al, Overview of the Eaton NV-8200P, pp. 401 to 404.

According to the technique described in the publication, the width over which the ion beam is to be scanned must be equal to the diameter of a target on which ions are to be implanted at the entrance of a plurality of electrodes to be used for paralleling scanned ion beams. In contrast, the only requirement to be fulfilled by the ion beam apparatus of the present invention is that the width over which the ion beam 4a is to be scanned assumes a value corresponding to the diameter of the target 50 at the exit of the electrostatic deflector 30 for paralleling the ion beam 4 or the like. If the two techniques are compared with each other on the assumption that a single scan angle of the ion beam is employed, the ion beam apparatus of the present invention can obviously shorten the length $L_1$ to a greater extent than that achieved under the technique described in the publication.

Referring to FIG. 5, in the ion beam apparatus of the present invention, the length $L_p$ of the beam line from the scan center P to an exit Q of the electrostatic deflector 30 is expressed by the following equation, provided that the scan angle of the scanner 12 is taken as $\pm\theta$, an effective deflection radius of the electrostatic deflector 30 is taken as R, and the diameter of the target 50 is taken as D. FIG. 5 shows the scanner 12 and the electrostatic deflector 30, both being shown in FIG. 1, in an extracted and enlarged manner.

$$L_p = L_1 + \pi R/2 \qquad \text{[Equation 3]}$$
$$= L_2 - R + \pi R/2$$
$$= D/(2\tan\theta) - R + \pi R/2$$
$$= D/(2\tan\theta) + (\pi/2 - 1)R$$

Provided that D=300 mm, $\theta=\pm15°$, and R=400 mm, the length of the beam line $L_p$ is derived from the above equation; that is, $L_p \approx 788$ mm.

As mentioned above, even when compared with the known technique, this ion beam apparatus can shorten the length of the beam line of the ion beam 4. Consequently, for instance, it becomes possible to improve the transport efficiency of a beam by means of reducing a loss due to dispersion of the ion beam 4 or the like and to ensure a large amount of beam. This effect becomes particularly noticeable when the ion beam 4 of low energy is transported.

Since the length of the beam line can be shortened, the overall system can be made compact.

In stages subsequent to the scanner 12, the symmetry of direction of a scan angle of the ion beam 4 is maintained. Hence, the equipment in the stages subsequent to the scanner 12 is of simple configuration. Further, a characteristic of the ion beam 4 is uniform with reference to the direction of the scan angle. Reasons for the former advantage are attributable to easiness of design, processing, and arrangement of equipment having symmetry. Reasons for the latter advantage are attributable to the fact that, for instance, the cross-sectional profile or the like of the spot-like ion beam 4 remains unchanged in the direction of a scan angle.

Figure 6:
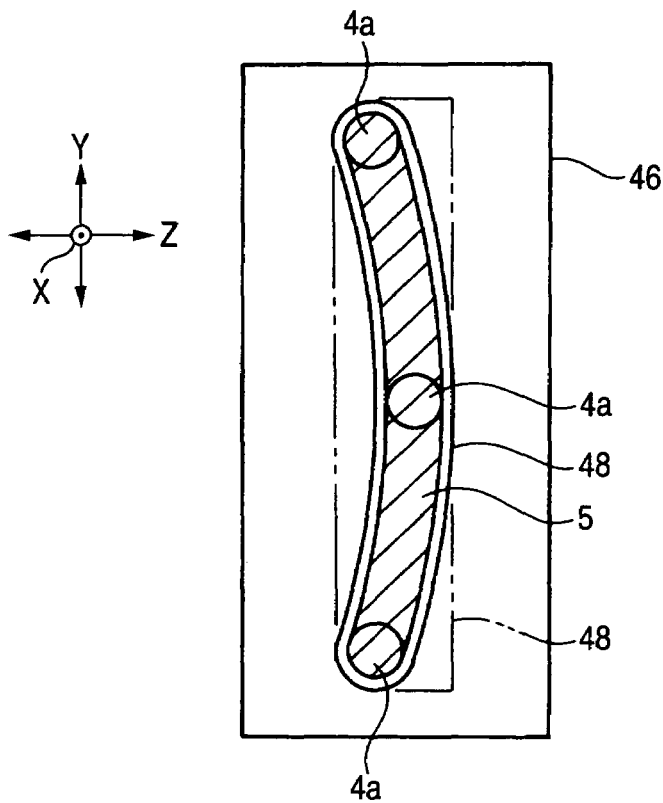
FIG. 6 is a front view showing an example beam mask shown in FIG. 1.
Figure 14:
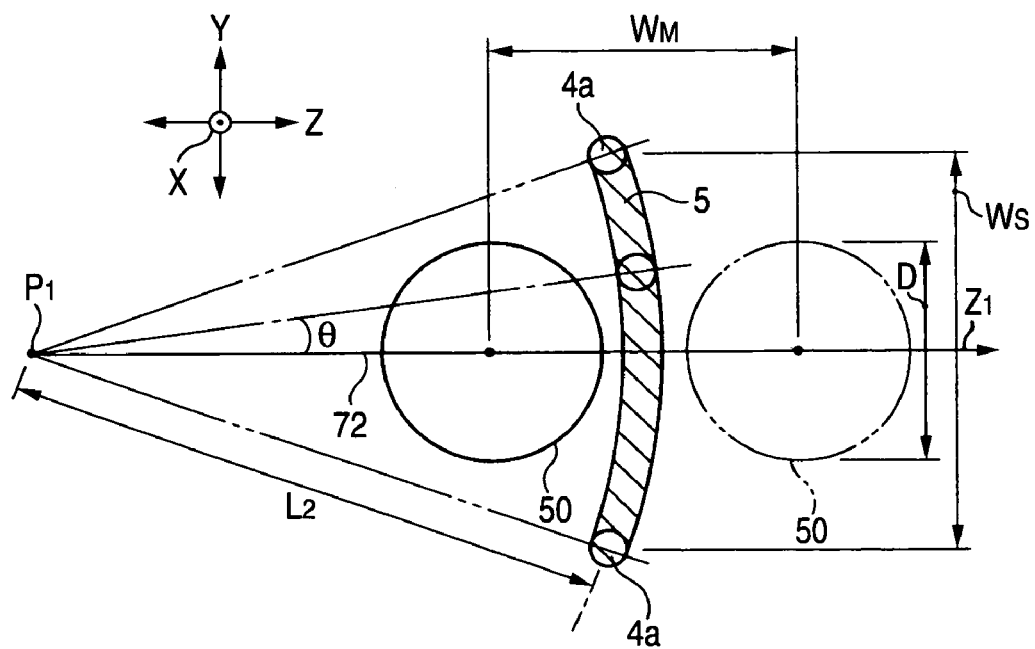
FIG. 14 is a view showing an example relative relationship between an arc-shaped scanned beam cross section of the ion beam ejected from the electrostatic deflector and motion of the target.

The shape of the scanning beam cross section 5 taken in the direction perpendicular to the traveling direction of the ion beam 4a ejected from the electrostatic deflector 30; that is, the shape of the scanning beam cross section 5 taken along line the Y-Z plane, assumes the shape of an arc, as shown in FIGS. 2, 6, and 14. More specifically, the cross section 5 of the scanning beam assumes the shape of an arc centered on a point P1 (see FIG. 14) obtained as a result of the scan center P being projected on a plane parallel to the Y-Z plane. In the respective drawings, some of spot-like cross sections of the ion beams 4a scanned are illustrated as small circles. The entire cross section of the ion beam 4a scanned corresponds to the scanned beam cross section 5.

Accordingly, when the beam mask 46 is provided, the shape of a hole 48 through which the beam passes (i.e., a beam passage hole) is preferably made similar or essentially similar in shape to the arc-shaped (e.g., a circular-arc-shaped) scanned beam cross section 5, as indicated by a solid line in FIG. 6. Moreover, the beam passage hole 48 is preferably made slightly larger than the scanned beam cross section 5. As such, the electrostatic deflector 30 operates in conjunction with the beam mask 46, thereby enhancing the performance of energy separation to a much greater extent. Moreover, the electrostatic deflector 30 is efficiently prevented from being affected by a gas having escaped from the target 50 (through degassing or outgassing) during ion implantation (i.e., deterioration of degree of a vacuum), thereby more efficiently preventing occurrence of unstable operation of the electrostatic deflector 30, which would otherwise be caused as a result of an electric discharge developing between the deflection electrodes 32.

As mentioned previously, the energy separation performance of the electrostatic deflector 30 is extremely high. Hence, the shape of the beam passage hole 48 to be formed in the beam mask 46 may be set to a rectangular-parallelepiped shape including the arc-shaped scanned beam cross section 5 as indicated by dotted lines in FIG. 6. As such, the shape of the beam passage hole 48 becomes simple.

The inside of the electrostatic deflector 30; that is, the deflection zone 34, is preferably maintained in a high vacuum in order to prevent the ion beams 4, 4a from colliding with molecules and particles in the atmosphere or causing an electrical discharge or the like. Provision of an evacuator capable of sufficiently evacuating the deflection zone 34 is preferable. Evacuation of the deflection zone 34 is preferably performed in the direction perpendicular to the traveling direction of the ion beam 4a, as indicated by an arrow 80 or 82 in FIG. 3. As such, even when a bend exists in the deflection zone 34, the bend induces a small chance of occurrence of a drop in conductance of evacuation. Therefore, the deflection zone 34 can be evacuated efficiently.

The only requirements imposed on the electrostatic deflector 30 are that the mutually-opposing surfaces 33 of the pair of deflection electrodes 32 maintain symmetry with respect to the direction of the scan angle of the ion beam 4, as mentioned previously; and that deflection is effected through an angle of 90°. Therefore, if these requirements are satisfied, the shapes of the deflection electrodes 32, more specifically, the shapes of the mutually-opposing surfaces 33, may be embodied as shapes other than those mentioned previously; for instance, the surfaces being separated along the traveling direction of the ion beam 4a; the surfaces being formed by combining a plurality of curved surfaces; or the surfaces being formed by combining a plurality of planes and curved surfaces.

Figure 7:
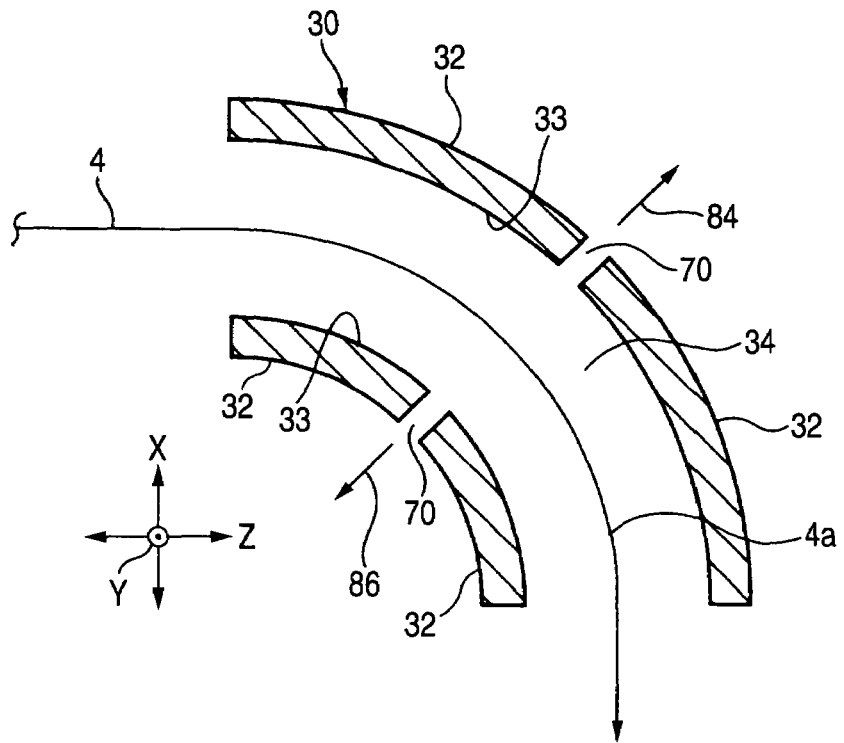
FIG. 7 is a cross-sectional view showing another example of the electrostatic deflector.

For instance, FIG. 7 shows an example in which the deflection electrodes 32 shown in FIGS. 1 through 3 are each divided into two segments by means of forming a gap 70 in each of the deflection electrodes 32 in the direction in which the deflection angle increases. The deflection electrodes 32 may be divided into a larger number of segments. Alternatively, one of the deflection electrodes 32 may be solely divided. As such, as indicated by an arrow 84 or 86, the inside of the electrostatic deflector 30; that is, the deflection zone 34, can be efficiently evacuated by way of the gap 70. The reason for this is that, even when the deflection zone 34 is bent as mentioned previously, the bend does not cause a reduction in conductance of evacuation.

Figure 8:
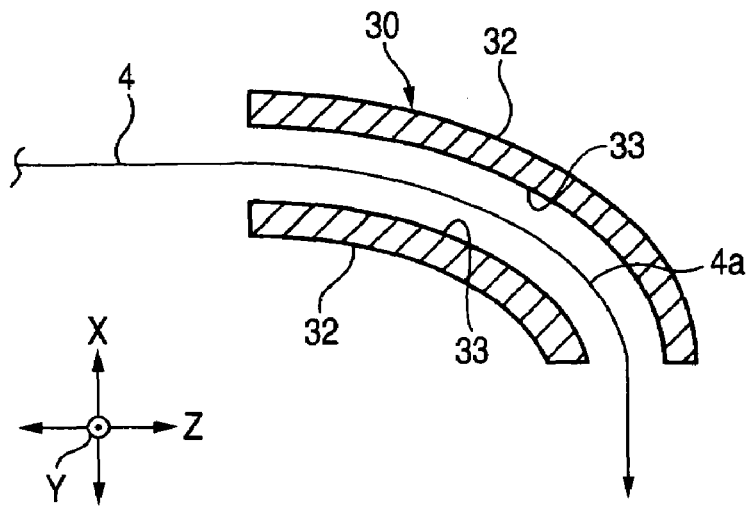
FIG. 8 is a cross-sectional view showing still another example of the electrostatic deflector.

FIG. 8 shows an example in which the cross-sectional profiles of the mutually-opposing surfaces 33 of the respective deflection electrodes 32 are formed into ovals. In this example, the ovals each have the major axis along the direction of the Z axis. However, the ovals may have the major axis along the direction of the X axis.

Figure 10:
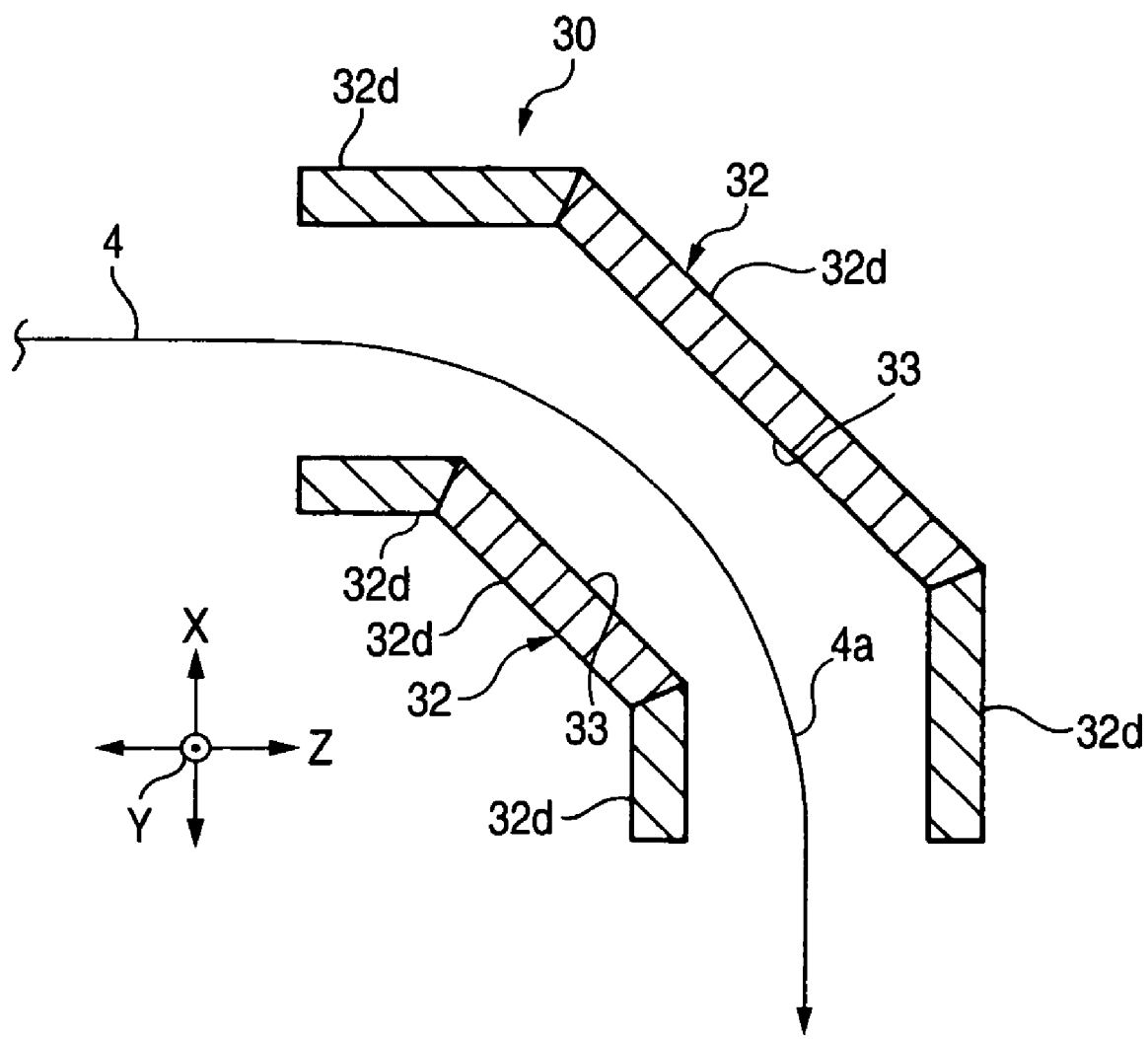
FIG. 10 is a cross-sectional view showing an example of the electrostatic deflector analogous to the electrostatic deflector shown in FIG. 9.

FIG. 9 shows an example in which each of the deflection electrodes 32 is constituted by combining (connecting) together a plurality of deflection electrode pieces 32a (e.g., three pieces in the illustrated example). Specifically, the mutually-opposing surfaces 33 of the respective deflection electrodes 32 are formed by combination (connection) of a plurality of surfaces (three surfaces in the illustrated example) aligned with the surface of revolution centered on the axis 60 that is identical with that shown in FIG. 3. The mutually-opposing surfaces assume cross sections substantially identical with those shown in FIG. 10. Each of the deflection electrode pieces 32a and the mutually-opposing surfaces 33 are constituted of a section of a cone whose center is aligned with the axis 60.

In any of the examples, at least the mutually-opposing surfaces 33 of the respective deflection electrodes 32 are preferably formed from carbon, silicon, aluminum, or compounds thereof. For instance, the deflection electrodes 32 themselves may be formed from these materials, or the mutually-opposing surfaces 33 of the deflection electrodes 32 may be coated with a film of these materials.

The ions 4b of undesired energy (see FIG. 1) may collide with the mutually-opposing surfaces 33, and the surfaces may be sputtered eventually. Specifically, sputter particles including substances constituting the mutually-opposing surfaces 33 may be ejected from the mutually-opposing surfaces 33. Therefore, if the mutually-opposing surfaces 33 have been formed from the materials such as those mentioned above, the sputter particles may accidentally arrive at the target 50, and an influence imposed on characteristics of a semiconductor device to be fabricated on the surface of the target 50 may be small.

However, as is evident from previously-described Equation 2, the deflection angle of the ion beam 4 in the electrostatic deflector 30 does not depend on the mass "m" of the ions constituting the ion beam 4. Hence, ions which may differ in mass "m" from the ions but have the same value of $q/E_B$ ($E_B$ designates energy, and "q" designates electric charges) move along the same orbit. The ions having different masses "m" are usually caused to pass through a mass separation electromagnet 6 before being injected into the scanner 12, whereby the ion beam 4 consisting of only ions having a desired mass "m" is obtained. However, in some cases, for instance, ions containing many hydrogen atoms or ions having isotopes are implanted on the target 50. In such a case, useful (desired) ions whose masses "m" are slightly different exist in a plurality of types of ion beams 4.

These ions may be, e.g., $B_2H_x^+$ (x=1, 2, 3, 4, 5, 6), $B_{10}H_y^+$ (y=1, 2, ..., 14), and $Sb_z^+$ (z=121, 123).

When implantation is desired to be performed with the largest possible amount of ion beams through use of these ions, the mass resolving power of the mass separation electromagnet 6 is intentionally decreased. As a result, the ions such as those mentioned above can be output and caused to be injected into the scanner 12. The ions are caused to pass through the scanner 12 of electrostatic scan type and the electrostatic deflector 30 and then output. The thus-output ions can be used as the ion beams 4a to be used for implanting ions into the target 50. As mentioned previously, even when the ions have different masses "m," a difference due to a difference in mass does not arise in the orbits of the ions during electrostatic scanning or electrostatic deflection. The ions are implanted in completely the same manner in terms of an area on the target 50 scanned by a beam and an angle at which the ions is injected into the target 50.

In relation to the deflection electromagnet for paralleling an ion beam described in Patent Documents 2 and 3, when the ion beam is deflected by means of the magnetic field, a position on the target to be scanned by the ion beam and an angle at which the ion beam is implanted into the target are dependent on the mass "m" of ions. In relation to ions having different masses "m," the position and the angle assume different values. Therefore, nonuniformity arises in the quantity of ions to be implanted and the angle at which ions are to be implanted within the plane of the target 50. A chance of occurrence of variations or deterioration in the characteristics of a semiconductor device fabricated by ion implantation cannot be denied.

In relation to the scanner 12, the scanner 12 of magnetic field scan type which scans the ion beam 4 by means of a magnetic field may also be employed, so long as a limitation on utilization of ions having slight different masses is tolerated or an appropriate width for scanning is set.

Next, in order to prepare for the following descriptions, an angle at which the ion beam 4a is injected into the surface of the target 50; that is, an implantation angle, will now be described. There are employed two types of implantation angles, which are now described by reference to FIG. 11. An illustrated example is for a case where a first implantation angle $\phi$ and a second implantation angle $\psi$ assume 0°. When consideration is given of a case where a normal 64 stands on the surface of the target 50, the first implantation angle $\phi$ is an angle defined between the ion beam 4a and the normal 64 in the direction orthogonal to the direction in which the ion beam 4a is scanned. The ion beam 4a is scanned in the direction aligned with the Y axis. Hence, when the target 50 or the ion beam 4a is rotated relatively around an axis 66 parallel to the Y axis, the implantation angle $\phi$ changes. A normal 64a is an example for a case where the implantation angle $\phi$ assumes any value other than 0°.

The second implantation angle $\psi$ is an angle defined between the ion beam 4a and the normal 64 in the direction in which the ion beam 4a is scanned. When the target 50 or the ion beam 4a is rotated relatively around an axis 68 parallel to the Z axis orthogonal to the Y axis, the implantation angle $\psi$ changes. A normal 64b is an example of a case where the implantation angle $\psi$ assumes any value other than 0°.

Figure 12:
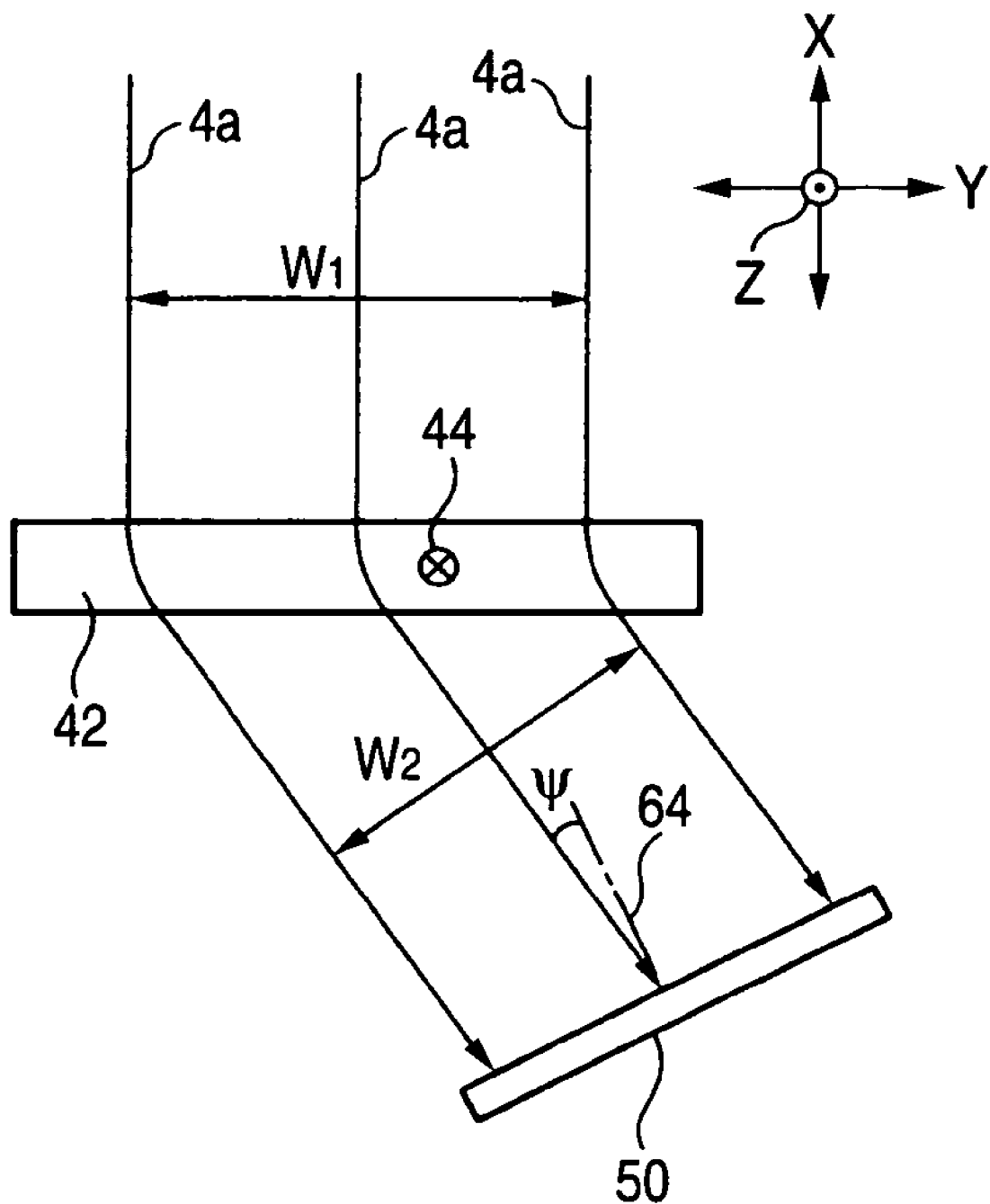
FIG. 12 is a view showing an example of the deflection electromagnet shown in FIG. 1 when viewed in the direction of a magnetic field 44.
Figure 13:
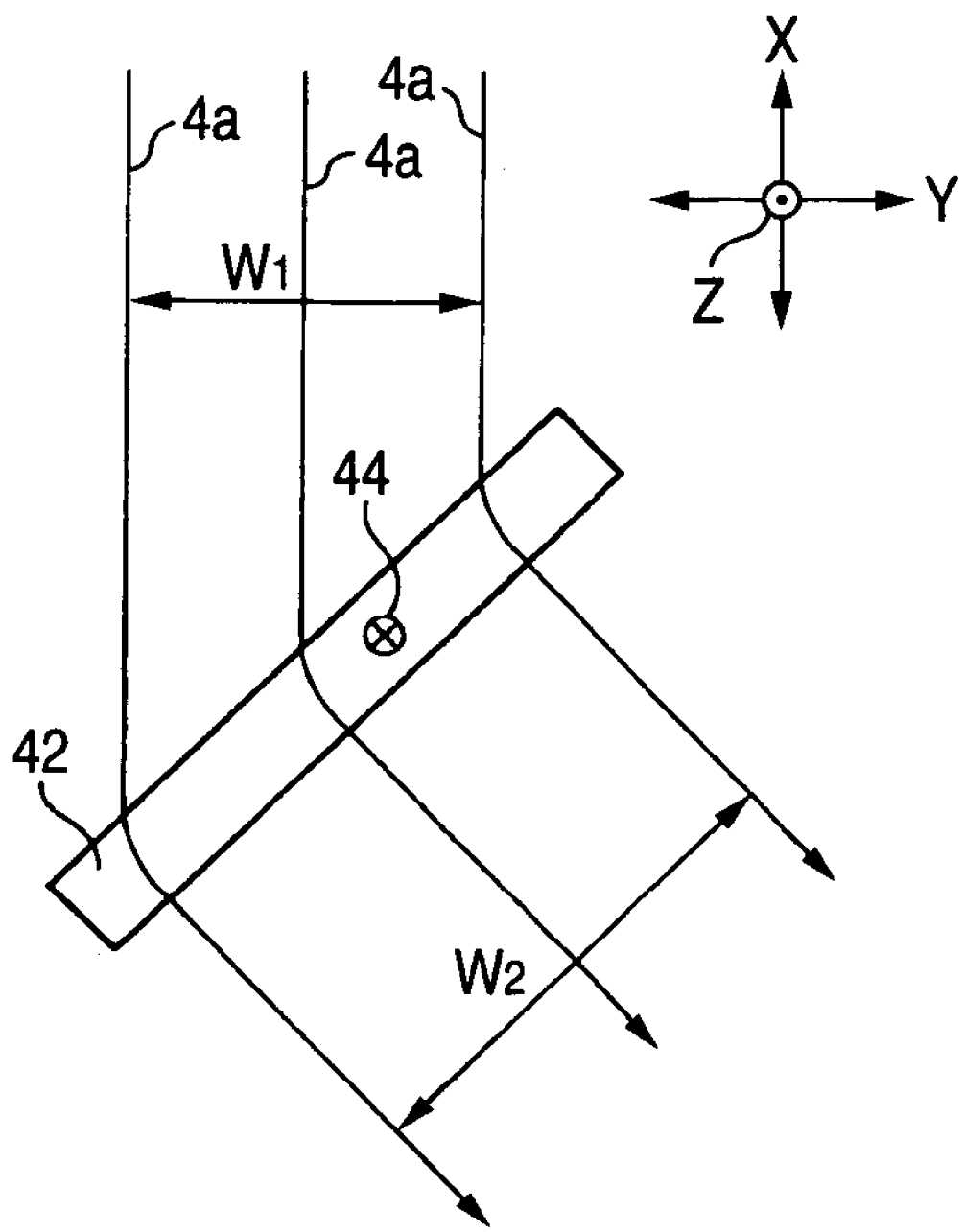
FIG. 13 is a view showing another example of the deflection electromagnet shown in FIG. 1 when viewed in the direction of the magnetic field 44.

As in the case of the embodiment shown in FIG. 1, a deflection electromagnet 42 for deflecting the ion beam 4a by means of a magnetic field 44 may be interposed between the electrostatic deflector 30 and the target 50. The deflection electromagnet 42 possesses magnetic polarities which mutually oppose with the path of the ion beam 4a sandwiched therebetween. FIGS. 12 and 13 show an example plane when viewed in the direction in which the magnetic field 44 travels.

The ion beam 4a has already been paralleled at the end of the entrance of the deflection electromagnet 42 and has become an essentially-shape-like ion beam substantially in parallel to the X-Y plane. The ion beam 4a is preferably deflected by the deflection electromagnet 42 within a plane substantially identical with the sheet surface, and all the ion beams 4a scanned are preferably deflected at the same angle. The surface of the magnetic pole of such a deflection electromagnet 42 assumes a generally rectangular shape.

As a result of provision of such a deflection electromagnet 42, there can be performed, e.g., (a) adjustment of the second implantation angle ψ (see FIG. 12); (b) enlargement (see FIG. 13) or reduction (see FIG. 12) of the scan width W of the ion beam 4a; or (c) prevention of migration of electrons in the ion beam 4a, or migration of ions in ion beams other than the ion beam 4a, between the neighborhood of the target 50 and the electrostatic deflector 30.

An explanation is now given of (a) adjustment of the implantation angle ψ. For instance, if the accuracy of mechanical assembly of the ion beam apparatus is insufficient and the ion beam apparatus is originally assembled with the target 50 being oriented in an improper direction, the implantation angle ψ can be readily adjusted to a reference value (usually 0°) by the deflection electromagnet 42.

An explanation is now given of (b) adjustment of the scan width W. If setting the scan width of the incident ion beam 4a to $W_1$ and setting the scan width of the outgoing ion beam 4a to $W_2$ are effected by means of appropriately setting the arrangement of the deflection electromagnet 42 and the angle at which the ion beam 4a is deflected by the deflection electromagnet 42, the scan widths can be enlarged to $W_1 < W_2$ as in the case shown in FIG. 13. As in the case of the example shown in FIG. 12, the scan widths can be reduced to $W_1 > W_2$. When enlargement of the scan width W is taken as an example, the scan width can be readily changed in accordance with an increase or decrease in the dimension of the target 50 without making a change to the ion beam apparatus other than the deflection electromagnet 42.

Operation of preventing action (c) will now be described. If electrons or ions other than the ion beams 4a migrate between the target 50 and the electrostatic deflector 30, an error will arise in measurement of the quantity of ion beam 4a; or there will arise a failure such as an increase in the extent to which the target 50 is contaminated with metal, or attachment of particles to the target 50. The energy of electrons or ions is sufficiently smaller than that of the ion beam 4a. Hence, the ions or electrons can be greatly separated from the ion beam 4a by means of greatly deflecting the electrons or ions with the small deflection electromagnetic field intensity of the deflection electromagnet 42. Hence, occurrence of the failures can be prevented.

As mentioned previously, the overall scanned beam cross section 5 of the ion beam 4a which has ejected from the electrostatic deflector 30 and scanned has a circular-arc shape. Refer to, e.g., FIG. 14. The target 50 is mechanically reciprocally moved (reciprocally actuated) from a center $P_1$ of the circular arc in a radial direction with respect to the scanned beam cross section 5. Thereby, the target 50 crosses (intersects) the ion beam 4a. As a result, the target can be implanted with ions by means of irradiating the ion beam 4a on the entire surface of the target. Here, FIG. 14 shows that the ion beam 4a ejected from the electrostatic deflector 30 is viewed in the same direction as in FIG. 2.

FIG. 14 shows that the ion beam 4a is injected toward the front in the direction perpendicular to the paper (i.e., the plane parallel to the Y-Z plane); that is, a case where the ion beam 4a is caused to be injected into the target 50 at right angles (i.e., when the implantation angles φ and ψ assume 0°). Therefore, the drawing shows an example in which the surface of the target 50 is parallel to the paper and in which the direction of reciprocation of the target 50 is also parallel to the paper. A relationship existing between the reciprocating direction of the target 50 and the scanning direction of the ion beam 4a is as follows.

The center of the target 50 runs through the center $P_1$ of the circular arc of the circular-arc-shaped scanned beam cross section 5, and the target 50 is reciprocally moved such that it is reciprocally actuated along a line 72 parallel to the Z axis. As a result of such reciprocal scanning operation, the target 50 having a diameter D is reciprocally moved such that the target 50 does not lie off the scan width $W_s$ in the direction parallel to the Y axis of the scanned beam cross section 5. A mechanical scan width of the target 50 is taken as $W_M$. A radius from the center $P_1$ to the center of the scanned beam cross section 5 is taken as $L_2$. The radius $L_2$ is equal to the distance $L_2$ shown in FIG. 5.

In relation to the configuration shown in FIG. 14, requirements to uniformly implant ions within the surface of the target 50 will now be considered. Provided that the angle at which the ion beam 4a is scanned is taken as θ, the position of the ion beam 4a in the direction parallel to the Y axis (i.e., a distance from the line 72) is $L_2 \sin θ$. Accordingly, a migration speed $V_Y$ of the ion beam 4a in the direction parallel to the Y axis is expressed by the following equation.

$$V_Y = L_2 \cdot \cos θ \cdot dθ/dt \qquad \text{[Equation 4]}$$
$$= L_2 \cdot \cos t θ \cdot ω \begin{pmatrix} ω \text{ designates an angular speed} \\ \text{of the ion beam scan} \end{pmatrix}$$

In the case of electrostatic scanning involving use of scan electrodes of parallel plane type (the same also applies to the scanner 12 shown in FIGS. 1 and 2), when scanning operation is performed with a rate of increase in scan voltage which is constant with time, the scan width "y" of the ion beam is expressed by the following equation and is proportional to time "t."

$$y = k \bullet \tan θ(t) = st \text{ (“k” and “s” designate constants, and “t” designates time)} \qquad \text{[Equation 5]}$$

Accordingly, the migration speed $v_y$ of the ion beam in the direction parallel to the Y axis when scanning is performed through use of only the scan electrodes of parallel plate type is expressed as $v_y = dy/dt = a$(constant). The following equation can be derived from Equation 5 along with the migration speed.

$$k \bullet \sec^2 θ(t) \bullet ω = dy/dt = s \text{ (constant)} \qquad \text{[Equation 6]}$$

A migration speed $v_y$ of the ion beam 4a in the direction parallel to the Y axis after the ion beam has exited from the electrostatic deflector 30 can be expressed as the following expression through use of Equations 4 and 6.

$$v_Y = L_2 \bullet \cos^3 θ(t) \bullet s/k \qquad \text{[Equation 7]}$$

The migration speed $v_Y$ expressed by Equation 7 is not a value which is constant over time. Specifically, when tan θ is proportional to time, the position of the ion beam 4a injected in the direction parallel to the Y axis does not become constant, and the migration speed Yv of the ion beam 4a in the direction parallel to the Y axis does not become constant. Conversely, to make the migration speed $y_Y$ constant, the only requirement is to set sin θ=ct ("c" is a constant, and "t" is time). If this relationship is expressed through use of tan θ, the following expression will be taken.

$$\tan θ = \sin θ/(1 - \sin^2 θ)^{1/2} = ct/(1 - c^2 t^2)^{1/2} \qquad \text{[Equation 8]}$$

Here, tan θ is proportional to the scan voltage Vs applied between the scan electrodes 14 of parallel plate type such as those shown in FIGS. 1 and 2. Eventually, it is understood that the scan voltage $V_s$ is to be changed over time as expressed by the following equation.

$$Vs=ct/(1-c^2t^2)^{1/2}\text{ ("}c\text{" is a constant, and "}t\text{" is time).}\quad\text{[Equation 9]}$$

Figure 15:
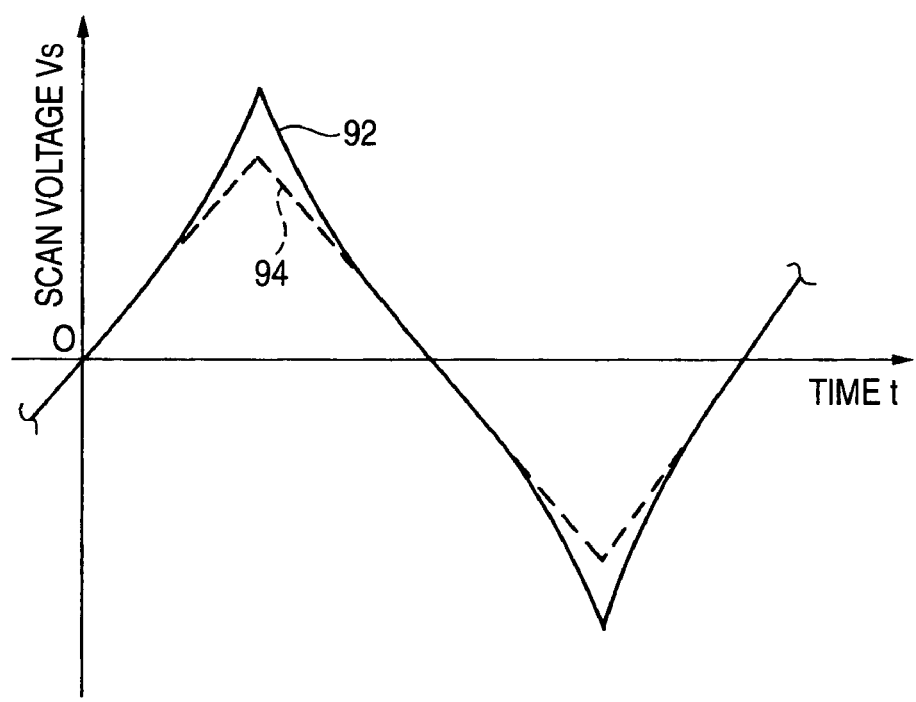
FIG. 15 is a view showing an example scan voltage waveform.

The manner of chronological changes in the scan voltage Vs, that is, a waveform, is indicated by a solid line 92 shown in FIG. 15. The diagrams shows the changes in an exaggerated manner. For reference, a mere triangular waveform is indicated by broken lines 94.

Therefore, the scan voltage Vs represented by Equation 9 is applied from the scan power source 16 between the pair of parallel scan electrodes 14 constituting the scanner 12. As a result, the speed at which a line in the scanning direction of the ion beam 4a ejected from the electrostatic deflector 30 is scanned; that is, the scan speed in the direction parallel to the Y axis, becomes constant.

In conjunction with the scan speed being made constant, the target 50 is mechanically, reciprocally moved at a given scan speed in the direction parallel to the Z axis by means of the scanning mechanism 54, and as a result the uniform distribution of amount of implanted ions can be obtained over the entire surface of the target 50.

Figure 16:
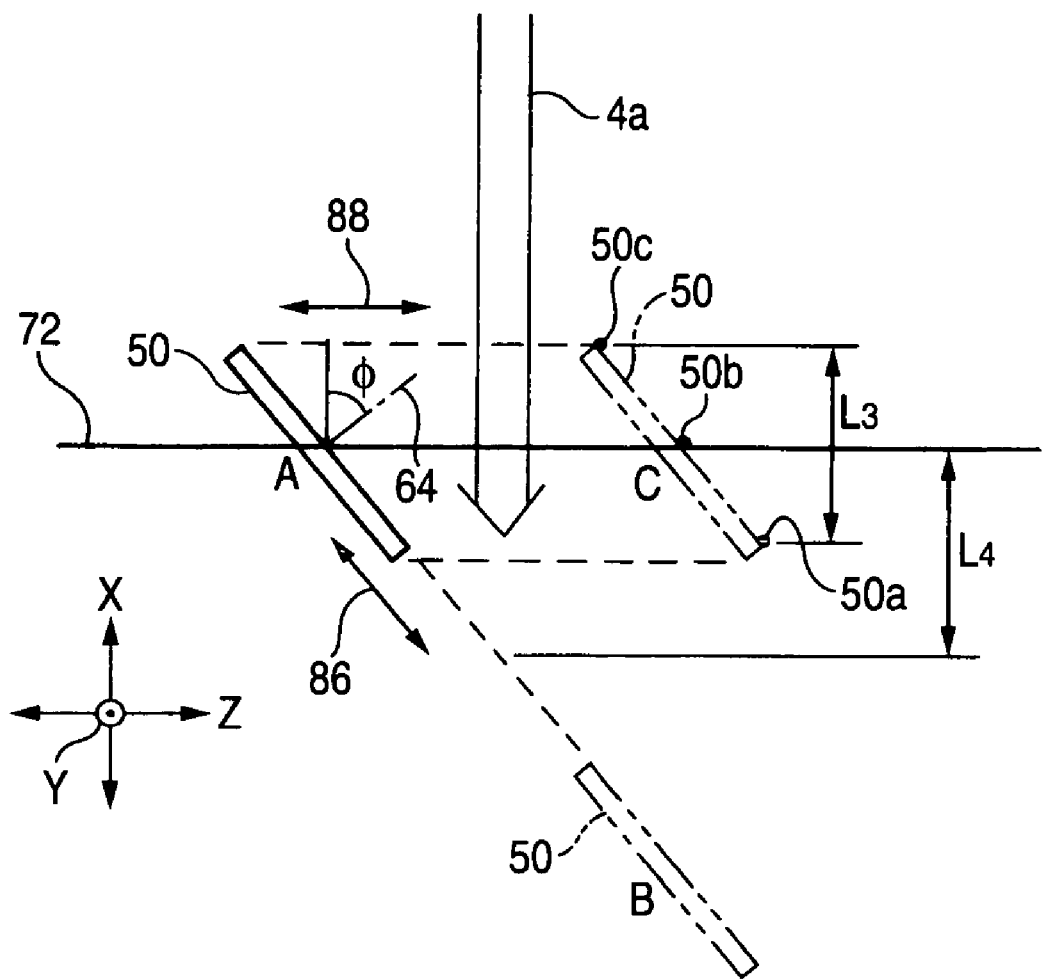
FIG. 16 is a view showing an example relative relationship between the ion beam ejected from the electrostatic deflector and the motion of the target when an implantation angle $\phi$ is not 0 degree.

The foregoing descriptions are directed toward a case where the first implantation angle φ and the second implantation angle ψ are 0 degrees (i.e., when a vertical beam falls on the target). FIG. 16 shows an example where the first implantation angle φ is not 0 degrees (i.e., when the beam falls on the target at an angle). This drawing shows surroundings of the target 50 when viewed in the same direction as in FIG. 1. In FIG. 16, in order to reciprocally move the target 50 by the scanning mechanism 54 while the implantation angle φ is maintained constant, two cases are possible; that is, (a) the target 50 is reciprocally actuated between positions A and B in parallel to the surface of the target 50 as indicated by an arrow 86; and (b) the target 50 is reciprocally actuated between positions A and C in parallel to the axis 72 (see FIG. 14) parallel to the Z axis as indicated by an arrow 88. Even when the target 50 is scanned in any direction of the cases (a) and (b), the implantation angle φ at which the ion beam 4a falls on the surface of the target 50 is constant.

In the case of (a), the position on the target 50 on which the ion beam 4a falls remains unchanged and constant within the plane of the target 50 in the traveling direction of the ion beam 4a; that is, the direction parallel to the X axis. Specifically, the ion beam 4a falls on the position which is spaced a given distance $L_4$ from the axis 72 within all the surfaces of the target 50. Accordingly, even if a change has arisen in the state of the ion beam 4a (i.e., the dimensions of the cross-sectional profile thereof) in the traveling direction thereof, the ion beam 4a is radiated on the entire surface of the target 50 under the same conditions, thereby enabling ion implantation. However, the width of mechanical reciprocal scanning of the target 50 becomes greater than that achieved in the case (b) by a factor of 1/cosφ.

In the case of (b), the position on the target 50 on which the ion beam 4a falls changes within the plane of the target 50 in the direction parallel to the X axis. Specifically, when consideration is given of a case where the surface of the target 50 has been scanned from position A to position C, the ion beam 4a is radiated from one end section 50a of the target 50 to the other end section 50c by way of a center section 50b. The ion beam is changed (shifted back and forth) by a distance $L_3$ within the plane of the target 50. Accordingly, the disadvantage of the case (a) becomes an advantage for the case (b), and the advantage of the case (a) becomes a disadvantage for the case (b).

In either of the cases (a) and (b), chronological variations in the scan voltage Vs required to ensure superior implantation uniformity within the plane of the target 50 can be achieved on the basis of Equation 9.

In the ion beam radiation system, a technique described in Japanese Patent No. 2969788 can be utilized as a method for measuring uniformity of implantation of the target 50 and shaping the scan waveform or the like of the ion beam 4 on the basis of the thus-measured information.

This will now be briefly described by reference to FIG. 1. Multipoint faraday rows 56 and 58 consisting of multipoints capable of receiving the ion beam 4a scanned in the direction parallel to the Y axis are provided before hand at positions upstream and downstream of the holder 52 for holding the target 50, in the scanning direction (i.e., the direction parallel to the Y axis). The downstream multipoint faraday rows 58 may also be fixed to the beam line of the ion beam 4a. However, the upstream multipoint faraday rows 56 are shifted as indicated by an arrow 78 and shifted to the beam line of the ion beam 4a only during measurement.

Information about distribution of quantity of a beam current in the direction in which the scanned ion beam 4 is scanned (i.e., a time integral value of the beam current) and about the parallelism of the ion beam is obtained from the two multipoint faraday rows 56 and 58. On the basis of the information, the waveform of the scan voltage Vs supplied to the scanner 12 and the magnitude of the deflection voltage $V_D$ supplied to the electrostatic deflector 30 are adjusted so that the distribution and the parallelism become improved. Specifically, if the amount of beam current in one area is greater than those in other areas, the scan voltage Vs corresponding to that area is changed slowly. In an area where the amount of beam current is smaller than in other areas, the scan voltage Vs corresponding to that area is changed rapidly.

The parallelism of the ion beam 4a injected into the target 50 will be described by reference to FIGS. 17A to 17C. When the deflection voltage $V_D$ is appropriate, the ion beam 4a becomes parallel to the X axis as shown in FIG. 17A. When the deflection voltage $V_D$ has become deficient and the deflection angle of the ion beam has become smaller than 90°, the beam becomes spread rather than becoming parallel to the X axis, as shown in FIG. 17B. When the deflection voltage $V_D$ is excessive and the deflection angle is larger than 90°, the ion beam becomes narrower rather than becoming parallel to the X axis, as shown in FIG. 17C. Therefore, if the status shown in FIG. 17B or 17C is determined to have been attained through measurement on the basis of the information about the two multipoint faraday rows 56 and 58, the deflection voltage VD is increased or decreased in accordance with the degree of the status.

One example set of specifications of the ion beam apparatus of the present invention (more specifically an ion implantation apparatus) is as follows.

Direction of the X-Z plane: Horizontal

Direction of the Y-Z plan: Vertical

Direction in which an ion beam is injected into the scanner 12: parallel to the Z axis Energy of the ion beam 4a injected into the target 50: 1 keV to 300 keV Mass "m" of ions constituting the ion beam 4a: 10 AMU to 250 AMU Lead voltage of the ion beam 4 from the ion source 2: 10 kV to 50 kV Mass separation electromagnet 6: Installed Analysis slit 10: Formed at a position right upstream of the scanner 12. Mass resolving power can be adjusted by means of varying a slit width (a variable range of mass resolving power is m/Δm=10 to 100).

Scan voltage Vs applied to the electrostatic scanner 12: Maximum of ±20 kV

Scan angle θ of the scanner 12: Maximum of ±20°

Acceleration/deceleration device 22: Installed

Deflection voltage 22: Installed

Acceleration/deceleration voltage $V_A$: 0 to 250 kV

Deflection voltage ±VD: Maximum of ±100 kV

Material of deflection electrodes 32 of electrostatic deflector 30: Carbon Shape of mutually-opposing surfaces 33 of deflection electrodes 32: Portion of a torus Deflection radius R of the electrostatic deflector 30: Maximum of 1000 mm Distance $L_1$ (see FIG. 5): Maximum of 1000 mm Distance from exit of the electrostatic deflector 30 to the target 50: Maximum of 500 mm (when the deflection electromagnet 42 is not provided)

Shape of the beam passage hole 48 of the beam mask 46: Circular arc

Direction in which the holder 52 is reciprocally moved at the time of implantation: Horizontal Implantation at angle: Possible; namely, the implantation angle φ can be set by means of rotating the holder 52 around a shaft 66 (see FIG. 11).

Multipoint faraday rows 56 and 58: Provided. On the basis of information about measurement of the faraday rows, the scan voltage Vs and the deflection voltage $V_D$ can be set.

An embodiment—where the electrostatic deflector 30 is provided with the function of accelerating and decelerating an ion beam in addition to the previously-described function (i.e., the function of paralleling the ion beam and separating energy)—will next be described while predominantly focusing on differences between the present embodiment and the respective embodiments described above. The following descriptions are chiefly directed toward acceleration and deceleration of the ion beam, and the action of energy separation is the same as those described previously. Therefore, the ion beam is typified by reference numeral 4.

Figure 18:
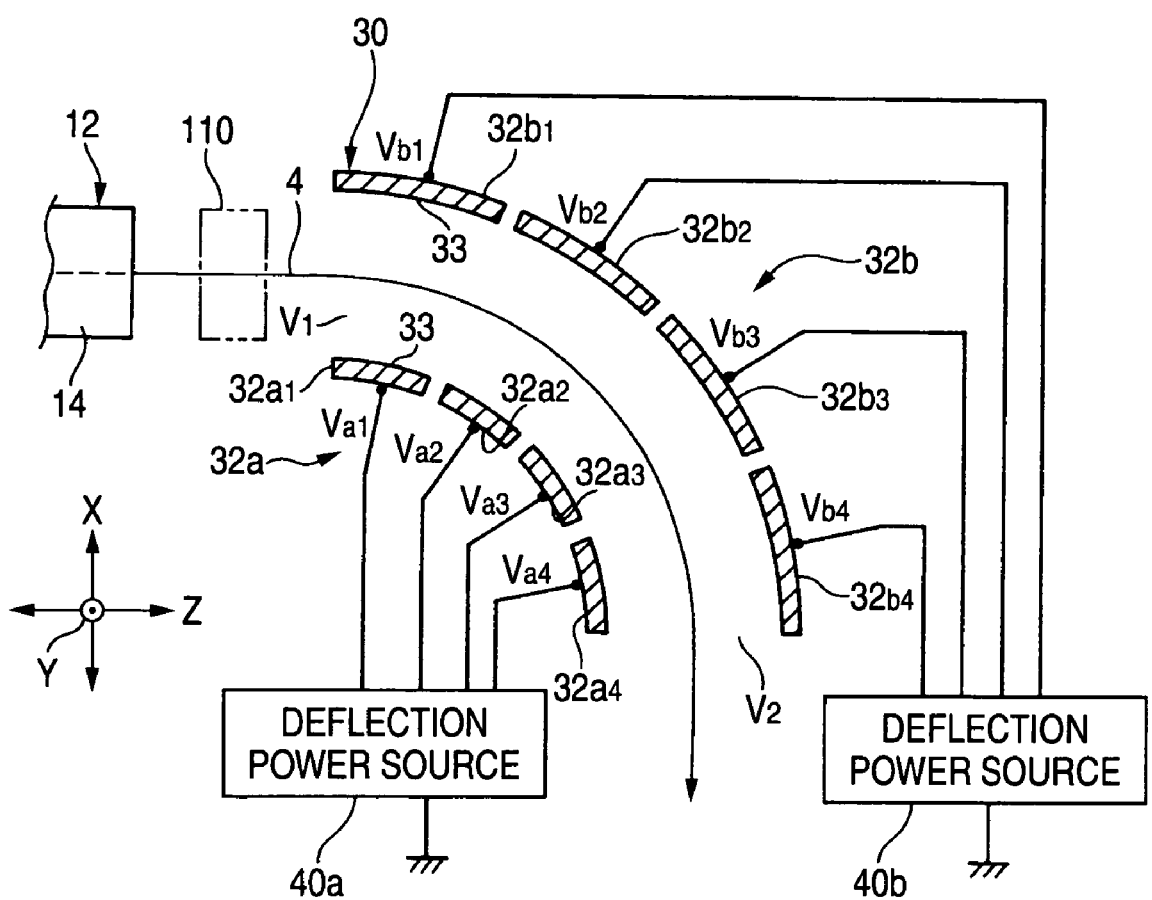
FIG. 18 is a view showing an embodiment in which the electrostatic deflector is provided with the function of accelerating and decelerating the ion beam.

FIG. 18 shows an embodiment in which the electrostatic deflector is provided with the function of accelerating and decelerating the ion beam. In the present embodiment, the electrostatic deflector 30 has an inner deflection electrode 32a and an outer deflection electrode 32b, which are spaced at an interval so as to oppose each other. Each of the inner and outer electrodes 32a and 32b is divided into "n" pieces ("n" is an integer of 2 or more) in a direction in which the deflection angle increases, thereby forming "n" pairs of deflection electrodes. Specifically, an inner deflection electrode 32a1 and a corresponding outer deflection electrode 32b1 constitute a pair of deflection electrodes. Further, an inner deflection electrode 32a2 and a corresponding outer deflection electrode 32b2 constitute another pair of deflection electrodes. The same applies to any counterparts in the following descriptions. Four deflection electrode pairs (i.e., n=4) are provided in FIG. 18 because of limitations on the space of an illustration. However, the number of deflection electrode pairs is not limited to four.

In the present embodiment, an interval between mutually-opposing surfaces 33 of the "n" pairs of deflection electrodes remains constant from the entrance to exit of the electrostatic deflector 30. Such deflection electrodes are often referred to simply as having a circular-arc cross-sectional profile.

Provided that the potential of the entrance of the electrostatic deflector 30 is taken as V1 and the potential of the exit of the electrostatic deflector 30 is taken as V2, the ion beam 4 is made to satisfy a relationship of Equation 10 when the electrostatic deflector 30 decelerates the ion beam while deflecting the same and to satisfy a relationship of Expression 11 when accelerating the ion beam while deflecting the same.

$$V_1 < V_2 \quad \text{[Equation 10]}$$

$$V_1 > V_2 \quad \text{[Equation 11]}$$

Voltages $Va_1$ to $Va_n$ are applied from a first (inner) deflection power source 40a to entrance sides of the respective inner deflection electrodes $32a_1$ to $32a_n$ among the "n" pairs of deflection electrodes. Voltages $Vb_1$ to $Vb_n$ are applied from a second (outer) deflection power source 40b to entrance-sides of the respective outer deflection electrodes $32b_1$ to $32b_n$ among the "n" pairs of deflection electrodes. The deflection power sources 40a, 40b may be constituted of a single power source or a plurality of power sources.

More specifically, a resistance division method (1) or a multiple power source method (2) can be used as an example of the deflection power sources 40a, 40b which apply the voltages $Va_1$ to $Vb_n$ to the respective inner and outer deflection electrodes $32a_1$ to $32a_n$ and $32b_1$ to $32b_n$.

(1) Deflection Power Source Based on the Resistance Division Method

Figure 29:
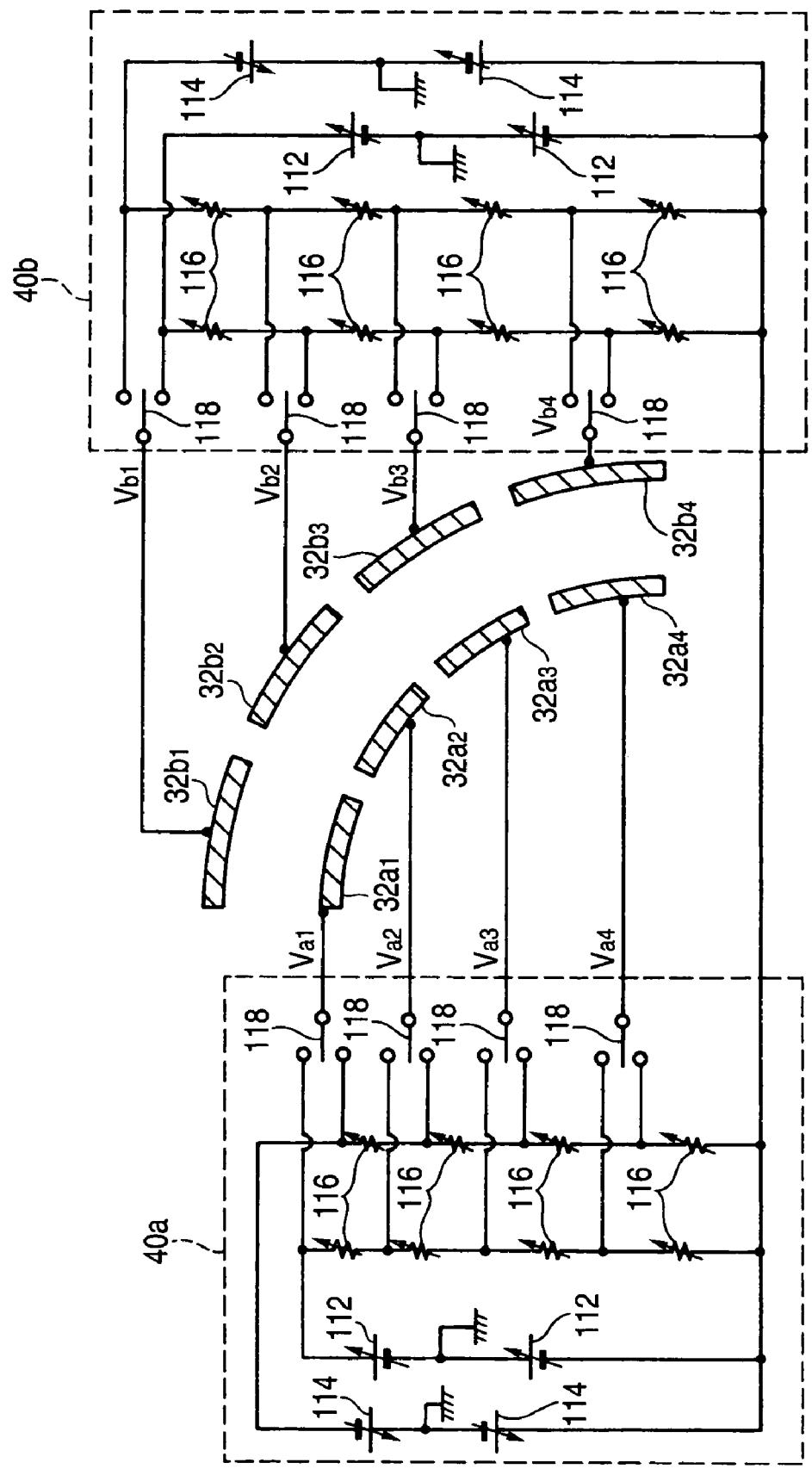
FIG. 29 is a circuit diagram showing an example of a deflection power source based on a resistance division method.

FIG. 29 shows an example circuit diagram of the deflection power source. The deflection power sources 40a, 40b are respectively provided with power sources (a deflection acceleration power source 112 and a deflection deceleration power source 114 in the illustrated embodiment) capable of supplying a maximum voltage within the range of the maximum voltage applied to the inner deflection electrodes $32a_1$ to $32a_n$ and the outer deflection electrodes $32b_1$ to $32b_n$. The voltages output from the power sources each are divided and output by a plurality of variable resistors 116, whereby desirable voltages $Va_1$ to $Va_n$ and $Vb_1$ to $Vb_n$ under requirements of an ion beam are produced. When the ranges of the voltages applied to the inner and outer deflection electrodes extend across positive and negative ranges, the essential requirement is to provide the deflection power sources 40a, 40b with the two power sources 112, 114 assigned to a positive and a negative as in the case of the illustrated embodiment. When the deflection power sources are used in either an acceleration mode or a deceleration mode, the essential requirement is to provide the deflection power sources with only the deflection acceleration power source 112 or the deflection deceleration power source 114. When the power sources are used while switching between the acceleration mode and the deceleration mode, the respective deflection power sources are provided with the deflection acceleration power source 112 and the deflection deceleration power source 114, as in the case of the illustrated embodiment. Moreover, it is better to provide the deflection power sources with changeover switches 118 such that the voltage is output in a switchable manner in accordance with the acceleration mode or the deceleration mode. This resistance division method yields the advantage of the ability to reduce the number of power sources.

(2) Deflection Power Source Based on the Multiple Power Source Method

Figure 30:
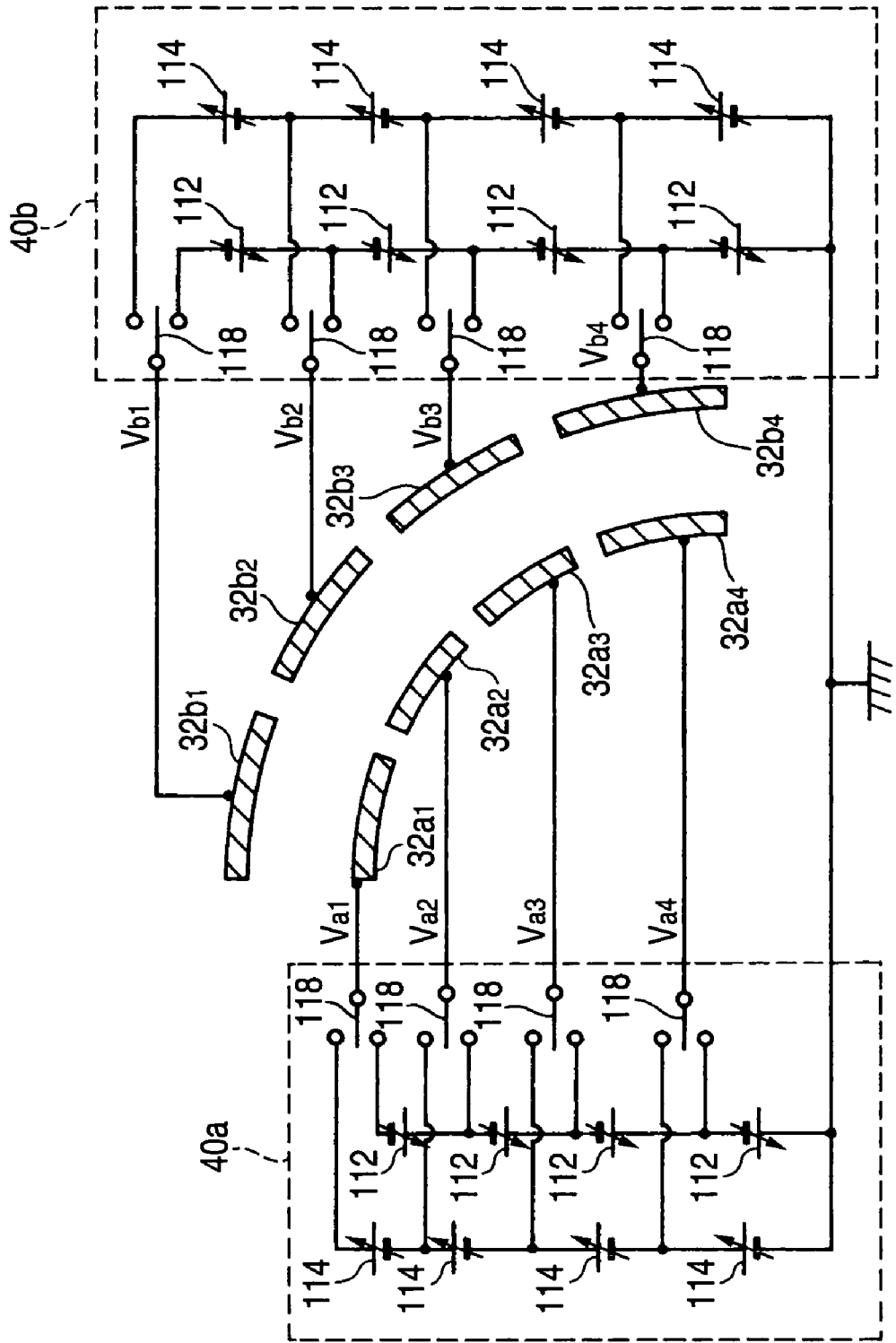
FIG. 30 is a circuit diagram showing an example of a deflection power source based on a multiple power source method.

FIG. 30 shows an example circuit diagram of the deflection power source. The deflection power sources 40a, 40b are provided with a plurality of power sources (the deflection acceleration power source 112 and the deflection deceleration power source 114 in the illustrated embodiment) which are connected in series in correspondence with the respective inner deflection electrodes $32a_1$ to $32a_n$ and the outer deflection electrodes $32b_1$ to $32b_n$ and in correspondence with the acceleration mode and the deceleration mode. When the ranges of the voltages Va1 to Van applied to the inner deflection electrodes $32a_1$ to $32a_n$ and the voltages $Vb_1$ to $Vb_n$ applied to the deflection electrodes $32b_1$ to $32b_n$ extend across positive and negative ranges, it is better to use power sources capable of outputting a positive voltage or a negative voltage for some of the power sources. As in the case of (1), the only requirement is to provide the power sources with a plurality of the changeover switches 118. In the case of the method (2), providing all the deflection electrodes $32a_1$ to $32a_n$ and $32b_1$ to $32b_n$ with the power sources is uneconomical. Hence, some of the power sources may be replaced with the power sources based on a resistance division method in conjunction with the method (1). In reality, there may be a lot of cases where difficulty is encountered in providing a plurality of power sources separately. Therefore, it is preferably to supply a plurality of voltages from a grouped single power source.

When the ion beam 4 is decelerated by the electrostatic deflector 30, the respective voltages satisfy the following relationships.

Va1<Va2<...<Van

Vb1<Vb2<...<Vbn

Va1<Vb1, Va2<Vb2, ..., Van<Vbn  [Equation 12]

When the ion beam 4 is accelerated by the electrostatic deflector 30, the respective voltages satisfy the following relationships.

Va1>Va2>...>Van

Vb1>Vb2>...>Vbn

Va1>Vb1, Va2<Vb2, ..., Van<Vbn  [Equation 13]

As a result of the relationships defined in Equations 10 and 12 being satisfied, the electrostatic deflector 30 gradually decelerates the ion beam 4 while deflecting the ion beam. Moreover, as a result of the relationships defined in Equations 11 and 13 being satisfied, the electrostatic deflector 30 can gradually accelerate the ion beam 4 while deflecting the ion beam.

As mentioned above, in the present embodiment, the electrostatic deflector 30 can decelerate or accelerate the ion beam 4 while deflecting the ion beam. As mentioned previously, the acceleration/deceleration devices 22 do not need to be provided separately. Therefore, the acceleration/deceleration devices 22 are not provided in the embodiment shown in FIG. 18. Consequently, when compared with the case where the acceleration/deceleration devices are provided separately, the length of the beam line can be shortened further. Hence, a loss due to dispersion of the ion beam 4 or the like is more diminished, thereby improving the transport efficiency of the beam and readily ensuring a larger amount of beam. Moreover, the length of the beam line can be greatly shortened, thereby rendering the overall system more compact.

Particularly, in the case of deceleration of the ion beam 4, when the acceleration/deceleration devices 22 are provided and the ion beam is completely decelerated to a desired energy level by means of the acceleration/deceleration devices 22 and when the ion beam is subsequently caused to pass through the electrostatic deflector 30, the beam line of low energy becomes longer, and dispersion of the ion beam 4 due to the space-charge effect becomes greater. In contrast, in the present embodiment, when the ion beam 4 is gradually decelerated to a desired energy level while being deflected within the electrostatic deflector 30, the beam line of low energy becomes shorter at an arbitrary position within the electrostatic deflector 30. Accordingly, dispersion of the ion beam 4 due to the space-charge effect can be suppressed. Consequently, extraction of the ion beam 4 of large current at low energy is facilitated.

The electrostatic deflector 30 of the embodiment can accelerate or decelerate the ion beam 4. As mentioned previously, if acceleration and deceleration are not required, only deflection of the ion beam can be performed. In this case, it is better to set $V_1=V_2$ and satisfy the relationships of the following expression.

Va=Va$_1$=Va$_2$=...=Van

Vb=Vb$_1$=Vb$_2$=...=Vbn

Va<Vb  [Equation 14]

As indicated by a two-dot chain line in FIG. 18, a lens system 110 may be provided, as necessary, between the scanner 12 and the electrostatic deflector 30; more specifically, at a position in the vicinity of the upstream entrance of the electrostatic deflector 30, wherein the lens system 110 performs adjustment of a direction of and shaping of the ion beam 4 injected into the electrostatic deflector 30; for example, direction adjustment in the X direction and thickness adjustment in the X direction. The lens system 110 is, e.g., an electrostatic lens; more specifically, a unipotential lens. Although not illustrated, the beam passage hole of the lens system 110 is preferably made identical in shape with the beam passage hole 26 of the acceleration/deceleration device 22.

The principle on which the electrostatic deflector 30 decelerates or accelerates the ion beam 4 while deflecting the same and requirements for smooth acceleration/deceleration (i.e., the shapes of electrodes, applied voltages, or the like) will now be described in detail.

Figure 19:
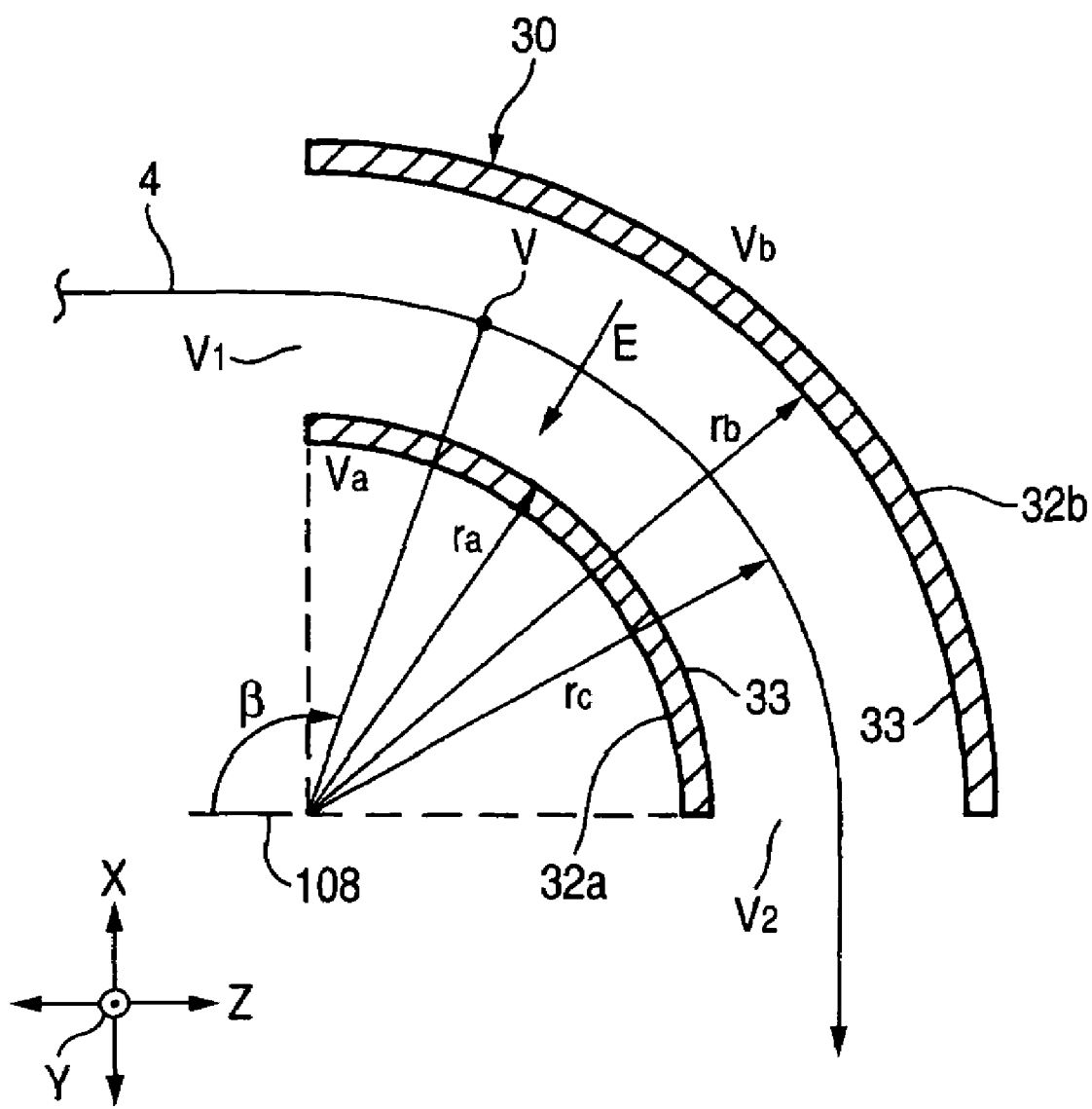
FIG. 19 is a view for describing the principle of a case where the electrostatic deflector with deflection electrodes, each deflection electrode having a circular-arc cross-sectional profile, is provided with the function of accelerating or decelerating the ion beam.

(1) When the Electrostatic Deflector 30 Has a Deflection Electrode Having a Circular-Arc Cross-Sectional Profile (1-1) When the Ion Beam is only Deflected through 90° without Being Accelerated or Decelerated This case will be described by reference to FIG. 19. The radius of the inner deflection electrode 32a (specifically, the radius of an opposing surface 33 of the deflection electrode 32; the same applies to any counterparts in the following descriptions) is taken as ra. The radius of the outer deflection electrode 32b (specifically, the radius of an opposing surface 33 of the deflection electrode 32; the same applies to any counterparts in the following descriptions) is taken as rb. The orbital radius of the ion beam 4 (more specifically, an ion beam of desired energy) is taken as rc. Voltages applied to the inner and outer deflection electrodes 32a, 32b are taken as Va, Vb, respectively. Since the ion beam is deflected through 90°, Va<Vb stands. The entrance potential of the electrostatic deflector 30 is taken as V1, and the exit potential of the same is taken as V2. In this case, acceleration or deceleration is not performed, and hence V1=V2=0 [V].

An electric field E achieved in this case is given by the following equation. Here, log denotes a natural logarithm; and "r" denotes the radius of an arbitrary point between the deflection electrodes 32a, 32b.

$E=(Vb-Va)/r \cdot \log(rb/ra)$  [Equation 15]

The potential V of the point of the radius "r" is given by the following expression by means of integrating Equation 15. Here, r=ra, V=Va, and V=Vb.

$V=\{(Vb-Va)/\log(rb/ra)\}/\log(r/ra)+Va$  [Equation 16]

Under the assumption that electric charges of the ions forming the ion beam 4 are taken as "q" and that the beam speed is taken as "V," in order to cause the track of the ion beam 4 to assume a circular orbit having a radius "r," the following equation stands, in view of requirements for balance in the radial direction "r."

$$qE = mv^2/r \qquad \text{[Equation 17]}$$

When the acceleration voltage corresponding to the kinetic energy of the ion beam 4 is taken as Vm, the following expression stands.

$$mv^2/2 = qVm \qquad \text{[Equation 18]}$$

E=2Vm/r is induced from Equations 17, 18, and this expression is substituted into Equation 15, whereby the following equation is obtained.

$$Vb - Va = 2Vm \log(ra/rb) \qquad \text{[Equation 19]}$$

An electrical potential difference between the inner and outer deflection electrodes 32a, 32b is determined by multiplying twice the logarithm of a ratio between the radius ra and the radius rb by the acceleration voltage Vm corresponding to the kinetic energy of the ion beam 4. When no acceleration or deceleration is performed, the voltage Vb is usually taken as +VD, and the voltage Va is usually taken as –VD, whereby the potential on the track of the ion beam 4 is determined to be 0V. At this time, Equations 19 and 20 are obtained.

$$VD = Vm \log(rb/ra) \qquad \text{[Equation 20]}$$

When acceleration or deceleration is performed, the voltage is often taken in the form of the following expression in consideration of a bias voltage Vbias as in the case of the electrode of parallel plate type. The bias voltage Vbias is used for acceleration and deceleration.

$$Va = -VD + V\text{bias}, \quad Vb = VD + V\text{bias} \qquad \text{[Equation 21]}$$

(1-2) When Deflection of the Ion Beam through 90° and Acceleration or Deceleration of the Same are Performed This case will be described by reference to FIG. 20. Here, two pairs of deflection electrodes are employed. The majority of those reference numerals which are the same as those in FIG. 19 are omitted.

By way of an example, consideration is given to a case where the ion beam 4 having an energy level of 20 keV at the entrance of the electrostatic deflector 30 is decelerated by only 15 keV, to thus decelerate the ion beam 4 to an energy level of 5 keV at the exit of the electrostatic deflector. In this case, the potential V1 at the entrance of the electrostatic deflector 20 is set to 15 kV, and the potential V2 at the exit of the electrostatic deflector 30 is set to 0V. A voltage Ve corresponding to the kinetic energy qVe of the ion beam 4 achieved at the entrance is 5 kV.

The radii ra of the respective inner deflection electrodes $32a_1, 32a_2$ are assumed to remain unchanged. The radii rb of the respective inner deflection electrodes $32b_1, 32b_2$ are also assumed to remain unchanged. For the sake of simplicity, $K_1 = \log(rb/ra)$ is set.

The kinetic energy of the ion beam 4 achieved at the entrance of the electrostatic deflector 30 is $qVm_1$ [eV]. Hence, the following formula is derived from Equation 20.

$$VD_1 = K_1(Ve - V_1) = K_1 Vm_1 \qquad \text{[Equation 22]}$$

On the assumption that $V_{bias}$ in Equation 21 is taken as $V_1$, voltages $Va_1, Vb_1$ appearing in the entrance-side areas of the deflection electrodes $32a_1, 32b_1$ are defined by the following equation.

$$Va_1 = -VD_1 + V_1$$

$$Vb_1 = VD_1 + V_1 \qquad \text{[Equation 23]}$$

Similarly, the kinetic energy of the ion beam 4 achieved at the entrance of the electrostatic deflector 30 is $qVm_2$ [eV]. Equation 24 is derived in the same manner as mentioned previously. Moreover, voltages $V_{a2}, V_{b2}$ appearing at the exit-side deflection electrodes $32_{a2}, 32_{b2}$ are expressed by Equation 25.

$$VD_2 = K_1(Ve - V_2) = K_1 Vm_2 \qquad \text{[Equation 24]}$$

$$Va_2 = -VD_2 + V_2$$

$$Vb_2 = VD_2 + V_2 \qquad \text{[Equation 25]}$$

A potential difference Vin between the inner deflection electrodes $32a_1, 32a_2$ is determined as follows by Equations 23 and 25.

$$V_{in} = Va_2 - Va_1 = (1 + K_1)(V_2 - V_1) \qquad \text{[Equation 26]}$$

Similarly, a potential difference Vout between the outer deflection electrodes $32b_1, 32b_2$ is determined as follows by Equations 23 and 25.

$$V_{out} = Vb_2 - Vb_1 = (1 - K_1)(V_2 - V_1) \qquad \text{[Equation 27]}$$

As mentioned above, in the case where, e.g., ra=0.35 [m] and rb=0.45 [m], there is obtained $k_1$=0.251. As mentioned above, $V_1$=–15 [kV] and $V_2$=0 [V], and hence there are obtained $V_{in}$=18.77 [kV] and $V_{out}$=11.23 [kV]. $V_{in}$ is larger than $V_{out}$, and a difference therebetween becomes greater as the deceleration voltage (i.e., a difference between $V_2$ and $V_1$) becomes greater. Hence, an electric field developing between the adjacent deflection electrodes $32a_1, 32a_2$ becomes greater. If attention is not paid to the electric field, the increase in the electric field becomes a cause of disturbances in the orbit of the ion beam 4. In the case of paralleled plate electrodes, $K_1$=0 and hence such disturbances do not arise.

The disturbances in the electric field are alleviated to a certain extent by broadening the interval between the adjacent electrodes. However, if the interval has been broadened excessively, deflection of the ion beam 4 becomes difficult, and hence some measure is required.

Figure 20:
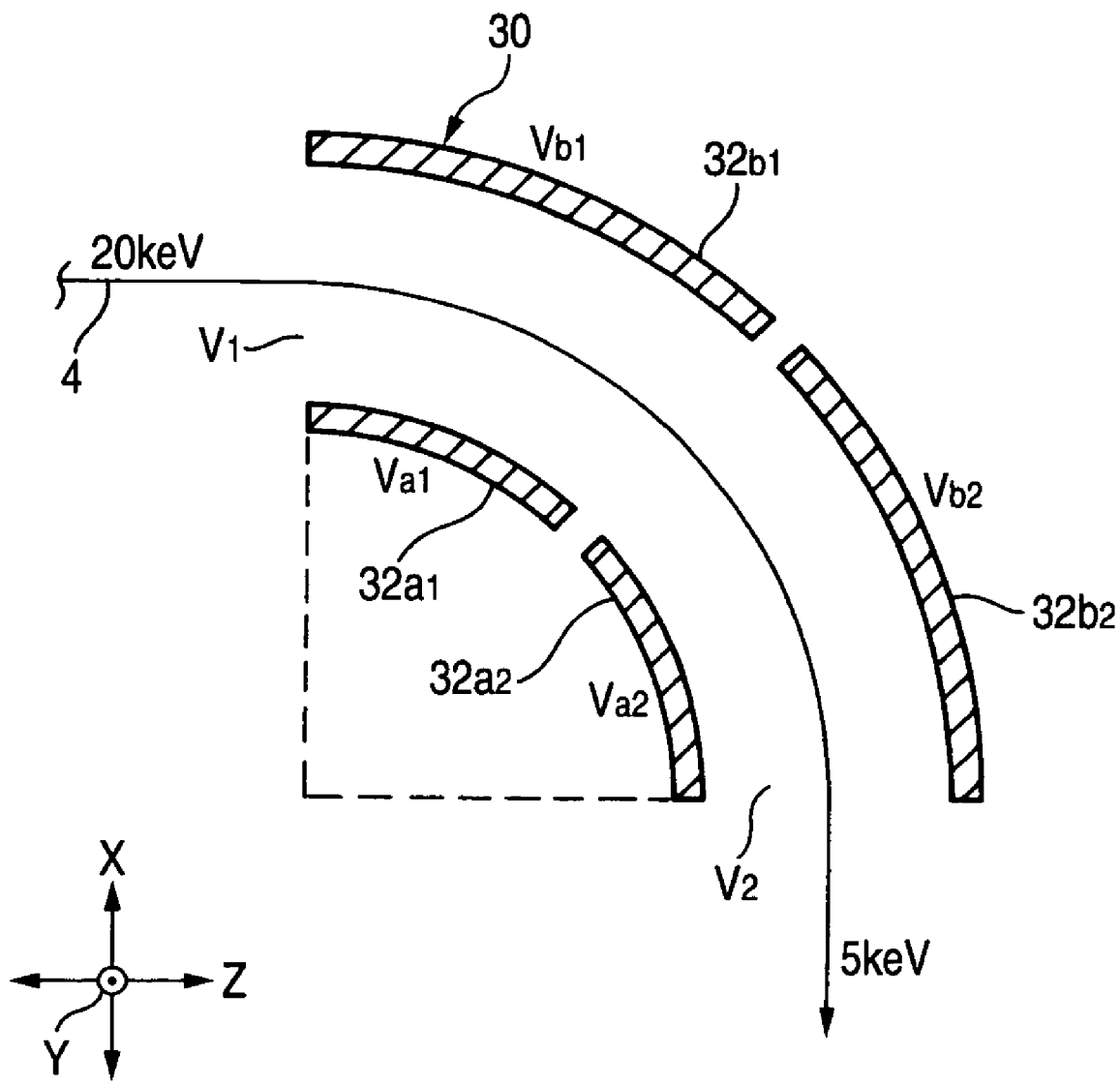
FIG. 20 is a view for describing the principle of a case where the electrostatic deflector having two deflection electrode pairs, each deflection electrode having a circular-arc cross-sectional profile, is provided with the function of accelerating or decelerating the ion beam.
Figure 21:
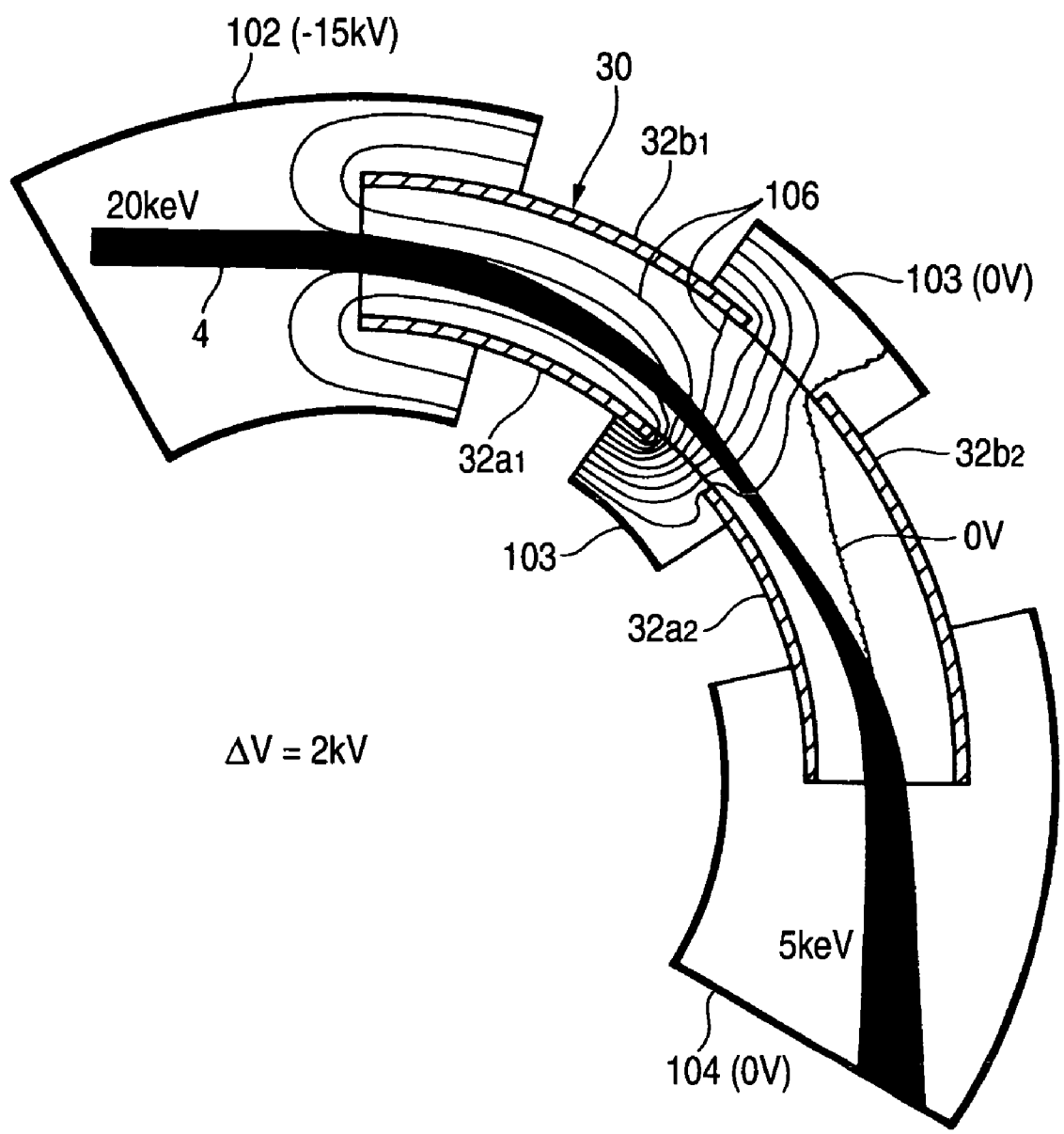
FIG. 21 is a view for describing one example result of simulation of a beam orbit, or the like, attained when the ion beam is decelerated by the electrostatic deflector with two deflection electrode pairs, each deflection electrode having a circular-arc cross-sectional profile.

FIG. 21 shows an example result of simulation of the beam orbit, or the like, which has been performed on the basis of the principle illustrated in FIG. 20.

Matters common among simulations shown in FIGS. 21 to 28 will now be described. Here, the simulation signifies a two-dimensional analysis, the mass number of the ions forming the ion beam 4 is 11, and the beam current density of the ion beam 4 is set to 25 mA/m (the denominator of the beam current density is not $m^2$, because a two-dimensional analysis is performed, and the density is the current density achieved at a deep interior position located 1 m from the paper surface with reference to the direction running from the front to the back thereof. The energies of the ion beam 4 achieved at the entrance and exit of the electrostatic deflector 30 are shown in the respective drawings. The inner deflection electrodes 32a and the outer deflection electrodes 32b which are assigned the same subscripts 1, 2, . . . , form respective pairs. Thick solid lines 102, 104 surrounding the neighborhoods of the entrance and exit of the electrostatic deflector 30 are provided for defining boundary conditions for simulation and simulate the wall surface of a beam line (this does not mean that a beam line of an actual apparatus assumes the illustrated shape). Potentials of the boundary conditions are parenthesized. These potentials correspond to an entrance potential $V_1$ and an exit potential $V_2$ of the electrostatic deflector 30. Since the exit potential of the electrostatic deflector 30 is usually 0V, the same potential is employed in this simulation. A thick solid line 103 shown in FIG. 21 is also provided for defining boundary conditions in the same manner as mentioned previously. Reference numeral 106 designates an equipotential surface (which can also be said to be an equipotential line, because the simulation is a two-dimensional analysis). A potential difference between the two equipotential surfaces 106 is denoted by ΔV in the respective drawings. An equipotential surface of 0V is denoted by 0V.

FIG. 21 shows a case where the electrostatic deflector 30 comprising two pairs of deflection electrodes 32a1, 32a2, 32b1, and 32b2, each having a circular-arc cross-sectional profile, decelerates the ion beam 4 from an energy level of 20 keV to 5 keV. As a matter of course, the ion beam 4 is deflected through 90° (this is a matter common among all the embodiments, and hence repeated mention thereof is omitted hereafter).

Voltages of the respective deflection electrodes are as follows:

$32a_1$: −20 kV, $32b_1$: −9.9 kV $32a_2$: −1.4 kV, $32b_2$: 1.4 kV

In the embodiment shown in FIG. 21, attention has been paid to the interval between the adjacent deflection electrodes and the voltages applied to the respective deflection electrodes, and therefore disturbances in the orbit of the ion beam 4 can be reduced to a comparatively small level.

(2) Method for Smoothly Accelerating and Decelerating the Ion Beam 4 in the Electrostatic Deflector 30

When the ion beam 4 has been abruptly decelerated in the electrostatic deflector 30, space charges concentrate on the ion beam, thereby increasing dispersion of the ion beam. In order to avoid concentration of the space charges, gentle deceleration of the ion beam 4 is desirable. Even in the case of acceleration of the ion beam, gentle acceleration of the ion beam 4 in different degrees is still desirable.

Turning back to FIG. 19, the potential V of the ion beam 4 achieved at an arbitrary angle β in the orbit thereof within the electrostatic deflector 30 is considered, as an example, to be changed in accordance with a linear expression as represented by the following expression (another function having a gentle slope is also conceivable). Here, the angle β is an angle corresponding to a line 108 (i.e., the Z axis) parallel to the incident ion beam 4. A start angle βstart at the entrance of the electrostatic deflector 30 is 90°, and an end βend at the exit of the same is 180°. Settings are made such that the start angle βstart is changed to V=$V_1$ and such that the end angle βend is changed to V=$V_2$.

$V\{(V_2-V_1)/(\beta end-\beta start)\}●(\beta-\beta start)+V_1$ [Equation 28]

The kinetic energy of the ion beam 4 in the course of being accelerated or decelerated is given by the following expression. Here, as mentioned previously, Vm designates a voltage corresponding to the kinetic energy; and Ve designates a voltage corresponding to the kinetic energy achieved at the exit of the electrostatic deflector 30.

$mv^2/2=qVm=q(Ve-V)$ [Equation 29]

The potential V achieved at a point of a radius "r" within the electrostatic deflector 30 is determined by Equation 16. The expression is again represented as follows.

$V=\{(Vb-Va)/\log(rb/ra)\}\log(r/ra)+Va$ [Equation 30]

Now, provided that Equation 30 is equal to Equation 28, potentials in a desired beam orbit can be set to the voltages Va, Vb applied to the inner and outer deflection electrodes 32a, 32b. The following expression is obtained by modifying Equation 30.

$\log(r/ra)=\{(V-Va)/(Vb-Va)\}\log(rb/ra)$ [Equation 31]

Conditions for an electric field developing between the inner and outer deflection electrodes 32a, 32b are determined as the following expression by means of Equations 19, 29.

$\log(rb/ra)=(Vb-Va)/2(Ve-V)$ [Equation 32]

On the basis of Equations 31, 32, conditions for electrical potentials at arbitrary radii within the electrostatic deflector 30 are given as the following Equation 33 or 34 provided below.

$\log(r/ra)=(V-Va)/2(Ve-V)$ [Equation 33]

$\log(rb/r)=(Vb-V)/2(Ve-V)$ [Equation 34]

The electric potential in the orbit expressed by Equation 28 is a function of the angle β. The electric potential V is computed by Equation 28 while the angle β is taken as a parameter. The design orbit radius of the ion beam 4 is determined as r=rc by Equation 33, whereby the radius ra of the inner deflection electrode 32a is determined. Similarly, the radius rb of the external deflection electrode 32b is determined by Equation 34. These radii are expressed by Equation 35.

$ra=rc \exp\{-(V-Va)/2(Ve-V)\}$ $rb=rc \exp\{(Vb-V)/2(Ve-V)\}$ [Equation 35]

The electrical potential V falls between the voltages Va, Vb of the inner and outer deflection electrodes 32a, 32b and must be intermediate between these voltages; that is, Vb>V>Va. Moreover, in order to cause the ion beam 4 to pass through the electrostatic deflector 30, Ve>V must be achieved. From Equation 35, the ion beam 4 is understood to pass between the deflection electrodes 32a, 32b at rb>rc>ra under these conditions.

If the expressions are again expressed in terms of the voltages Va, Vb of the inner and outer deflection electrodes 32a, 32b, the following expressions are obtained from Equations 31, 32 with r=rc.

$Va=V-2(Ve-V)\log(rc/ra)$ $Vb=V+2(Ve-v)\log(rb/rc)$ [Equation 36]

Equations 35, 36 are mathematically equivalent to each other. Accordingly, if the relationship defined in Equation 35 or 36 is satisfied, the ion beam 4 can be smoothly accelerated or decelerated in the design orbit radius of the ion beam 4. In this case, although strict satisfaction of the relationships is most desirable, in practice as light deviation is tolerated. Hence, the only requirement is to substantially satisfy the relationships. Put another way, the essential requirement is satisfaction of the relationships.

The following specifications can be employed as example specifications for the real electrostatic deflector 30.

(a) The radii ra, rb are changed with respect to the angle β while the voltages Va, Vb are maintained constant.

(b) The voltages Va, Vb are changed with respect to the angle βwhile the radii ra, rb are held constant. In this case, the deflection electrodes 32a, 32b are divided into a plurality of pairs in order to change the applied voltages Va, Vb.

(c) The orbit radius rc is changed.

(d) Combinations of the above specifications are adopted.

To be exact, the optimum shape of the electrodes of the electrostatic deflector 30 changes according to the conditions, such as beam energy or acceleration/deceleration. In the case of low energy, the energy of the ion beam 4 is low, and hence minor ripples in the electric field become less negligible. Hence, the shape of the electrodes obtained at this time is particularly important. However, when the beam energy becomes high, no substantial difference arises in the beam orbit, because an analogous electric field has already arisen in the beam orbit even when the shape of the electrode is not perfectly suited but is average. Therefore, the minor ripples in the electric field can be ignored.

In one method, a plurality of pairs of deflection electrodes suitable for a deceleration mode are prepared, and an average voltage is applied to a plurality of the pairs in an acceleration mode, whereby the same deflection electrodes can be made compatible with the acceleration mode. Although a plurality of the electrodes are not always required in only the deceleration mode, a larger number of electrodes are preferable, in view of also being compatible with the high energy mode (i.e., the acceleration mode).

There may also be adopted another method, wherein an average voltage is applied to the respective deflection electrodes through use of a plurality of deflection electrodes which are relatively easy to manufacture, and have a constant radius and a circular-arc cross-sectional profile, thereby making the deflector compatible with both the acceleration and deceleration modes.

Alternatively, there may also be adopted a method for performing optimum operation by means of changing the electrode angles and the voltages through mechanical operation of the angles of the inner and outer deflection electrodes.

Figure 22:
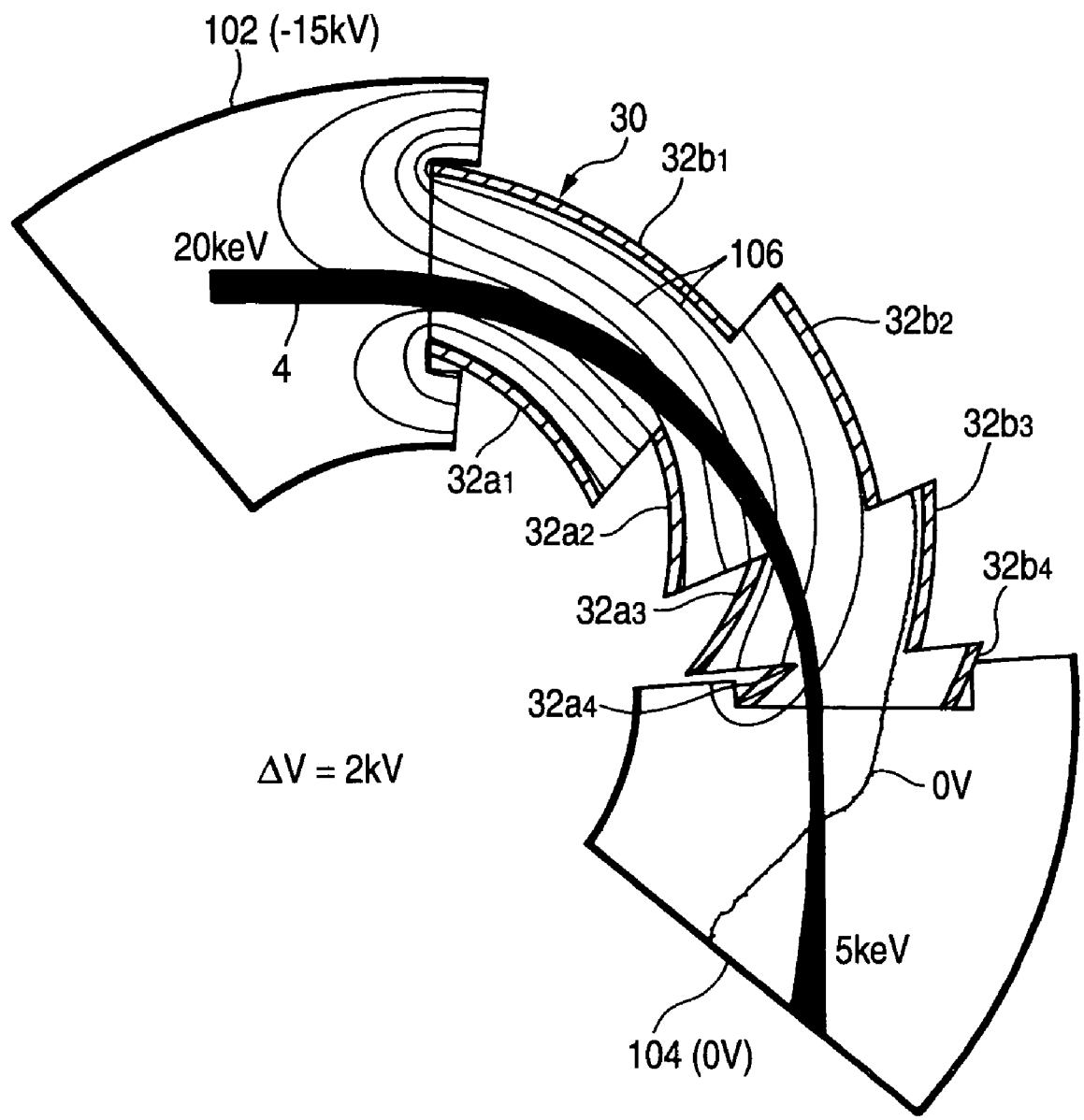
FIG. 22 is a view for describing one example result of simulation of a beam orbit, or the like, attained when the ion beam is decelerated by the electrostatic deflector with four deflection electrode pairs, each deflection electrode spreading toward the exit of the deflector.

FIG. 22 shows an embodiment of the electrostatic deflector 30 having four deflection electrode pairs which consist of deflection electrodes $32a_1$ to $32a_4$, $32b_1$ to $32b_4$ and spread toward the exit of the deflector, wherein the ion beam 4 is decelerated from the energy of 20 keV to 5 keV.

The voltages of the respective deflection electrodes are as follows:

$32a_1$: −20.3 kV, $32b_1$: −5.2 kV $32a_2$: −12.1 kV, $32b_2$: −1.9 kV $32a_3$: −6.6 kV, $32b_3$: 0.2 kV $32a_4$: −2.8 kV, $32b_4$: 1.8 kV

On condition that ra=0.35 [m], rb=0.51 [m], rc=0.4 [m], the potential V1=−15 [kV], the potential V2=0 [V], βstart=90 [degrees], βend=180 [degrees], log(rc/ra)=0.1335, and log (rb/rc)=0.24295 and that the deflection electrodes extend toward the deflecting direction of the beam from the initial position β=90 [degrees] of the deflection electrode, the potential V=V1 is achieved at βstart. Therefore, the following expressions are derived from Equation 36.

$Va$=−1500−2×0.1335×(5000+15000)=−20340 [V]

$Vb$=−1500+2×0.24295×(5000+15000)=−5282 [V]   [Equation 37]

When the voltages Va, Vb have been determined in the manner mentioned previously, the radii ra, rb with respect to the angle β are computed according to Equation 28, whereby V=Vb is attained at β=148.3 [degrees]. When the angle exceeds this value, V>Vb is attained, so that the limit of application is reached. In this case, rb becomes equal to rc at Vb=Vc according to Equation 35. When the angle exceeds the value achieved at this time, rb<rc is obtained, and the external deflection electrode 32b eventually comes into the orbit of the ion beam 4. In such a case, it is better to take an angle βs before the angle β and to set the following electrode pairs. For instance, it is better to again determine initial values of the radii ra, rb (ra=0.35 [m], rb=0.51 [m] in the present embodiment); determine the potential V(βs) in the orbit corresponding to the angle βs according to Equation 28; again determine the voltages Va, Vb according to Equation 36 in the same manner as mentioned previously; and compute the radii ra, rb corresponding to the angle β according to Equation 35. The angle βs before the angle β should be determined in consideration of the cross-sectional dimension of the ion beam 4 (i.e., a beam diameter) such that the inner and outer deflection electrodes 32a, 32b do not come into contact with the ion beam 4. From the above reasons, the four stepped pairs of deflection electrodes are employed in the embodiment shown in FIG. 22.

Figure 23:
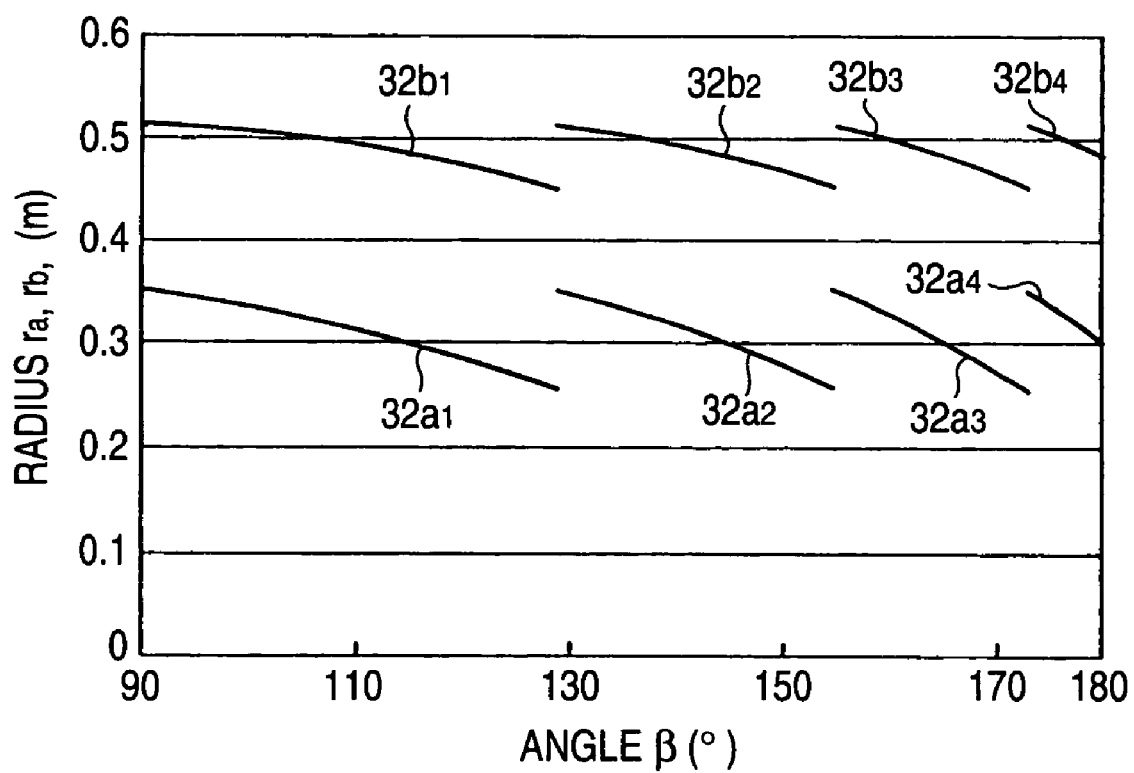
FIG. 23 is a view showing dependence of radius angles of the respective deflection electrodes in the embodiment shown in FIG. 22.

FIG. 23 shows dependence of the radii ra, rb of the deflection electrodes $32a1$ to $32a4$, $32b1$ to $32b4$ shown in FIG. 22 on the angle β. The interval between the inner and outer deflection electrodes of the respective pairs becomes greater with an increase in the angle β; that is, toward the exit of the electrostatic deflector 30.

The embodiment shown in FIGS. 22 and 23 shows the deflection electrodes with the number of deflection electrode pairs being reduced to four. However, the number of deflection electrode pairs is not limited to four. The number of pairs may be smaller or larger than four. When the number of deflection electrodes is increased, the disturbances in the orbit (i.e., scattering) of the ion beam 4 become smaller, thereby enabling smooth deceleration (or acceleration) of the ion beam 4. The same can also be applied to embodiments shown in FIGS. 24 to 26, which will be described later.

From the embodiment shown in FIG. 22, the ion beam 4 is understood to be smoothly decelerated with few disturbances in the orbit of the ion beam 4 when compared with the embodiment shown in FIG. 21. Specifically, the ion beam 4 with the aligned orbit can be ejected from the electrostatic deflector 30.

Figure 24:
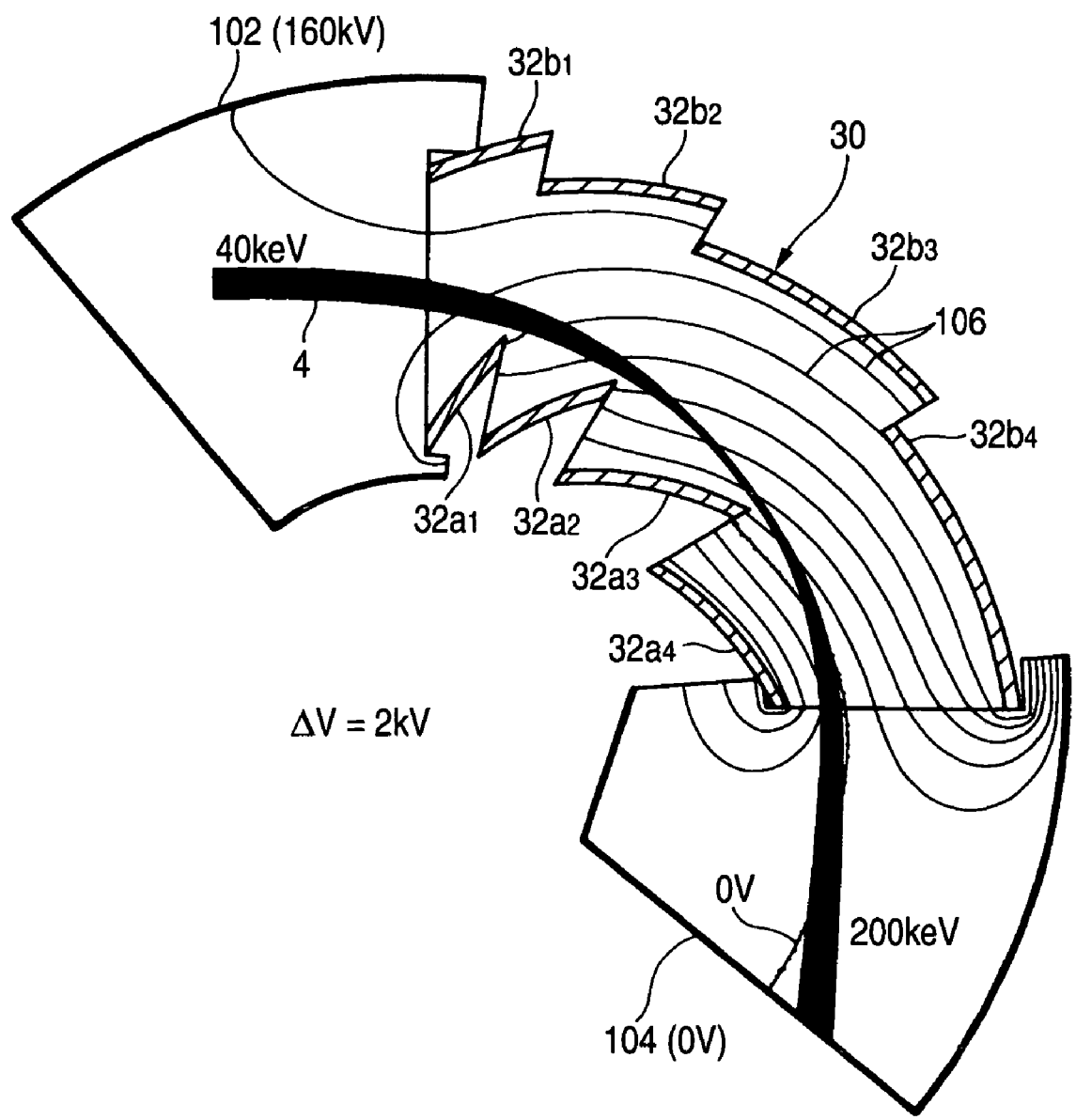
FIG. 24 is a view for describing one example result of simulation of a beam orbit, or the like, attained when the ion beam is accelerated by the electrostatic deflector with four deflection electrode pairs, each deflection electrode becoming narrower toward the exit of the deflector.

FIG. 24 shows an embodiment of the electrostatic deflector 30 having four deflection electrode pairs which consist of deflection electrodes $32a_1$ to $32a_4$, $32b_1$ to $32b_4$ and become narrower toward the exit of the deflector, wherein the ion beam 4 is accelerated from the energy of 40 keV to 200 keV. In contrast with the embodiment shown in FIG. 22, the intervals between the inner and outer deflection electrodes of the respective pairs become narrower with an increase in the angle β; that is, toward the exit of the electrostatic deflector 30.

The voltages of the respective deflection electrodes are as follows:

$32a_1$: 125.5 kV, $32b_1$: 177.8 kV $32a_2$: 85.8 kV, $32b_2$: 166.0 kV $32a_3$: 26.2 kV, $32b_3$: 148.3 kV $32a_4$: −66.4 kV, $32b_4$: 120.7 kV

Even in this case, the disturbances in the orbit of the ion beam 4 are understood to be few, and the ion beam 4 is understood to be smoothly accelerated. Specifically, the ion beam 4 with an aligned orbit can be ejected from the electrostatic deflector 30.

Figure 25:
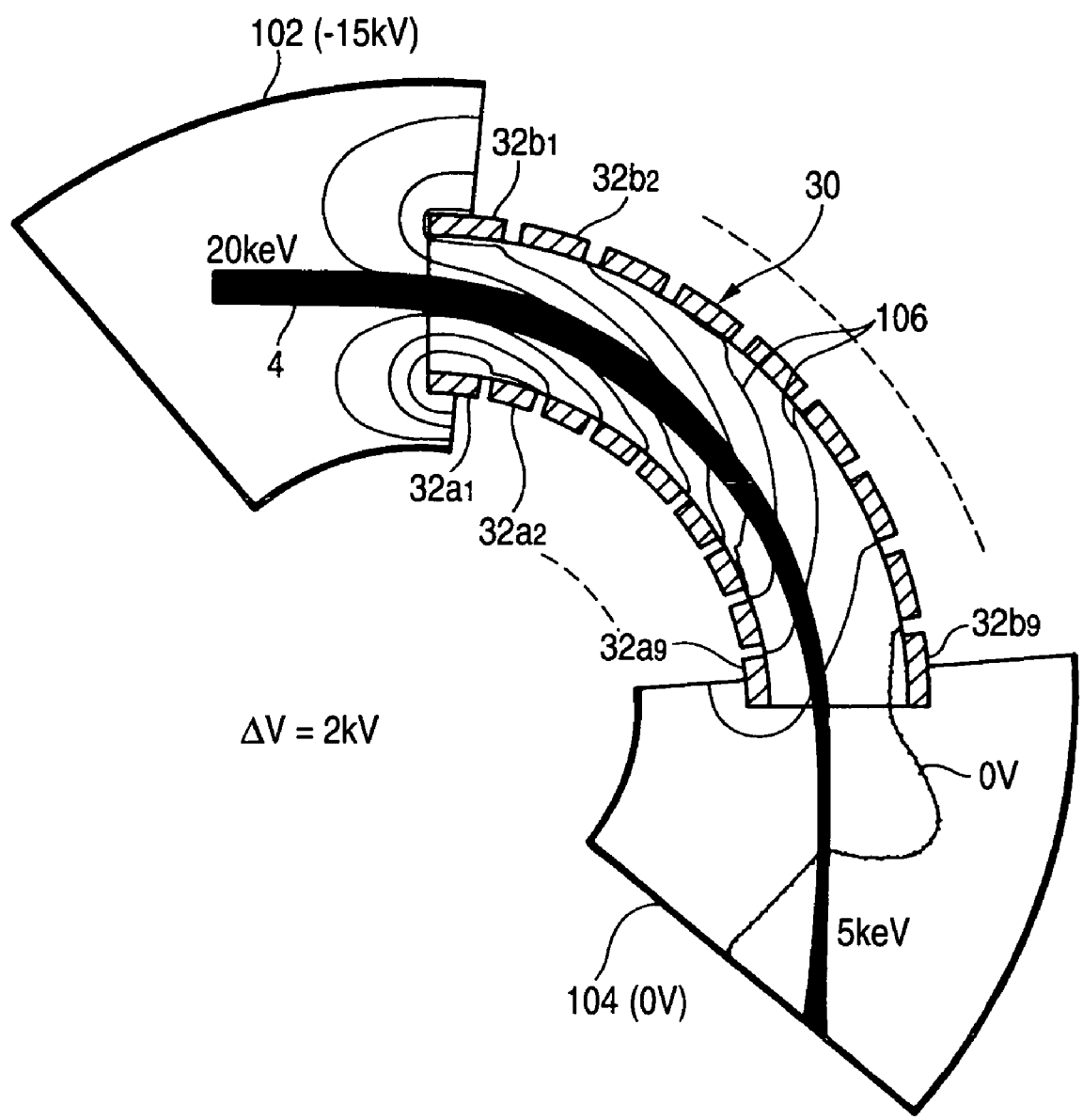
FIG. 25 is a view for describing one example result of simulation of a beam orbit, or the like, attained when the ion beam is decelerated by the electrostatic deflector with nine deflection electrode pairs, each deflection electrode having a circular-arc cross-sectional profile.

FIG. 25 shows an embodiment of the electrostatic deflector 30 having nine deflection electrode pairs which consist of deflection electrodes $32a_1$ to $32a_9$, $32b_1$ to $32b_9$ and each have a circular-arc cross-sectional profile, wherein the ion beam 4 is decelerated from the energy of 20 keV to 5 keV. The radii ra, rb of the inner and outer deflection electrodes are constant, respectively. Specifically, the interval between the inner and outer deflection electrodes is constant from the entrance to the exit of the electrostatic deflector 30.

The voltages of the respective deflection electrodes are as follows:

$32a_1$: −22.7 kV, $32b_1$: −9.6 kV $32a_2$: −20.3 kV, $32b_2$: −8.3 kV $32a_3$: −17.8 kV, $32b_3$: −7.1 kV $32a_4$: −15.4 kV, $32b_4$: −5.8 kV $32a_5$: −13.0 kV, $32b_5$: −4.5 kV $32a_6$: −10.6 kV, $32b_6$: −3.2 kV $32a_7$: −8.2 kV, $32b_7$: −2.0 kV $32a_8$: −5.8 kV, $32b_8$: −0.7 kV $32a_9$: −3.4 kV, $32b_9$: 0.5 kV

Even in the case of the embodiment shown in FIG. 25, the disturbances in the orbit of the ion beam 4 are understood to be few, and the ion beam 4 is understood to be smoothly accelerated. More specifically, the ion beam 4 with the aligned orbit can be ejected from the electrostatic deflector 30.

Figure 26:
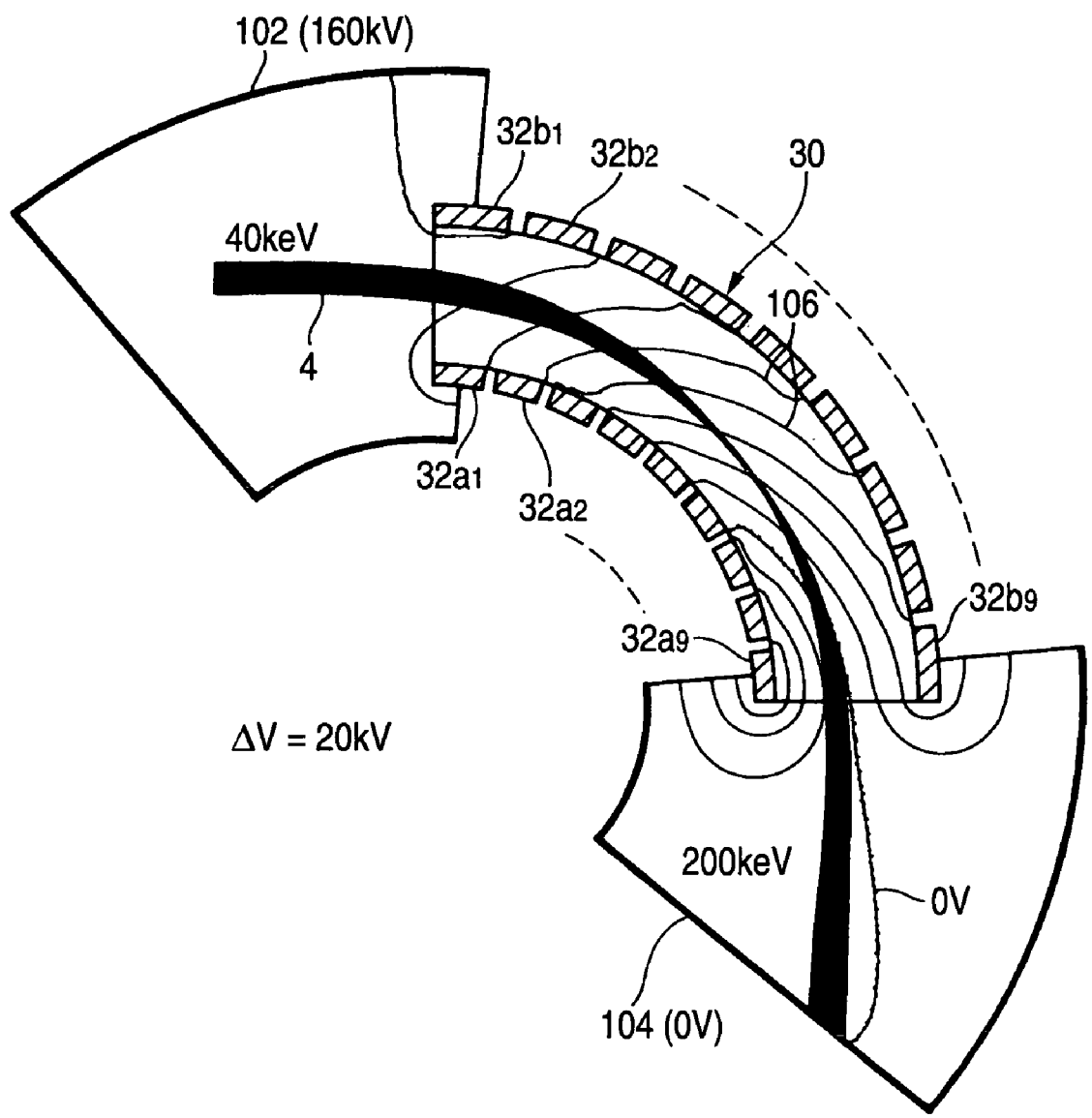
FIG. 26 is a view for describing one example result of simulation of a beam orbit, or the like, attained when the ion beam is accelerated by the electrostatic deflector with nine deflection electrode pairs, each deflection electrode having a circular-arc cross-sectional profile.

FIG. 26 shows an embodiment of the electrostatic deflector 30 having the nine deflection electrode pairs which consist of deflection electrodes $32a_1$ to $32a_9$, $32b_1$ to $32b_9$ and each have a circular-arc cross-sectional profile, wherein the ion beam 4 is accelerated from the energy of 40 keV to 200 keV. The radii ra, rb of the inner and outer deflection electrodes are constant, respectively. Specifically, the interval between the inner and outer deflection electrodes is constant from the entrance to the exit of the electrostatic deflector 30.

The voltages of the respective deflection electrodes are as follows:

$32a_1$: 129.2 kV, $32b_1$: 162.6 kV $32a_2$: 103.5 kV, $32b_2$: 149.0 kV $32a_3$: 77.8 kV, $32b_3$: 135.4 kV $32a_4$: 52.1 kV, $32b_4$: 121.8 kV $32a_5$: 26.4 kV, $32b_5$: 108.2 kV $32a_6$: 0.7 kV, $32b_6$: 94.6 kV $32a_7$: −24.9 kV, $32b_7$: 81.0 kV $32a_8$: −50.6 kV, $32b_8$: 67.4 kV $32a_9$: −76.4 kV, $32b_9$: 53.9 kV

Even in the case of the embodiment shown in FIG. 26, the disturbances in the orbit of the ion beam 4 are understood to be few, and the ion beam 4 is understood to be smoothly accelerated. More specifically, the ion beam 4 with the aligned orbit can be ejected from the electrostatic deflector 30.

The electrostatic deflector 30 shown in FIG. 25 and the electrostatic deflector 30 shown in FIG. 26 can be configured such that the deflection electrodes constituting the respective deflectors assume the same shape. Hence, the electrostatic deflector can be used for both decelerating and accelerating the ion beam 4. The way to apply a voltage to the electrodes is preferably changed on the basis of whether the ion beam is to be accelerated or decelerated.

Figure 27:
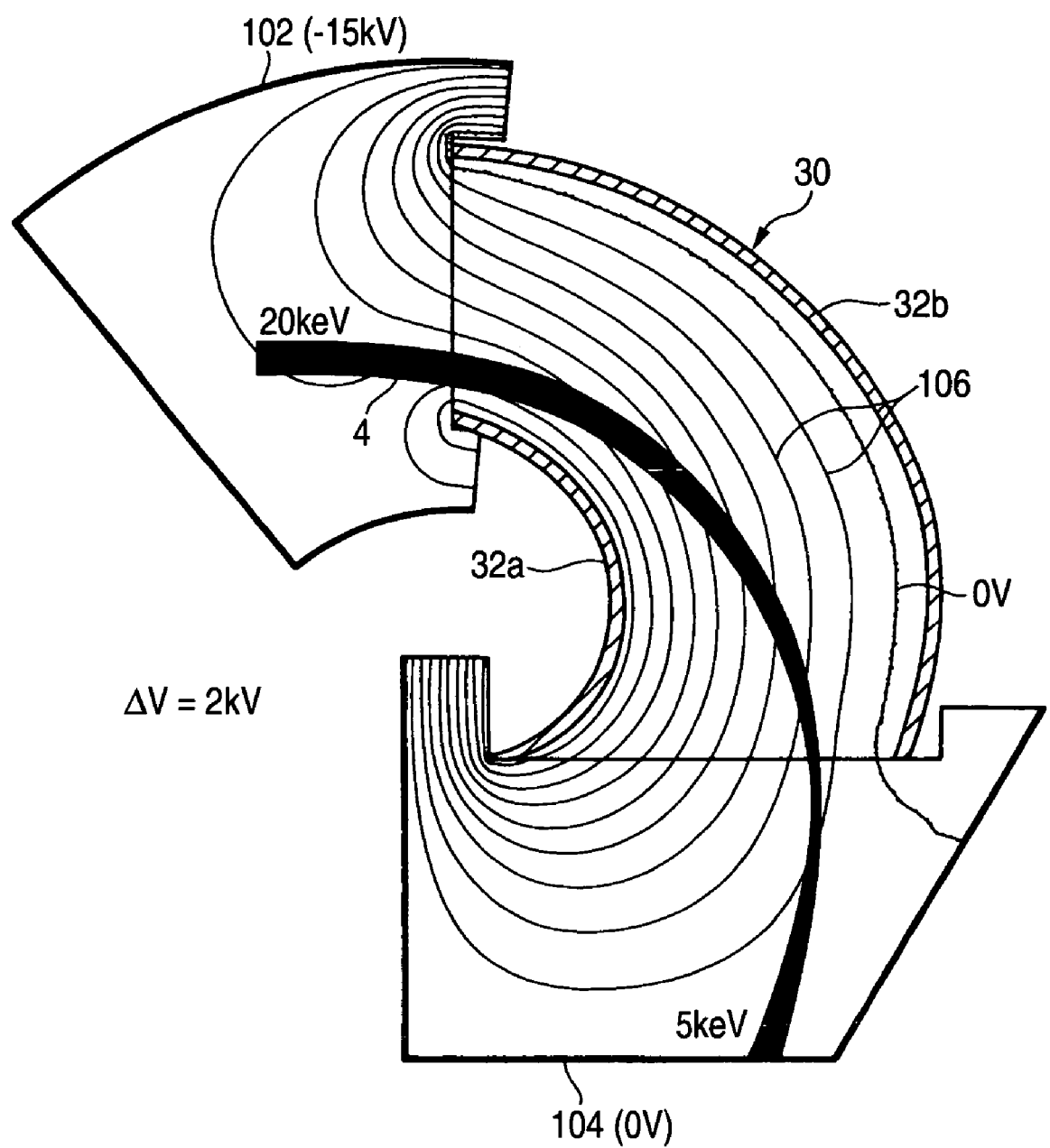
FIG. 27 is a view for describing one example result of simulation of a beam orbit, or the like, attained when the ion beam is decelerated by the electrostatic deflector with one deflection electrode pair, each deflection electrode spreading toward the exit of the deflector.

FIG. 27 shows an embodiment of the electrostatic deflector 30 having one deflection electrode pair which consists of the deflection electrodes 32a, 32b and each spread toward the exit of the deflector, wherein the ion beam 4 is decelerated from the energy of 20 keV to 5 keV.

The voltages of the respective deflection electrodes are as follows:

32a: −19.2 kV, 32b: 1.2 kV

Even in the case of one deflection electrode pair spreading toward the exit as in the case of the present embodiment, the disturbances in the orbit of the ion beam 4 are understood to be few, and the ion beam 4 is understood to be smoothly decelerated. More specifically, the ion beam 4 with the aligned orbit can be ejected from the electrostatic deflector 30.

Figure 28:
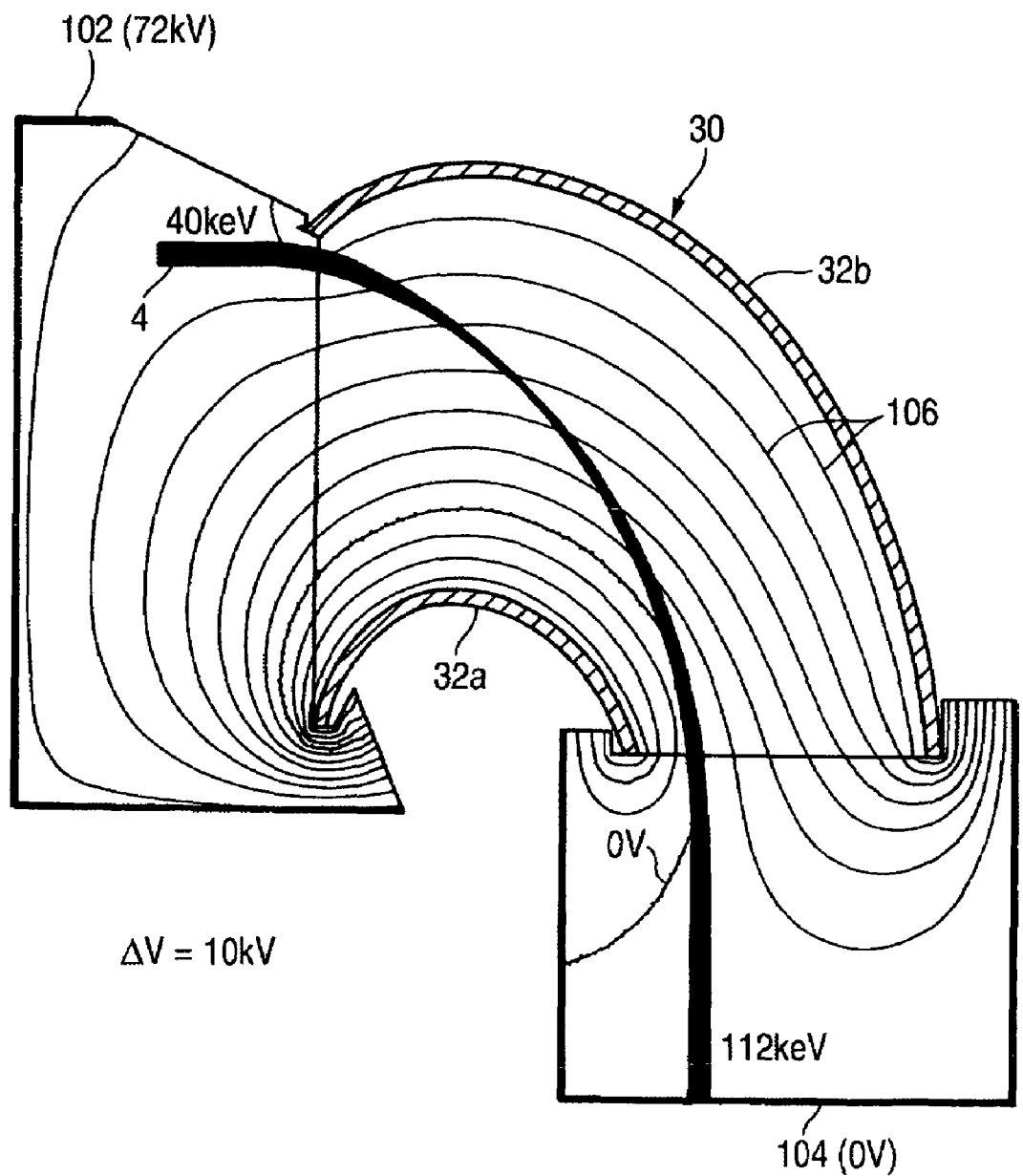
FIG. 28 is a view for describing one example result of simulation of a beam orbit, or the like, attained when the ion beam is decelerated by the electrostatic deflector with one deflection electrode pair, each deflection electrode becoming narrower toward the exit of the deflector.

FIG. 28 shows an embodiment of the electrostatic deflector 30 having one deflection electrode pair which consists of the deflection electrodes 32a, 32b and each become smaller toward the exit of the deflector, wherein the ion beam 4 is accelerated from the energy of 40 keV to 112 keV.

The voltages of the respective deflection electrodes are as follows:

32a: −35.8 kV, 32b: 76.2 kV

Even in the case of one deflection electrode pair spreading toward the exit as in the case of the present embodiment, the disturbances in the orbit of the ion beam 4 are understood to be few, and the ion beam 4 is understood to be smoothly decelerated. More specifically, the ion beam 4 with the aligned orbit can be ejected from the electrostatic deflector 30.

The application is based on Japanese Patent Application (Japanese Patent Application No. 2003-405342) filed on Dec. 4, 2003 and Japanese Patent Application (Japanese Patent Application No. 2004-76756) filed on Mar. 17, 2004 and contents thereof are incorporated herein by reference.

What is claimed is:

1. The ion beam apparatus comprising:
an ion source which extracts an ion beam;
a mass separation electromagnet which separates an ion beam of desired mass from the ion beam extracted from the ion source;
a scanner which scans the ion beam that has been passed through the mass separation electromagnet around a given scan center within a given scan surface;
an electrostatic deflector which electrostatically deflects the ion beam ejected from the scanner through 90° so that an ion beam of desired energy travels in a direction perpendicular to the scan surface within a circular-arc-shaped deflection zone centered on the scan center; and
a scanning mechanism which retains a target for ion implantation and which mechanically, reciprocally moves the target in a direction in which the target crosses the ion beam ejected from the electrostatic deflector at a given angle wherein said scanning mechanism moves said target in a direction parallel to a surface of said target;
wherein said scanner has a pair of mutually-parallel scan electrodes, and a scan power source which applies a scan voltage Vs expressed by $V_s = ct/(1-c^2t^2)^{1/2}$ ("c" is a constant, and "t" is time) between said pair of scan electrodes.

2. The ion beam apparatus according to claim 1, wherein said electrostatic deflector has a pair of deflection electrodes which are spaced apart from each other and mutually oppose.

3. The ion beam apparatus according to claim 2, wherein, provided that three axes intersecting at right angles at one point are taken as X, Y and Z axes,
- said ion beam is injected into said scanner in parallel to said Z axis;
- said scanner which scans said injected ion beam with said scan center as a center within said scan surface parallel to a Y-Z plane; and
- said electrostatic deflector which deflects an ion beam of desired energy in said injected ion beam through 90° so as to eject in parallel with said X axis;
- when consideration is given of a locus of one ion beam having desired energy in said scanned and deflected ion beam, said locus assumes the shape of an arc-shaped section at an extremity of a linear section, said arc-shaped section being bent in the manner of an arc at an angle of 90° so as to become parallel to said X axis; and
- mutually-opposing surfaces of a pair of deflection electrodes constituting said electrostatic deflector each have a shape generally aligned with a surface of revolution, said surface of revolution being drawn by said arc-shaped section when said locus of one ion beam is rotated through a predetermined angle in said scanning direction with reference to an axis passing through said scan center and parallel to said X axis.

4. The ion beam apparatus according to claim 3, wherein said mutually-opposing surfaces of said respective deflection electrodes constituting said deflection electrode each assume a shape defined by means of circumferentially cutting a torus through a predetermined angle centered on a torus center axis which passes through the scan center and is parallel to the X axis, and cutting an outer periphery of a longitudinal cross-sectional surface of said torus through only 90°.

5. The ion beam apparatus according to claim 3, wherein said mutually-opposing surfaces of said pair of deflection electrodes constituting said deflection electrodes are each formed by combination of a plurality of surfaces aligned with said surface of revolution.

6. The ion beam apparatus according to claim 3, wherein at least one of said pair of deflection electrodes constituting said electrostatic deflector is divided into a plurality of segments with a gap in a direction in which a deflection angle is increased.

7. The ion beam apparatus according to claim 6, further comprising:
- a deflection power source for applying a deflection voltage, which is a d.c. voltage and symmetrical with respect to a ground voltage, to said mutually-opposing surfaces of said pair of deflection electrodes constituting said electrostatic deflector.

8. The ion beam apparatus according to claim 1, wherein said scanner scans said ion beam that has injected into said scanner in a symmetrical manner with respect to an incident axis of said ion beam.

9. The ion beam apparatus according to claim 1, further comprising:
- an acceleration/deceleration device which is interposed between said scanner and said electrostatic deflector and electrostatically accelerates or decelerates said scanned ion beam,
- wherein said acceleration/deceleration device has at least two electrodes spaced a given interval in a traveling direction of said ion beam; and
- each of said electrodes has a circular-arc shape centered on said scan center, and a beam passage hole which is wider than said scanned ion beam in said scanning direction.

10. The ion beam apparatus according to claim 9, wherein an entrance electrode constituting said acceleration/deceleration device also serves as an analysis slit which permits passage of an ion beam of desired mass and inhibits passage of ions of undesired mass.

11. The ion beam apparatus according to claim 10, wherein a beam mask which permits passage of an ion beam of desired energy and inhibits passage of ions of undesired energy is disposed in the vicinity of an exit of said electrostatic deflector.

12. The ion beam apparatus according to claim 11, wherein a scanned beam cross section of said ion beam passed from said electrostatic deflector, the scanned beam cross section perpendicular to a traveling direction of said ion beam, assumes the shape of an arc, and said beam mask has a beam passage hole having an arc-shaped geometry substantially similar to said arc-shaped scanned beam cross section.

13. The ion beam apparatus according to claim 6, wherein an entrance potential of said electrostatic deflector is lower than an exit potential of the same; and
- said electrostatic deflector decelerates said ion beam of desired energy among said ion beam that has injected into said electrostatic deflector while deflecting said ion beam in the manner mentioned previously.

14. The ion beam apparatus according to claim 6, wherein an entrance potential of said electrostatic deflector is higher than an exit potential of the same; and
- said electrostatic deflector accelerates said ion beam of desired energy among said ion beams that has injected into said electrostatic deflector while deflecting said ion beam in the manner mentioned previously.

15. The ion beam apparatus according claim 13, wherein said electrostatic deflector has inner and outer deflection electrodes which oppose each other with an interval therebetween; and
- said interval between said mutually-opposing surfaces of said inner and outer deflection electrodes becomes wider toward said exit of said deflector.

16. The ion beam apparatus according to claim 14, wherein said electrostatic deflector has inner and outer deflection electrodes which oppose each other with an interval therebetween; and
- said interval between said mutually-opposing surfaces of said inner and outer deflection electrodes becomes narrower toward said exit of said deflector.

17. The ion beam apparatus according claim 13, wherein the following relationships are satisfied on condition that said electrostatic deflector has inner and outer deflection electrodes which oppose each other with an interval therebetween; that said inner and outer deflection electrodes are divided into "n" pairs ("n" is an integer of two or more) in a direction in which said deflection angles increase, to thus form "n" deflection electrode pairs; that voltages applied to said inner deflection electrodes among said "n" deflection electrode pairs are taken as $Va_1, Va_2, \ldots, Va_n$ in sequence from said entrance; and that voltages applied to said outer deflection electrodes among said "n" deflection electrode pairs are taken as $Vb_1, Vb_2, \ldots, Vb_n$ in sequence from said entrance, $Va_1 < Va_2 < \ldots < Va_n,$ $Vb_1 < Vb_2 < \ldots < Vb_n,$ and $Va_1 < Vb_1, Va_2 < Vb_2, \ldots, Va_n < Vb_n.$ 18. The ion beam apparatus according claim 14, wherein the following relationships are satisfied on condition that said electrostatic deflector has inner and outer deflection electrodes which oppose each other with an interval therebetween; that said inner and outer deflection electrodes are divided into "n" pairs ("n" is an integer of two or more) in a direction in which said deflection angles increase, to thus form "n" deflection electrode pairs; that voltages applied to said inner deflection electrodes among said "n" deflection electrode pairs are taken as $Va_1, Va_2, \ldots, Va_n$ in sequence from said entrance; and that voltages applied to said outer deflection electrodes among said "n" deflection electrode pairs are taken as $Vb_1, Vb_2, \ldots, Vb_n$ in sequence from said entrance, $Va_1 > Va_2 > \ldots > Va_n,$ $Vb_1 > Vb_2 > \ldots > Vb_n,$ and $Va_1 < Vb_1, Va_2 < Vb_2, \ldots, Va_n < Vb_n.$

19. The ion beam apparatus according claim 13, wherein the following expressions or equivalent mathematical relationships are substantially satisfied on condition that said electrostatic deflector has inner and outer deflection electrodes which oppose each other with an interval therebetween; that radii of mutually-opposing surfaces of said inner and outer deflection electrodes are taken as ra and rb; that voltages applied to said inner and outer deflection electrodes are taken as Va and Vb; an electric potential in an orbit of said ion beam of desired energy within said electrostatic deflector is taken as V; a voltage corresponding to said ion beam of kinetic energy at said exit of said electrostatic deflector is taken as Ve; and a design orbit radius of said ion beam within said electrostatic deflector is taken as rc;

$Va = V - 2(Ve - V) \log(rc/ra)$, and $Vb = V + 2(Ve - V) \log(rb/rc).$

20. The ion beam apparatus according claim 14, wherein the following expressions or equivalent mathematical relationships are substantially satisfied on condition that said electrostatic deflector has inner and outer deflection electrodes which oppose each other with an interval therebetween; that radii of mutually-opposing surfaces of said inner and outer deflection electrodes are taken as ra and rb; that voltages applied to said inner and outer deflection electrodes are taken as Va and Vb; an electric potential in an orbit of said ion beam of desired energy within said electrostatic deflector is taken as V; a voltage corresponding to said ion beam of kinetic energy at said exit of said electrostatic deflector is taken as Ve; and a design orbit radius of said ion beam within said electrostatic deflector is taken as rc;

$Va = V - 2(Ve - V) \log(rc/ra)$, and $Vb = V + 2(Ve - V) \log(rb/rc).$

21. The ion beam apparatus according to claim 4, wherein said mutually-opposing surfaces of said pair of deflection electrodes constituting said deflection electrodes are each formed by combination of a plurality of surfaces aligned with said surface of revolution.

22. The ion beam apparatus according to claim 4, wherein at least one of said pair of deflection electrodes constituting said electrostatic deflector is divided into a plurality of segments with a gap in a direction in which a deflection angle is increased.

23. The ion beam apparatus according to claim 22, further comprising:

a deflection power source for applying a deflection voltage, which is a d.c. voltage and symmetrical with respect to a ground voltage, to said mutually-opposing surfaces of said pair of deflection electrodes constituting said electrostatic deflector.

24. The ion beam apparatus according to claim 22, wherein an entrance potential of said electrostatic deflector is lower than an exit potential of the same; and said electrostatic deflector decelerates said ion beam of desired energy among said ion beam that has injected into said electrostatic deflector while deflecting said ion beam in the manner mentioned previously.

25. The ion beam apparatus according to claim 22, wherein an entrance potential of said electrostatic deflector is higher than an exit potential of the same; and said electrostatic deflector accelerates said ion beam of desired energy among said ion beams that has injected into said electrostatic deflector while deflecting said ion beam in the manner mentioned previously.

* * * * *

UNITED STATES PATENT AND TRADEMARK OFFICE
CERTIFICATE OF CORRECTION

PATENT NO. : 7,435,976 B2
APPLICATION NO. : 10/581429
DATED : October 14, 2008
INVENTOR(S) : Masao Naito and Hideki Fujita It is certified that error appears in the above-identified patent and that said Letters Patent is hereby corrected as shown below:

In claim 1, column 36, line 62, "$V_s=ct/(I-c^2t^2)^{1/2}$" should read --$V_s=ct/(1-c^2t^2)^{1/2}$--.

In claim 15, column 38, line 32, "according claim" should read --according to claim--.

In claim 17, column 38, line 46, "according claim" should read --according to claim--.

In claim 18, column 38, line 65, "according claim" should read --according to claim--.

In claim 19, column 39, line 16, "according claim" should read --according to claim--.

In claim 20, column 39, line 34, "according claim" should read --according to claim--.

Signed and Sealed this

Seventeenth Day of February, 2009

JOHN DOLL
*Acting Director of the United States Patent and Trademark Office*